US006534227B2

(12) United States Patent
Kabata et al.

(10) Patent No.: US 6,534,227 B2
(45) Date of Patent: Mar. 18, 2003

(54) PHOTORECEPTOR, METHOD OF EVALUATING THE PHOTORECEPTOR, METHOD OF PRODUCING THE PHOTORECEPTOR, AND IMAGE FORMATION APPARATUS USING THE PHOTORECEPTOR

(75) Inventors: Toshiyuki Kabata, Kanagawa (JP); Toshio Fukagai, Shizuoka (JP); Junichi Yamazaki, Shizuoka (JP); Katsuhiko Tani, Tokyo (JP); Noriyuki Iwata, Kanagawa (JP); Takuji Katoh, Kanagawa (JP); Yoshio Watanabe, Kanagawa (JP); Yuka Miyamoto, Shizuoka (JP)

(73) Assignee: Ricoh Company, Ltd., Tokyo (JP)

( * ) Notice: Subject to any disclaimer, the term of this patent is extended or adjusted under 35 U.S.C. 154(b) by 21 days.

(21) Appl. No.: 09/758,193

(22) Filed: Jan. 12, 2001

(65) Prior Publication Data

US 2002/0018947 A1 Feb. 14, 2002

(30) Foreign Application Priority Data

Jan. 12, 2000 (JP) ...................................... 2000-004008
Jan. 14, 2000 (JP) ...................................... 2000-006769

(51) Int. Cl.$^7$ ................................................. G03F 9/00
(52) U.S. Cl. ........................................................ 430/30
(58) Field of Search ........................................... 430/30

*Primary Examiner*—Christopher G. Young
(74) *Attorney, Agent, or Firm*—Oblon, Spivak, McClelland, Maier & Neustadt, P.C.

(57) ABSTRACT

A photoreceptor including a support and a photosensitive layer formed thereon, optionally an undercoat layer between the support and the photosensitive layer, wherein when a group of data consisting of N samples of the height x(t)(μm) of a profile at the interface of the support on the side of the photosensitive layer, the interface of the photosensitive layer on the side of the support, and/or the interface of the undercoat layer on the side of the photosensitive layer, measured perpendicular to a horizontal direction of the support, taken at Δt(μm) intervals in the horizontal direction, is subjected to Fourier transformation in accordance with a formula as specified in the specification, in a power spectrum obtained by the Fourier transformation, I(S) represented by a formula specified in the specification has a particular value, a method of evaluating the above photoreceptor, a method of producing the photoreceptor, and an image formation apparatus in which the photoreceptor is incorporated are disclosed.

90 Claims, 27 Drawing Sheets

PHOTORECEPTOR, METHOD OF EVALUATING THE PHOTORECEPTOR, METHOD OF PRODUCING THE PHOTORECEPTOR, AND IMAGE FORMATION APPARATUS USING THE PHOTORECEPTOR

BACKGROUND OF THE INVENTION

1. Field of the Invention

The present invention relates to a photoreceptor which does not produce abnormal images such as images including light and shade stripes, and images including streaks, which are formed by the multiple reflection of coherent light within the photoreceptor.

The present invention also relates to a method of evaluating the photoreceptor.

The present invention also relates to a method of producing the photoreceptor.

The present invention also relates to an image formation apparatus comprising the photoreceptor, which is capable of producing high quality images free of the light and shade stripes and streaks, 2. Discussion of Background In recent years, there has been a strong demand for image formation with high precision and high resolution in accordance with the request for highly accurate reproduction of image information.

When image formation is carried out with high resolution, using a photoconductor, in addition to an image to be formed based on an original image information, an image based on the information of the photoconductor itself is apt to be formed.

An image formation process by use of coherent light, such as laser light, as writing light, is widely used in the field of electrophotography for the formation of digital images, for instance, as in copying machines, printers and facsimile apparatus. In an electrophotographic process using coherent light as writing light, a problem is apt to be caused that an image including light and shade stripes (hereinafter referred to as the light and shade striped image) is formed due to the interference of the coherent light within a photoconductive layer of the photoconductor.

It is known that such light and shade stripes are generated by the writing light being intensified when the photoconductor satisfies the relationship of $2nd=m\lambda$ wherein n is the refractive index of a charge transport layer, d is the thickness of the charge transport layer, $\lambda$ is the wavelength of the writing light, and m is an integer.

To be more specific, when $\lambda$=780 nm and n=2.0, one set of light and shade stripes appears at each change of 0.195 $\mu$m in the thickness of the charge transport layer. In order to remove the light and shade stripes completely, it is necessary to reduce the deviation of the thickness of the charge transport layer to less than 0.195 $\mu$m in the entire image formation area. However, it is economically extremely difficult to produce a photoconductor with such a small deviation of the thickness of the charge transport layer as mentioned above, so that various methods have been proposed to control or reduce the formation of the light and shade stripes in the image.

For instance, in Japanese Laid-Open Patent Application 57-165845, there is proposed a photoconductor comprising a support made of aluminum, a charge transport layer formed on the support, a charge generation layer comprising a-Si formed on the charge transport layer, with the provision of a light absorption layer on the aluminum support to remove the mirror reflection of the aluminum support, thereby preventing the formation of the light and shade stripes in images. The provision of the light absorption layer on the aluminum support is extremely effective for preventing the formation of the light and shade stripes in the image with the photoconductor using the charge generation layer comprising a-Si with the layer structure of the aluminum support/charge transport layer/charge generation layer as mentioned above. However, for an organic photoconductor with a layer structure of aluminum support/charge generation layer layer/charge transport layer in general use, the provision of the light absorption layer on the aluminum support is not so effective for preventing the formation of the light and shade stripes in the image.

In Japanese Laid-Open Patent Application 7-295269, there is disclosed a photoconductor with a layer structure of aluminum support/undercoat layer/charge generation layer/charge transport layer, with the provision of a light absorption layer on the aluminum support for preventing the formation of the light and shade stripes in the image. However, the photoconductor with this layer structure cannot completely prevent the formation of the light and shade stripes in the image.

In Japanese Patent Publication 7-27262, there is disclosed an electrophotographic copying apparatus comprising (1) a photoconductor comprising a cylindrical support which has such a convex cross section that is formed by superimposing a sub-peak on a main peak, when the cylindrical support is cut by a plane which includes the axis of the cylindrical support, and (2) an optical system using a coherent light beam with a beam diameter which is less than one period of the main peak for exposure. The support disclosed in Japanese Patent Publication 7-27262 can be produced relatively easily by machining or like.

In some photoconductors, the formation of the light and shade stripes in the image can be controlled to some extent by use of the above-mentioned support. However, many photoconductors cannot prevent the formation of the light and shade stripes in the image even though the above-mentioned support is used.

There is also known a photoconductor with the parameter of the surface roughness of the support thereof being defined, for example, in Japanese Laid-Open Patent Application 10-301311.

When an electrophotographic copying machine to be used with this photoconductor adopts a low resolution, there is the case where the formation of the light and shade striped image can be prevented. However, when an electrophotographic copying machine with high resolution is used, even if the surface roughness of the substrate is defined by conventionally employed parameters such as maximum height, ten-point mean roughness, and center-line mean roughness, there cannot be determined the conditions under which the formation of the light and shade striped image can be completely prevented.

It is also generally known that the state of the formation of the light and shade striped image can be changed by interposing an undercoat layer comprising a white pigment such as titanium oxide between the support and the photoconductive layer. However, the necessary conditions for the undercoat layer to control the formation of the light and shade striped image, such as the thickness of the undercoat layer, largely differ depending upon the surface state of the support, so that the conditions for completely controlling the formation of the light and shade striped image have not been determined.

Although the conditions for removing the light and shade stripes entirely from the image are not completely known, there are many cases where the formation of the light and shade striped image can be reduced by roughening the surface of the support, so that a photoconductor with the surface of the support being finely roughened, produced by machining or like, is often mounted in an image formation apparatus.

Furthermore, it is also known that the formation of the light and shade striped image can be reduced by changing the thickness of the undercoat layer, but its accurate conditions for reducing the formation of the light and shade striped image are not completely known, so that photoconductors are produced under various conditions, and the conditions under which the light and shade striped image is not formed when the photoconductor is mounted and used in the electrophotographic copying machine are determined experimentally. In order to produce a photoconductor which does not form the light and shade striped image, the above experimentally determined production conditions have to be strictly kept. Even when such production conditions are strictly kept, there are many cases where the light and shade stripes appear in the image when the lot, the material and the shape of the photoconductor are changed, so that it is necessary to check and change the production conditions whenever the lot, the material and the shape of the photoconductor are changed.

Even though there are the above-mentioned problems, as long as the resolution of the image formation apparatus low, no big problems occur. However, when an image formation apparatus capable of producing images with high resolution is used, there is a case where apart from the above-mentioned light and shade striped image, an abnormal image including streaks (hereinafter referred to as the streaked image) appears in the entire image. Such streaks are often directed in the circumferential direction of the photoconductor with almost the same intervals between the streaks. Unlike the light and shade striped image, the streaked image appears, not only at the place where the thickness of the photoconductive layer of the photoconductor changes, but also in the area where the thickness of the photoconductive layer is constant, so that the abnormal streaked images often appear in the entire image area.

An investigation has been conducted as to the conditions under which a photoconductor which produces such abnormal streaked images is produced in the course of the continuous production of the photoconductors. As a result, it has been found that the production of such a photoconductor that produces the abnormal streaked images relates to the timing of replacement of a cutting tool used for machining the support of the photoconductor, and that there is a tendency that at the time of replacement of the cutting tool, the photoconductor that produces the abnormal streaked images is apt to be produced. It has also been found that this tendency also depends upon the kind of cutting tool employed. From the above, it can be considered that the state of the surface of the support relates to the production of the streaked images, but it is impossible to define the state of the surface of the support for the photoconductor which does not produce the streaked image by use of the conventionally employed parameters relating to the surface roughness.

For instance, in Japanese Laid-Open Patent Application 7-77817, there is disclosed a method of producing the support for the photoconductor by the steps of transforming a regular arrangement of the surface state of the support to a sine wave function, and transforming a regular arrangement of the lighting period of a writing light to a sine wave function, synthesizing these two sine wave functions to obtain a synthesized sine wave function, determining the period of the synthesized sine wave function, and controlling the machining of the support based on the thus determined period of the synthesized sine wave function. More specifically, in the method disclosed in Japanese Laid-Open Patent Application 7-77817, the support is produced with the period of the sine wave of the support set outside the scope of ±5% of the period of the sine wave of the writing light. However, it is extremely difficult to transform a profile of the support to a sine wave, so that a new parameter is necessary to define a profile for producing a photoconductor which does not produce streaked images for use in the image formation apparatus capable of producing images with high resolution.

SUMMARY OF THE INVENTION

It is therefore a first object of the present invention to provide a photoreceptor which does not produce abnormal images such as light and shade striped images and streaked images, which are formed by the multiple reflection of coherent light within the photoreceptor.

A second object of the present invention is to provide a method of evaluating the photoreceptor.

A third object of the present invention is to provide a method of producing the photoreceptor.

A fourth object of the present invention is to provide an image formation apparatus comprising the photoreceptor, which is capable of producing high quality images free of the light and shade stripes and the streaks.

The first object of the present invention can be achieved by a photoreceptor comprising a support and a photosensitive layer formed thereon, wherein when a group of data consisting of N samples of the height x(t)($\mu$m) of a profile at the interface of the photosensitive layer on the side of the support, measured perpendicular to the horizontal direction of the support, taken at $\Delta t(\mu)$ intervals in the horizontal direction, is subjected to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)\tag{1}$$

wherein n and m are each an integer, $N=2^p$ in which p is an integer, in a power spectrum represented by formula (2):

$$S\left(\frac{n}{N\cdot\Delta t}\right)=\frac{1}{N}\cdot\left|X\left(\frac{n}{N\cdot\Delta t}\right)\right|^2\tag{2}$$

I(S) represented by formula (3):

$$I(S)=\left(\frac{1}{N}\right)\sum_{n=0}^{N-1}\left\{S\left(\frac{n}{N\cdot\Delta t}\right)\right\}\tag{3}$$

is calculated as being $6.0\times10^{-3}$ or more.

In the present invention, when the photoreceptor is in the shape of a drum as shown in FIG. 1(A), the horizontal direction of the support indicates the direction along the support, which is in parallel to the axis of the photoreceptor drum as indicated by the arrow A as shown in FIG. 1 (A) while when the photoreceptor is in the shape of a rectangular sheet as shown in FIG. 1(B), the horizontal direction of the support indicates the direction along the plane of the support as indicated by the arrow B as shown in FIG. 1(B).

The first object of the present invention can also be achieved by a photoreceptor comprising a support and a photosensitive layer formed thereon, wherein when a group of data consisting of N samples of the height x(t)($\mu$m) of a profile at the interface of the photosensitive layer on the side of the support, measured perpendicular to the horizontal direction of the support, taken at $\Delta$t($\mu$m) intervals in the horizontal direction, is subjected to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \quad (1)$$

wherein n and m are each an integer, $N=2^p$ in which p is an integer, in a power spectrum represented by formula (2), $$S\left(\frac{n}{N\cdot\Delta t}\right)=\frac{1}{N}\cdot\left|X\left(\frac{n}{N\cdot\Delta t}\right)\right|^2, \quad (2)$$

the relationship between the value of $n_{max}$, at which $$S\left(\frac{n}{N\cdot\Delta t}\right)$$

is maximized in the range of n from 1 to N/2, and the pitch $W_l$ ($\mu$m) of writing light which is coherent light for image formation is $$\frac{N\cdot\Delta t}{n_{\max}}>1.05m\cdot W_l \text{ or } \frac{N\cdot\Delta t}{n_{\max}}<0.95\ m\cdot W_l,$$

where m is an integer obtained by rounding off the decimals of $$\frac{N\cdot\Delta t}{n_{\max}\cdot W_l},$$

provided that when $$\frac{N\cdot\Delta t}{n_{\max}\cdot W_l}<1,\ m=1.$$

The first object of the present invention can also be achieved by a photoreceptor comprising a support, an undercoat layer formed on the support, and a photosensitive layer formed on the undercoat layer, wherein when a group of data consisting of N samples of the height x(t)($\mu$m) of a profile of the surface of the undercoat layer on the side of the photosensitive layer, measured perpendicular to the horizontal direction of the support, taken at $\Delta$t($\mu$m) intervals in the horizontal direction, is subjected to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \quad (1)$$

wherein n and m are each an integer, $N=2^p$ in which p is an integer, in a power spectrum represented by formula (2):

$$S\left(\frac{n}{N\cdot\Delta t}\right)=\frac{1}{N}\cdot\left|X\left(\frac{n}{N\cdot\Delta t}\right)\right|^2 \quad (2)$$

I(S) is calculated from formula (4):

$$I'(S)=\left(\frac{1}{N}\right)\sum_{n=0}^{N-1}\left\{S\left(\frac{n}{N\cdot\Delta t}\right)\right\} \quad (4)$$

as being $6.0\times10^{-3}$ or more.

The first object of the present invention can also be achieved by a photoreceptor comprising a support, an undercoat layer formed on the support, and a photosensitive layer formed on the undercoat layer, wherein when a group of data consisting of N samples of the height x(t)($\mu$m) of a profile at the surface of the undercoat layer on the side of the photosensitive layer, measured perpendicular to the horizontal direction of the support, taken at $\Delta$t($\mu$m) intervals in the horizontal direction, is subjected to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \quad (1)$$

wherein n and m are each an integer, $N=2^p$ in which p is an integer, in a power spectrum represented by formula (2), $$S\left(\frac{n}{N\cdot\Delta t}\right)=\frac{1}{N}\cdot\left|X\left(\frac{n}{N\cdot\Delta t}\right)\right|^2, \quad (2)$$

the relationship between the value of $n_{max}$, at which $$S\left(\frac{n}{N\cdot\Delta t}\right)$$

is maximized in the range of n from 1 to N/2, and the pitch W, ($\mu$m) of writing light which is coherent light for image formation is $$\frac{N\cdot\Delta t}{n_{\max}}>1.05m\cdot W_l \text{ or } \frac{N\cdot\Delta t}{n_{\max}}<0.95\ m\cdot W_l,$$

where m is an integer obtained by rounding off the decimals of $$\frac{N\cdot\Delta t}{n_{\max}\cdot W_l},$$

provided that when $$\frac{N\cdot\Delta t}{n_{\max}\cdot W_l}<1,\ m=1.$$

The first object of the present invention can also be achieved by a photoreceptor comprising a support and a photosensitive layer formed thereon, wherein when a group of data consisting of N samples of the height x(t)($\mu$m) of a profile of the surface of the support on the side of the photosensitive layer, measured perpendicular to the horizontal direction of the support, taken at $\Delta$t($\mu$m) intervals in the horizontal direction, is subjected to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \tag{1}$$

Wherein n and m are each an integer, $N=2^P$ in which p is an integer, in a power spectrum represented by formula (2):

$$S\left(\frac{n}{N\cdot\Delta t}\right)=\frac{1}{N}\cdot\left|X\left(\frac{n}{N\cdot\Delta t}\right)\right|^2, \tag{2}$$

I(S) is calculated from formula (4):

$$I(S)=\left(\frac{1}{N}\right)\sum_{n=0}^{N-1}\left\{S\left(\frac{n}{N\cdot\Delta t}\right)\right\} \tag{4}$$

as being $12.0\times10^{-3}$ or more.

The first object of the present invention can also be achieved by a photoreceptor comprising a support and a photosensitive layer formed on the support, wherein when a group of data consisting of N samples of the height x(t)($\mu$m) of a profile of the surface of the support on the side of the photosensitive layer, measured perpendicular to the horizontal direction of the support, taken at $\Delta$t($\mu$m) intervals in the horizontal direction, is subjected to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \tag{1}$$

wherein n and m are each an integer, $N=2^P$ in which p is an integer, in a power spectrum represented by formula (2), $$S\left(\frac{n}{N\cdot\Delta t}\right)=\frac{1}{N}\cdot\left|X\left(\frac{n}{N\cdot\Delta t}\right)\right|^2, \tag{2}$$

the relationship between the value of $n_{max}$, at which $$S\left(\frac{n}{N\cdot\Delta t}\right)$$

is maximized in the range of n from 1 to N/2, and the pitch $W_l$ ($\mu$m) of writing light which is coherent light for image formation is $$\frac{N\cdot\Delta t}{n_{\max}}>1.05m\cdot W_l \text{ or } \frac{N\cdot\Delta t}{n_{\max}}<0.95m\cdot W_l,$$

where m is an integer obtained by rounding off the decimals of $$\frac{N\cdot\Delta t}{n_{\max}\cdot W_l},$$

provided that when $$\frac{N\cdot\Delta t}{n_{\max}\cdot W_l}<1,\ m=1.$$

The second object of the present invention can be achieved by a method of evaluating a photoreceptor comprising a support, an undercoat layer formed on the support, and a photosensitive layer formed thereon, comprising the steps of:

subjecting a group of data consisting of N samples of the height x(t)($\mu$m) of a profile at the interface of the photosensitive layer on the side of the support, and/or of a profile at the surface of the undercoat layer on the side of the photoreceptor, and/or of a profile at the surface of the support on the side of the photoreceptor, measured perpendicular to the horizontal direction of the support, taken at $\Delta$t($\mu$m) intervals in the horizontal direction, to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \tag{1}$$

wherein n and m are each an integer, $N=2^P$ in which p is an integer, calculating a power spectrum in accordance with formula (2):

$$S\left(\frac{n}{N\cdot\Delta t}\right)=\frac{1}{N}\cdot\left|X\left(\frac{n}{N\cdot\Delta t}\right)\right|^2, \tag{2}$$

and comparing a calculated power spectrum with a specific reference, thereby evaluating the photoreceptor.

The second object of the present invention can also be achieved by a method of evaluating a photoreceptor comprising a support and a photosensitive layer formed thereon, comprising the steps of:

subjecting a group of data consisting of N samples of the height x(t)($\mu$m) of a profile at the interface of the photosensitive layer on the side of the support, and/or of a profile at the surface of the support on the side of the photoreceptor, measured perpendicular to the horizontal direction of the support, taken at $\Delta$t($\mu$m) intervals in the horizontal direction, to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \tag{1}$$

wherein n and m are each an integer, $N=2^P$ in which p is an integer, calculating a power spectrum in accordance with formula (2):

$$S\left(\frac{n}{N\cdot\Delta t}\right)=\frac{1}{N}\cdot\left|X\left(\frac{n}{N\cdot\Delta t}\right)\right|^2, \tag{2}$$

calculating I(S) represented by formula (4) from the calculated power spectrum, $$I(S)=\left(\frac{1}{N}\right)\sum_{n=0}^{N-1}\left\{S\left(\frac{n}{N\cdot\Delta t}\right)\right\}, \tag{4}$$

and comparing the calculated I(S) with a specific reference, thereby evaluating the photoreceptor.

The second object of the present invention can also be achieved by a method of evaluating a photoreceptor comprising a support, an undercoat layer formed on the support, and a photosensitive layer formed thereon, comprising the steps of;

subjecting a group of data consisting of N samples of the height x(t)($\mu$m) of a profile at the interface of the photosensitive layer on the side of the support, and/or of a profile at the surface of the undercoat layer on the side of the photoreceptor, and/or of a profile at the surface of the support on the side of the photoreceptor, measured perpendicular to the horizontal direction of the support, taken at $\Delta t(\mu m)$ intervals in the horizontal direction, to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \tag{1}$$

Wherein n and m are each an integer, $N=2^p$ in which p is an integer, calculating a power spectrum in accordance with formula (2);

$$S\left(\frac{n}{N\cdot\Delta t}\right)=\frac{1}{N}\cdot\left|X\left(\frac{n}{N\cdot\Delta t}\right)\right|^2, \tag{2}$$

calculating I(S) represented by formula (4) from the calculated power spectrum, $$I(S)=\left(\frac{1}{N}\right)\sum_{n=0}^{N-1}\left\{S\left(\frac{n}{N\cdot\Delta t}\right)\right\}, \tag{4}$$

and comparing the calculated I(S) with a specific reference, thereby evaluating the photoreceptor.

The second object of the present invention can also be achieved by a method of evaluating a photoreceptor comprising a support and a photosensitive layer formed thereon, comprising the steps of:

subjecting a group of data consisting of N samples of the height x(t) ($\mu$m) of a profile at the interface of the photosensitive layer on the side of the support, and/or of a profile at the surface of the support on the side of the photoreceptor, measured perpendicular to the horizontal direction of the support, taken at $\Delta t(\mu m)$ intervals in the horizontal direction, to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \tag{1}$$

wherein n and m are each an integer, $N=2^p$ in which p is an integer, calculating a power spectrum in accordance with formula (2):

$$S\left(\frac{n}{N\cdot\Delta t}\right)=\frac{1}{N}\cdot\left|X\left(\frac{n}{N\cdot\Delta t}\right)\right|^2, \tag{2}$$

calculating I'(S) represented by formula (5) from the calculated power spectrum, $$I'(S)=\frac{1}{N}\sum_{n=a}^{b}S\left(\frac{n}{N\cdot\Delta t}\right), \tag{5}$$

in which a and b each are an integer of N or less, and a≦b, and comparing the calculated I'(S) with a specific reference, thereby evaluating the photoreceptor.

The second object of the present invention can also be achieved by a method of evaluating a photoreceptor comprising a support, an undercoat layer formed on the support, and a photosensitive layer formed thereon, comprising the steps of:

subjecting a group of data consisting of N samples of the height x(t)($\mu$m) of a profile at the interface of the photosensitive layer on the side of the support, and/or of a profile at the surface of the undercoat layer on the side of the photoreceptor, and/or of a profile at the surface of the support on the side of the photoreceptor, measured perpendicular to the horizontal direction of the support, taken at $\Delta t(\mu m)$ intervals in the horizontal direction, to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \tag{1}$$

wherein n and m are each an integer, $N=2^p$ in which p is an integer, calculating a power spectrum in accordance with formula (2):

$$S\left(\frac{n}{N\cdot\Delta t}\right)=\frac{1}{N}\cdot\left|X\left(\frac{n}{N\cdot\Delta t}\right)\right|^2, \tag{2}$$

calculating I'(S) represented by formula (5) from the calculated power spectrum, $$I'(S)=\frac{1}{N}\sum_{n=a}^{b}S\left(\frac{n}{N\cdot\Delta t}\right), \tag{5}$$

in which a and b each are an integer of N or less, and a≦b, and comparing the calculated I'(S) with a specific reference, thereby evaluating the photoreceptor.

The third object of the present invention can be achieved by a method of producing a photoreceptor comprising a support and a photosensitive layer formed thereon, by determining the conditions for machining the surface of the photosensitive layer on the side of the support, and/or the surface of the support on the side of the photosensitive layer in accordance with a method of evaluating the photoreceptor, comprising the steps of:

subjecting a group of data consisting of N samples of the height x(t)($\mu$m) of a profile at the interface of the photosensitive layer on the side of the support, and/or of a profile at the surface of the support on the side of the photoreceptor, measured perpendicular to the horizontal direction of the support, taken at $\Delta t(\mu m)$ intervals in the horizontal direction, to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \tag{1}$$

wherein n and m are each an integer, $N=2^p$ in which p is an integer, calculating a power spectrum in accordance with formula (2):

$$S\left(\frac{n}{N\cdot\Delta t}\right)=\frac{1}{N}\cdot\left|X\left(\frac{n}{N\cdot\Delta t}\right)\right|^2, \tag{2}$$

and comparing a calculated power spectrum with a specific reference, thereby evaluating the photoreceptor.

The third object of the present invention can also be achieved by a method of producing a photoreceptor comprising a support, an undercoat layer formed on the support, and a photosensitive layer formed on the undercoat layer, by determining the conditions for machining the surface of the photosensitive layer on the side of the support, and/or the surface of the undercoat layer on the side of the photosensitive layer, and/or the surface of the support on the side of the photosensitive layer in accordance with a method of evaluating the photoreceptor, comprising the steps of:

subjecting a group of data consisting of N samples of the height x(t)($\mu$m) of a profile at the interface of the photosensitive layer on the side of the support, and/or of a profile at the surface of the undercoat layer on the side of the photoreceptor, and/or of a profile at the surface of the support on the side of the photoreceptor, measured perpendicular to the horizontal direction of the support, taken at $\Delta$t($\mu$m) intervals in the horizontal direction, to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \qquad (1)$$

wherein n and m are each an integer, N=$2^p$ in which p is an integer, calculating a power spectrum in accordance with formula (2):

$$S\left(\frac{n}{N\cdot\Delta t}\right)=\frac{1}{N}\cdot\left|X\left(\frac{n}{N\cdot\Delta t}\right)\right|^2, \qquad (2)$$

and comparing a calculated power spectrum with a specific reference, thereby evaluating the photoreceptor.

The third object of the present invention can also be achieved by a method of producing a photoreceptor comprising a support and a photosensitive layer formed thereon, by determining the conditions for machining the surface of the photosensitive layer on the side of the support, and/or the surface of the support on the side of the photosensitive layer in accordance with a method of evaluating the photoreceptor, comprising the steps of:

subjecting a group of data consisting of N samples of the height x(t)($\mu$) of a profile at the interface of the photosensitive layer on the side of the support, and/or of a profile at the surface of the support on the side of the photoreceptor, measured perpendicular to the horizontal direction of the support, taken at $\Delta$t($\mu$m) intervals in the horizontal direction, to Fourier transformation in accordance with formula (1).

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \qquad (1)$$

wherein n and n are each an integer, N=$2^p$ in which p is an integer, calculating a power spectrum in accordance with formula (2):

$$S\left(\frac{n}{N\cdot\Delta t}\right)=\frac{1}{N}\cdot\left|X\left(\frac{n}{N\cdot\Delta t}\right)\right|^2, \qquad (2)$$

calculating I(S) represented by formula (4) from the calculated power spectrum, $$I(S)=\left(\frac{1}{N}\right)\sum_{n=0}^{N-1}\left\{S\left(\frac{n}{N\cdot\Delta t}\right)\right\}, \qquad (4)$$

and comparing the calculated I(S) with a specific reference, thereby evaluating the photoreceptor.

The third object of the present invention can also be achieved by a method of producing a photoreceptor comprising a support, an undercoat layer formed on the support, and a photosensitive layer formed on the undercoat layer, by determining the conditions for machining the surface of the photosensitive layer on the side of the support, and/or the surface of the undercoat layer on the side of the photosensitive layer, and/or the surface of the support on the side of the photosensitive layer in accordance with a method of evaluating the photoreceptor, comprising the steps of:

subjecting a group of data consisting of N samples of the height x(t)($\mu$m) of a profile at the interface of the photosensitive layer on the side of the support, and/or of a profile at the surface of the undercoat layer on the side of the photoreceptor, and/or of a profile at the surface of the support on the side of the photoreceptor, measured perpendicular to the horizontal direction of the support, taken at $\Delta$t($\mu$m) intervals in the horizontal direction, to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \qquad (1)$$

wherein n and m are each an integer, N=$2^p$ in which p is an integer, calculating a power spectrum in accordance with formula (2):

$$S\left(\frac{n}{N\cdot\Delta t}\right)=\frac{1}{N}\cdot\left|X\left(\frac{n}{N\cdot\Delta t}\right)\right|^2, \qquad (2)$$

calculating I(S) represented by formula (4) from the calculated power spectrum, $$I(S)=\left(\frac{1}{N}\right)\sum_{n=0}^{N-1}\left\{S\left(\frac{n}{N\cdot\Delta t}\right)\right\}, \qquad (4)$$

and comparing the calculated I(S) with a specific reference, thereby evaluating the photoreceptor.

The third object of the present invention can also be achieved by a method of producing a photoreceptor comprising a support and a photosensitive layer formed thereon, by determining the conditions for machining the surface of the photosensitive layer on the side of the support, and/or the surface of the support on the side of the photosensitive layer in accordance with a method of evaluating the photoreceptor, comprising the steps of:

subjecting a group of data consisting of N samples of the height x(t)($\mu$m) of a profile at the interface of the photosensitive layer on the side of the support, and/or of a profile at the surface of the support on the side of the photoreceptor, measured perpendicular to the horizontal direction of the support, taken at $\Delta$t($\mu$m) intervals in the horizontal direction, to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \quad (1)$$

wherein n and m are each an integer, $N=2^P$ in which p is an integer, calculating a power spectrum in accordance with formula (2):

$$S\left(\frac{n}{N\cdot\Delta t}\right)=\frac{1}{N}\cdot\left|X\left(\frac{n}{N\cdot\Delta t}\right)\right|^2, \quad (2)$$

calculating I'(S) represented by formula (5) from the calculated power spectrum, $$I'(S)=\frac{1}{N}\sum_{n=a}^{b}S\left(\frac{n}{N\cdot\Delta t}\right), \quad (5)$$

in which a and b each are an integer of N or less, and a≦b, and comparing the calculated I'(S) with a specific reference, thereby evaluating the photoreceptor. The third object of the present invention can also be achieved by a method of producing a photoreceptor comprising a support, an undercoat layer formed on the support, and a photosensitive layer formed on the undercoat layer, by determining the conditions for machining the surface of the photosensitive layer on the side of the support, and/or the surface of the undercoat layer on the side of the photosensitive layer, and/or the surface of the support on the side of the photosensitive layer in accordance with a method of evaluating the photoreceptor, comprising the steps of:

subjecting a group of data consisting of N samples of the height x(t)(μm) of a profile at the interface of the photosensitive layer on the side of the support, and/or of a profile at the surface of the undercoat layer on the side of the photoreceptor, and/or of a profile at the surface of the support on the side of the photoreceptor, measured perpendicular to the horizontal direction of the support, taken at Δt(μm) intervals in the horizontal direction, to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \quad (1)$$

wherein n and m are each an integer, $N=2^P$ in which p is an integer, calculating a power spectrum in accordance with formula (2);

$$S\left(\frac{n}{N\cdot\Delta t}\right)=\frac{1}{N}\cdot\left|X\left(\frac{n}{N\cdot\Delta t}\right)\right|^2, \quad (2)$$

calculating I'(S) represented by formula (5) from the calculated power spectrum, $$I'(S)=\frac{1}{N}\sum_{n=a}^{b}S\left(\frac{n}{N\cdot\Delta t}\right), \quad (5)$$

in which a and b each are an integer of N or less, and a≦b, and comparing the calculated I'(S) with a specific reference, thereby evaluating the photoreceptor.

The fourth object of the present invention can be achieved by an image formation apparatus comprising a photoreceptor which comprises a support and a photosensitive layer formed thereon, wherein when a group of data consisting of N samples of the height x(t)(μm) of a profile at the interface of the photosensitive layer on the side of the support, measured perpendicular to the horizontal direction of the support, taken at Δt(μm) intervals in the horizontal direction, is subjected to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \quad (1)$$

wherein n and m are each an integer, $N=2^P$ in which p is an integer, in a power spectrum represented by formula (2):

$$S\left(\frac{n}{N\cdot\Delta t}\right)=\frac{1}{N}\cdot\left|X\left(\frac{n}{N\cdot\Delta t}\right)\right|^2 \quad (2)$$

I(S) represented by formula (3):

$$I(S)=\left(\frac{1}{N}\right)\sum_{n=0}^{N-1}\left\{S\left(\frac{n}{N\cdot\Delta t}\right)\right\} \quad (3)$$

is calculated as being $6.0\times10^{-3}$ or more, in which coherent light is used as writing light for image formation.

The fourth object of the present invention can also be achieved by an image formation apparatus comprising a photoreceptor which comprises a support, an undercoat layer formed on the support, and a photosensitive layer formed on the undercoat layer, wherein when a group of data consisting of N samples of the height x(t)(μm) of a profile of the surface of the undercoat layer on the side of the photosensitive layer, measured perpendicular to the horizontal direction of the support, taken at Δt(μm) intervals in the horizontal direction, is subjected to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \quad (1)$$

wherein n and m are each an integer, $N=2^P$ in which p is an integer, in a power spectrum represented by formula (2):

$$S\left(\frac{n}{N\cdot\Delta t}\right)=\frac{1}{N}\cdot\left|X\left(\frac{n}{N\cdot\Delta t}\right)\right|^2 \quad (2)$$

I(S) is calculated from formula (4):

$$I(S)=\left(\frac{1}{N}\right)\sum_{n=0}^{N-1}\left\{S\left(\frac{n}{N\cdot\Delta t}\right)\right\} \quad (4)$$

as being $6.0\times10^{-3}$ or more, in which coherent light is used as writing light for image formation.

The fourth object of the present invention can also be achieved by an image formation apparatus comprising a photoreceptor which comprises a support and a photosensitive layer formed thereon, wherein when a group of data consisting of N samples of the height x(t)(μm) of a profile of the surface of the support an the side of the photosensitive layer, measured perpendicular to the horizontal direction of the support, taken at $\Delta t(\mu m)$ intervals in the horizontal direction, is subjected to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \quad (1)$$

wherein n and m are each an integer, $N=2^p$ in which p is an integer, in a power spectrum represented by formula (2):

$$S\left(\frac{n}{N\cdot\Delta t}\right)=\frac{1}{N}\cdot\left|X\left(\frac{n}{N\cdot\Delta t}\right)\right|^2, \quad (2)$$

I(S) is calculated from formula (4):

$$I(S)=\left(\frac{1}{N}\right)\sum_{n=0}^{N-1}\left\{S\left(\frac{n}{N\cdot\Delta t}\right)\right\} \quad (4)$$

as being $12.0\times10^{-3}$ or more, in which coherent light is used as writing light for image formation.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
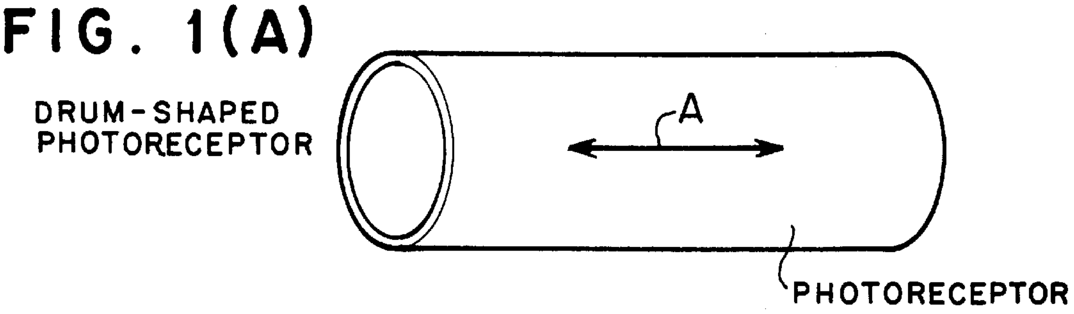
FIGS. 1(A) and 1(B) respectively show a drum-shaped photoreceptor and a sheet-shaped photoreceptor of the present invention, indicating the horizontal direction of the support for each of the photoreceptors.
Figure 1B:
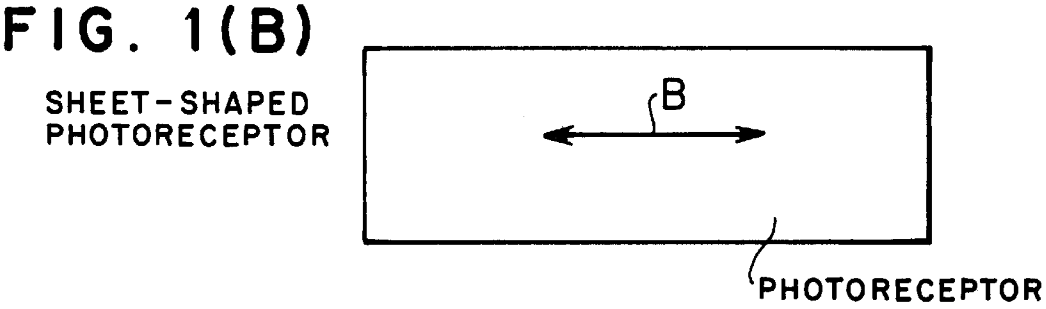

The inventors of the present invention have conducted investigations as to why some photoreceptors for use in electrophotographic copying machine produce the light and shade striped images, which might be considered to be caused by the multiple reflection of writing light within the photoreceptor, and other photoreceptors do not produce such light and shade striped images. As a result, they have discovered that the formation of the light and shade striped images correlate to the state of the surface of the photosensitive layer on the side of the support at the interface between the photosensitive layer and the support. However, there is a case where even though one photoreceptor produces the light and shade striped image, while other photoreceptor does not produce the light and shade striped image, there are almost no differences between the two photoreceptors in such surface roughness parameters as measured by the Japanese Industrial Standards, maximum height, ten-point mean roughness, and center-line mean roughness, with respect to the interface of the photosensitive layer on the side of the support.

Furthermore, there is even a case where the tendency of the formation of the light and shade striped image is reversed with respect to the above-mentioned surface roughness parameters.

It is considered that the interface of the photosensitive layer on the side of the support could be effectively controlled by controlling the state of the surface of the support. However, a preferable state of the surface of the support cannot be defined by use of the conventional surface roughness parameters.

Furthermore, even though the same photoreceptor is used in different image formation apparatus, the state of the formation of the light and shade striped image differs depending upon the image formation apparatus employed, and is largely changed in accordance with the spot diameter of writing light employed. However, it has not been clarified what factors cause such differences in the formation of the light and shade striped image.

The inventors of the present invention have studied the mechanism of the formation of the light and shade striped image and tried to control the interface of the photosensitive layer on the side of the support in order to provide a photoreceptor which is free of the problem of forming the light and shade striped image. Further, the study has been conducted from the view point that even if the light and shade striped image is formed, as long as the intervals between the stripes are too small to recognize visually, the formation of such light and shade striped image will cause no problem.

According to the present invention, it has been discovered that the interface of the photosensitive layer on the side of the support has minute unevenness in the form of a number of waves, and that by forming an appropriate unevenness at the interface of the photosensitive layer on the side of the support so as to increase the power of all the waves of the unevenness, the formation of the light and shade stripes can be made invisible to the naked eye.

That the waves have a large power means that the interface of the photoreceptor on the side of the support has sufficiently large roughness in its entirety or sufficiently roughened, so that the intervals between the light and shade stripes are too narrow to visually recognize the light and shade stripes.

The photoreceptor of the present invention comprises a support and a photosensitive layer formed thereon comprising at least a charge generation material and a charge transport material, optionally with the provision of an undercoat layer and a protective layer.

The photoreceptor of the present invention may be either (1) a layered photoreceptor comprising a charge generation layer comprising a charge generation material and a charge transport layer comprising a charge transport material, which layers are overlaid one on another, or (2) a single layer photoreceptor comprising a photosensitive layer comprising a charge generation material and a charge transport material in the form of a mixture. Both the layered photoreceptor and the single layer photoreceptor of the present invention exhibit excellent photographic characteristics. The profile of the interface of the photosensitive layer on the side of the support can be represented by the profile of the overlaid photosensitive layer or of the support as long as the layer of the photosensitive layer on the side of the support or the support itself is not dissolved or deformed by the formation of the photosensitive layer.

When the photoreceptor has an undercoat layer, a profile of the surface of the undercoat layer can be used for the above-mentioned profile.

When the photoreceptor does not have the undercoat layer, a profile of the surface of the support can be used for the above-mentioned profile.

As a method for measuring the profile in the present invention, an optical method, an electrical method, an electrochemical method, and a physical method can be employed. Any method can be employed as long as the method has excellent reproducibility and high measurement accuracy and is simple to use. Of the above-mentioned methods, an optical method and a physical method are preferable since such methods are simple to use. A physical method using a feeler is considered to be most preferable since it has excellent reproducibility and measurement accuracy.

The power of the wave of the interface of the photosensitive layer on the side of the support can be represented by I(S) which is calculated by the steps of (1) subjecting a group of data to discrete Fourier transformation, which group of data consists of N samples of the height x(t)(μm) of the profile of the photoreceptor measured perpendicular to the horizontal direction of the photoreceptor taken at Δt(μm) intervals, in accordance with the following formula;

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein n and m are an integer, $N=2^p$ in which p is an integer, (2) obtaining a power spectrum represented by the following formula:

$$S\left(\frac{n}{N\cdot\Delta t}\right)=\frac{1}{N}\cdot\left|X\left(\frac{n}{N\cdot\Delta t}\right)\right|^2$$

and (3) calculating from the power spectrum I(S) represented by the following formula:

$$I(S)=\left(\frac{1}{N}\right)\sum_{n=0}^{N-1}\left\{S\left(\frac{n}{N\cdot\Delta t}\right)\right\}$$

The value of I(S) is $6.0\times10^{-3}$ or more, preferably $8.0\times10^{-3}$ or more, more preferably $10.0\times10^{-3}$ or more, furthermore preferably $12.0\times10^{-3}$ or more.

When the value of I(S) is less than $6.0\times10^{-3}$, the power of the wave of the interface of the photosensitive layer on the side of the support is so weak in its entirety that the portions where the intervals of the light and shade stripes are broad are apt to exist, and the problem of the light and shade striped image likely occurs. In order to control or reduce only the formation of the light and shade striped image, the larger the value of I(S) the better. However, when the value of I(S) is excessively large, short circuit tends to be caused by a burr of the support, or a photoconductive material tends to coagulate around the burr, and discharge destruction of the photosensitive layer tends to occur, so that apart from the light and shade striped image, further abnormal images are apt to be formed. Therefore, it is preferable that the value of I(S) be approximately $100.0\times10^{-3}$ or less, although it depends upon the image formation apparatus employed.

When the horizontal direction of the profile of the interface of the photosensitive layer on the side of the support is t[μm], the surface roughness x(t)[μm] of the interface of the photoreceptor irregularly varies, the amount of which is here referred to as an irregular variate. Any variate can be obtained by Fourier transformation by synthesizing sine wave variations with various frequencies, using an appropriate phase and an amplitude.

$$x(t)=\int_{-\infty}^{\infty}X(k)\exp(i2\pi kt)\,dk$$

$$X(k)=\int_{-\infty}^{\infty}x(t)\exp(-i2\pi kt)\,dt$$

wherein k is the wave number [$\mu m^{-1}$; the number of waves per μm]. The Fourier component x(k) represents the amplitude of the wave with the wave number k, namely, with a wavelength of λ (=1/k [μm]), which is contained in the irregular variate. $|X(k)|^2$ represents the energy of the component wave with the wave number k.

The distribution relationship between the wave number k and the energy $|X(k)|^2$ of the component wave, that is, the spectrum, will now be considered.

$$S(k) = \lim_{T\to\infty}\left[\frac{1}{T}|X(k)|^2\right]$$

S(k) is an average energy of the component wave with the wave number k of the profile per unit interval [1 μm], and is defined as the power spectrum. However, the height x(t) of the profile cannot be practically defined in the range of $-\infty<t<\infty$. The measurement thereof is carried out within part of the profile, $-T/2\leqq t\leqq T/2$, so that in calculating S(k), such a limit of T as $T\to\infty$ is not used, but there is used such a value for T that an average value thereof is sufficiently large relative to the wavelength 1/k as a macroscopic physical amount, whereby $$S(k) = \frac{1}{T}|X(k)|^2$$

is calculated. Practically, the result is identical when the limit of $T\to\infty$ is used.

The Fourier transformation is changed to the following due to the use of discrete Fourier transformation:

$$X\left(\frac{n}{N\cdot\Delta t}\right) = \sum_{m=0}^{N-1} x(m\cdot\Delta t)\exp\left(-i2\pi\cdot\frac{n}{N\cdot\Delta t}\cdot m\cdot\Delta t\right)$$

wherein n and m are an integer, N is the number of sampling points for measurement of the surface roughness, which is required to be an integer represented by $N=2^p$, and Δt[μm] is the intervals of the sampling points for the measurement of the height of the profile, and is in the relationship of T/Δt=N.

When the range T for the measurement of the profile in the horizontal direction is too short, the number of waves for the transformation becomes too small, so that a measurement error is increased and the existing waves cannot be evaluated. It is necessary to select an appropriate value for the measurement range T in accordance with the values of Δt and N.

In the photoreceptor of the present invention, the measurement range T is approximately in the range of 500 nm to 5000 μm, preferably in the range of 600 nm to 4000 μm, more preferably in the range of 700 nm to 3000 μm, except when it is necessary to take into consideration a wave with an extremely long wavelength such as surface waviness.

The inventors of the present invention have determined and studied the power spectrum with respect to each combination of the number N of the sampling points at the interface of the photosensitive layer on the side of the support of the photoreceptor of the present invention and the value of Δt. The result was that it was confirmed that the power spectrum sufficiently converges when the sampling interval Δt was 0.31 [μm] (Δt=0.31 [μm]) and N was 4096 (N=4096) as indicated in working examples of the present invention.

The power spectrum was derived by a discrete Fourier transformation by the following calculation:

$$S\left(\frac{n}{N\cdot\Delta t}\right) = \frac{1}{N}\cdot\left|X\left(\frac{n}{N\cdot\Delta t}\right)\right|^2$$

I(S) was calculated by use of the following formula:

$$I(S) = \left(\frac{1}{N}\right)\sum_{n=0}^{N-1}\left\{S\left(\frac{n}{N\cdot\Delta t}\right)\right\}$$

wherein n and m are an integer, N $2^p$ in which p is an integer.

It was also confirmed that when Δt=0.31 [μm], the integral value converged within several % of error at N=4096.

From a different angle, the above can be considered as follows: When the sampling interval (real space) of the measurement of the roughness of the interface of the photosensitive layer on the side of the support is Δt[μm], the sampling interval (reciprocal space) of the power spectrum is Δn=1/(N·Δt) [$\mu m^{-1}$]. This is because the domain of definition of the height x(t) of the profile is the interval of T–N·Δt. This indicates that the original signal x(t) can be reproduced by the Fourier spectrum of the value of the sample with the interval of Δn (=1/(N·Δt)) in the reciprocal space. The variation period of the profile that can be reproduced here is approximately 2Δt in accordance with Shannon's sampling theorem.

With respect to the phenomenon now in consideration, a surface roughness with a variation period above the above-mentioned variation period is involved, so that the sampling interval of Δt(=0.31 [μm]) is sufficient. It may be necessary to consider a more minute variation period in case a different phenomenon takes place. In such a case, the sampling interval is further shortened in accordance with the variation period.

In order to control the I(S) of the profile of the photosensitive layer on the side of the support, it is extremely effective to control the profile of the surface of the support. This is so when the photoreceptor includes no undercoat layer. Even when the photoreceptor includes an undercoat layer which is provided on the support, with the photosensitive layer being overlaid on the undercoat layer, as long as the undercoat layer is not extremely thick, the unevenness of the surface of the support faithfully reflects on the surface of the undercoat layer, so that it is easier and much more effective to control the I(S) of the profile of the photosensitive layer on the side of the support by controlling the profile of the surface of the support than by controlling the composition of the undercoat layer and the method of overlaying the undercoat layer on the support.

The I(S) of the profile of the surface of the support, which is measured in the same manner as that of the profile of the photosensitive layer on the side of the support, is preferably $12.0\times10^{-3}$ or more, more preferably $14.0\times10^{-3}$ or more, furthermore preferably $16.0\times10^{-3}$ or more.

When the value of I(S) is less than $12.0\times10^{-3}$, in particular in the photoreceptor provided with the undercoat layer, the power of the wave of the interface of the photosensitive layer on the side of the support is so weak in its entirety that the portions where the intervals of the light and shade stripes are broad are apt to exist, and the problem of the light and shade striped image likely occurs. In order to control or reduce only the formation of the light and shade striped image, the larger the value of I(S) of the profile of the surface of the support, the better. However, when the value of I(S) is excessively large, short circuit tends to be caused by a burr of the support, or a photo-conductive material tends to coagulate around the burr, and discharge destruction of the photosensitive layer tends to occur, so that apart from the light and shade striped image, further abnormal images are apt to be formed as mentioned above. Therefore, it is preferable that the value of I(S) be approximately 150.0×

$10^{-3}$ or less, although it depends upon the image formation apparatus employed.

The inventors of the present invention have discovered that in the photoreceptor comprising the support, the undercoat layer provided on the support, and the photosensitive layer overlaid on the undercoat layer, the relationship between the state of the surface of the support and the spot diameter of writing light has some connection with the formation of the light and shade striped image.

As mentioned above, the support for the photoreceptor has minute unevenness or roughness at the surface thereof and the minute unevenness is composed of a number of waves. The inventors of the present invention have discovered that of such waves, the waves with a wavelength which is ½ or more of the spot diameter of writing light are involved in the formation of the light and shade striped image.

That the waves having a wavelength which is ½ or more of the spot diameter of the writing light have high energy in the entirety thereof means that the surface of the photoreceptor largely varies by the wave having a wavelength which is ½ or more of the spot diameter of the writing light. The reasons why, of the waves which constitute the surface of the photoreceptor, the waves having a wavelength which is ½ or more of the spot diameter of the writing light are involved in the formation of the light and shade striped image, and the waves having a wavelength which is less than ½ of the spot diameter of the writing light are not involved in the formation of the light and shade striped image, have not yet clarified, but there is clearly a correlation between the wavelength and the formation of the light and shade striped image as mentioned above. Thus, it is considered that some optical effects in the course of the writing process by the writing light work on the formation of the light and shade striped image.

Therefore, of the waves that constitute the profile of the support for the photoreceptor, the I(S) of the waves with a wavelength of $\phi/2$ ($\mu$m) or more is important, where $\phi$ ($\mu$m) is the spot diameter of the writing light.

The profile of the surface of the support for the photoreceptor of the present invention is subjected to discrete Fourier transformation with respect to a group of data which consists of N samples of the height x(t) ($\mu$m) of the profile in the horizontal direction of the photoreceptor taken at $\Delta t$($\mu$m) intervals, in accordance with the following formula:

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein n and m are an integer, $N=2^p$ in which p is an integer.

The value of I'(S) of the wave with a wavelength of $\phi/2$ or more, derived from the following formula, is $6.0\times10^{-3}$ or more, preferably $8.0\times10^{-3}$ or more, more preferably $9.0\times10^{-3}$ or more:

$$S\left(\frac{n}{N\cdot\Delta t}\right)=\frac{1}{N}\cdot\left|X\left(\frac{n}{N\cdot\Delta t}\right)\right|^2$$

$$I(S)=\left(\frac{1}{N}\right)\sum_{n=0}^{N-1}\left\{S\left(\frac{n}{N\cdot\Delta t}\right)\right\}$$

wherein j is a maximum integer which satisfies $N\cdot\Delta t/j\geqq\phi/2$, and $\phi$ is the spot diameter ($\mu$m) of writing light for image formation.

The inventors of the present invention next studied how different the photoreceptor that produces various streaked images and the photoreceptor that does not produce the streaked images are. As a result, the inventors of the present invention discovered that in the photoreceptor that produces the streaked images, the potential of the latent image on the photoreceptor varies at almost equal intervals in the long axial direction of the photoreceptor, and considered that the variations in the potential may be larger in the photoreceptor that produces the streaked images than in the photoreceptor that does not produce the streaked images. In order to back up this consideration, the inventors of the present invention closely observed the photoreceptors and discovered that in the photoreceptor that produces the streaked images, the photosensitivity varies at substantially the same intervals as the intervals of the streaks of the streaked images in the long axial direction of the photoreceptor, and that the intervals of the variation are almost the same as those of the unevenness of the interface of the photosensitive layer on the side of the support, while in the photoreceptor that does not produce the streaked images, there is the same unevenness at the interface thereof on the side of the support as in the photoreceptor that produces the streaked images, the unevenness is less irregular in shape than the unevenness in the photoreceptor that produces the streaked images.

In the photoreceptor with extremely reduced irregularities in the unevenness at the interface thereof on the side of the support, a large unevenness itself is generally difficult to find at the interface, so that the interface is nearly smooth and therefore the photoreceptor does not produce the streaked images, but tends to produce grained light and dark striped images or band-shaped light and dark striped images. This tendency is particularly conspicuous when an undercoat layer is As mentioned above, the surface of the support for the photoreceptor usually often has unevenness or roughness which is formed by the machining or other working of the support. In the case where the support for the photoreceptor is cylindrical, the support is usually machined and worked on a lathe as the support is rotated, using a cutting tool as it is moved, and an unevenness with a relatively large amplitude is formed on the surface of the support at intervals equal to the moving speed of the cutting tool. The intervals of concave portions and convex portions in the unevenness with the relatively large amplitude often have such a period that corresponds to about ½ to ⅓ to several times the period of the writing light used in the image formation apparatus employed.

When a charge generation layer is provided on this support, with the application of a coating liquid for the formation of the charge generation layer to the support, by the immersion coating method, the coating liquid is apt to move more into concave portions than into convex portions of the support, so that the deposition amount of the charge generation layer tends to change so as to reflect the unevenness of the surface of the support. Therefore, the variation in the photosensitivity of the photoreceptor tends to have such a regularity so as to reflect the unevenness of the surface of the support. It is considered that when the period of the variation is increased to about one or more integer times the period of the period of the writing light, the picture elements formed by the irradiation of the writing light have a light and shade period, whereby streaked images are formed. Even if the charge generation layer is uniformly deposited when it is overlaid on the support, since the surface of the photoreceptor is generally microscopically flat, so that the thickness of the charge transport layer microscopically varies in accordance with the unevenness of the support. It is considered therefor that when the support has some regularity in the unevenness of the surface thereof, the way of the multiple reflection of the writing light within the charge transport layer comes to have a regularity, so that the apparent photosensitivity of the photoreceptor comes to have a regularity, and when the period of the variation of the photosensitivity amounts to about one or more integer times the period of the writing light, the picture elements formed come to have a light and shade periodicity, whereby streaked images are formed.

More specifically, it has been discovered that the photoreceptor comprising at least the photosensitive layer on the support having the following features is capable of controlling the formation of the streaked images:

In the profile of the interface of the photosensitive layer on the side of the support for the photoreceptor, when a group of data which consists of N samples of the height x(t)($\mu$m) of the profile, measured perpendicular to a horizontal direction of the support, taken at $\Delta t$($\mu$m) intervals in the horizontal direction, is subjected to discrete Fourier transformation in accordance with the following formula:

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein n and m are an integer, $N=2^p$ in which p is an integer, a power spectrum derived from the following formula, $$S\left(\frac{n}{N\cdot\Delta t}\right)=\frac{1}{N}\cdot\left|X\left(\frac{n}{N\cdot\Delta t}\right)\right|^2,$$

has a plurality of peaks in a region in which n satisfies $$\frac{1}{5}\geq\frac{n}{N\cdot\Delta t}\geq\frac{1}{50}.$$

In such a photoreceptor as mentioned above, the microscopic variations in the thickness of the photosensitive layer can be made sufficiently fine and irregular, so that any regularity can be removed in the way of the multiple reflection of the writing light within the charge transport layer, and therefore the streaked images are practically not formed.

The wave with a wavelength of about 5 $\mu$m or less, in which n is in the region of $$\frac{1}{5}<\frac{n}{N\cdot\Delta t},$$

has too small an amplitude to have a substantial effect of controlling the regularity of the microscopic variations in the thickness of the photosensitive layer.

On the other hand, the wave with a wavelength of about 50 $\mu$m or more, in which n is in the region of $$\frac{1}{50}>\frac{n}{N\cdot\Delta t},$$

has little effect of making sufficiently minutely irregular the microscopic variations in the thickness of the photosensitive layer because of the long wavelength.

The magnitude of the plurality of the peaks which is present in the region in which n satisfies $$\frac{1}{5}\geq\frac{n}{N\cdot\Delta t}\geq\frac{1}{50}$$

is extremely important for controlling the regularity of the microscopic variations in the thickness of the photosensitive layer.

The magnitude of the peaks, $$S\left(\frac{n}{N\cdot\Delta t}\right),$$

is $$S\left(\frac{n}{N\cdot\Delta t}\right)\geq 45\times10^{-6}N,$$

preferably $$S\left(\frac{n}{N\cdot\Delta t}\right)<60\times10^{-6}N,$$

more preferably $$S\left(\frac{n}{N\cdot\Delta t}\right)\geq 75\times10^{-6}N.$$

When the magnitude of the peaks is $$S\left(\frac{n}{N\cdot\Delta t}\right)<45\times10^{-6}N,$$

the power of the wave is so small that the affect of making sufficiently minutely irregular the microscopic variations in the thickness of the photosensitive layer cannot be controlled.

Furthermore, the deposition amount of the charge generation layer tends to have a periodicity and therefore the peak with the magnitude cannot be such a peak that controls the formation of the streaked images. The number of the peaks is plural, preferably 4 or more, more preferably 7 or more.

That there is a plurality of the peaks means that there is a plurality of waves, each having a different wavelength, and the microscopic variations in the thickness of the photosensitive layer can be made sufficiently minutely irregular to such a degree that corresponds to the number of the peaks. Thus, the streaked images are hardly visually recognized to the naked eye. In contrast to this, when there is only one peak, the microscopic variations in the thickness of the photosensitive layer come to have regularity, which may often disadvantageously cause the formation of abnormal images.

When the photosensitive layer is provided on the support through the undercoat layer, it is particularly effective to form minute unevenness on the surface of the undercoat layer. This is because as long as the undercoat layer is neither dissolved or swollen when the photosensitive layer is overlaid thereon, the state of the surface of the undercoat layer becomes almost the same as that of the interface of the photosensitive layer on the side of the support, so that by forming the minute unevenness on the surface of the undercoat layer, the minute unevenness can be easily formed at the interface of the photosensitive layer on the side of the support.

More specifically, it has been discovered that the photoreceptor comprising at least the photosensitive layer on the support having the following features is capable of controlling the formation of streaked images: when a group of data which consists of N samples of the height x(t)($\mu$m) of the profile of the interface of the undercoat layer, measured perpendicular to a horizontal direction of the support, taken at $\Delta t$($\mu$m) intervals in the horizontal direction, is subjected to discrete Fourier transformation in accordance with the following formula:

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

Wherein n and m are an integer, and $N=2^p$ in which p is an integer, a power spectrum derived from the following formula, $$S\left(\frac{n}{N\cdot\Delta t}\right)=\frac{1}{N}\cdot\left|X\left(\frac{n}{N\cdot\Delta t}\right)\right|^2,$$

has a plurality of peaks in a region in which n satisfies $$\frac{1}{5}\geq\frac{n}{N\cdot\Delta t}\geq\frac{1}{50}.$$

The wave with a wavelength of about 5 $\mu$m or less, in which n is in the region of $$\frac{1}{5}<\frac{n}{N\cdot\Delta t},$$

has too small an amplitude to have a substantial effect of controlling the movement of the coating liquid for the formation of the photosensitive layer at the time of drying thereof. The wavelength is also too short to sufficiently make irregular the variations in the unevenness of the photosensitive layer at the interface on the side of the support.

On the other hand, a wave with a wavelength of about 50 $\mu$m or more, in which n is in the region of $$\frac{1}{50}>\frac{n}{N\cdot\Delta t},$$

tends to bring about the movement of the coating liquid for the formation of the photosensitive layer at the time of drying thereof.

The magnitude of the plurality of the peaks which is present in the region in which n satisfies $$\frac{1}{5}\geq\frac{n}{N\cdot\Delta t}\geq\frac{1}{50}$$

is extremely important for controlling the movement of the coating liquid for the formation of the photosensitive layer at the time of drying thereof.

The magnitude of the peaks, $$S\left(\frac{n}{N\cdot\Delta t}\right),$$

is $$S\left(\frac{n}{N\cdot\Delta t}\right)\geq 45\times 10^{-6}N,$$

preferably $$S\left(\frac{n}{N\cdot\Delta t}\right)\geq 60\times 10^{-6}N,$$

more preferably $$S\left(\frac{n}{N\cdot\Delta t}\right)\geq 75\times 10^{-6}N.$$

When the magnitude of the peaks is $$S\left(\frac{n}{N\cdot\Delta t}\right)< 45\times 10^{-6}N,$$

the power of the wave is so small that the movement of the coating liquid cannot be controlled and therefore streaked images are apt to be formed, and this range is not preferable.

The number of the peaks is plural, preferably 4 or more, more preferably 7 or more.

That there is a plurality of the peaks means that there is a plurality of waves, each having a different wavelength, and the movement of the coating liquid at the time of the drying thereof is controlled differently by each wave, causing irregular movement of the coating liquid, so that even if streaked images are formed, such images are eventually made irregular in appearance and almost cannot be recognized by the naked eye.

In contrast to this, when there is only one peak, the movement of the coating liquid is controlled regularly, which may often disadvantageously cause the formation of abnormal images. Furthermore, when there is only one peak, the power of the wave itself tends to become so weak that the effect of controlling the movement of the coating liquid is disadvantageously small.

It is extremely important that the above-mentioned unevenness is formed on the surface of the support for the photoreceptor. This is because when the undercoat layer is not provided on the support, as long as the photosensitive layer is neither dissolved or swollen when the photosensitive layer is provided, the state of the interface of the photosensitive layer on the side of the support is substantially the same as the state of the surface of the support, and when the undercoat layer is provided on the support, in particular, when the undercoat layer is provided by coating a coating liquid for the formation of the undercoat layer on the support, the unevenness formed on the surface of the support works to control the movement of the coating liquid on the surface of the support, so that the unevenness has an effect of making it difficult to reflect regular waves with a large amplitude on the interface of the photosensitive layer on the side of the support.

More specifically, it has been discovered that the photoreceptor comprising at least the photosensitive layer on the support having the following features is capable of controlling the formation of streaked images extremely effectively: when a group of data which consists of N samples of the height x(t)($\mu$m) of the profile of the interface of the support, measured perpendicular to a horizontal direction of the support, taken at $\Delta t(\mu m)$ intervals in the horizontal direction, is subjected to discrete Fourier transformation in accordance with the following formula:

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein n and m are an integer, and $N=2^p$ in which p is an integer, a power spectrum derived from the following formula, $$S\left(\frac{n}{N\cdot\Delta t}\right)=\frac{1}{N}\cdot\left|X\left(\frac{n}{N\cdot\Delta t}\right)\right|^2,$$

has a plurality of peaks in a region in which n satisfies $$\frac{1}{5}\geq\frac{n}{N\cdot\Delta t}\geq\frac{1}{50}.$$

The wave with a wavelength of about 5 $\mu$m or less, in which n is in the region of $$\frac{1}{5}<\frac{n}{N\cdot\Delta t},$$

has too small an amplitude to have a substantial effect of controlling the movement of the coating liquid for the formation of the undercoat layer or the photosensitive layer at the time of drying thereof.

On the other hand, a wave with a wavelength of about 50 $\mu$m or more, in which n is in the region of $$\frac{1}{50}>\frac{n}{N\cdot\Delta t},$$

tends to bring about the movement of the coating liquor for the formation of the photosensitive layer at the time of drying thereof.

The magnitude of the plurality of the peaks which is present in the region in which n of the power spectrum of the profile of the undercoat layer satisfies $$\frac{1}{5}\geq\frac{n}{N\cdot\Delta t}\geq\frac{1}{50}$$

is extremely important for controlling the movement of the coating liquid for the formation of the undercoat layer or the photosensitive layer at the time of drying thereof.

The magnitude of the peaks $$S\left(\frac{n}{N\cdot\Delta t}\right),$$

is $$S\left(\frac{n}{N\cdot\Delta t}\right)\geq 60\times10^{-6}N,$$

preferably $$S\left(\frac{n}{N\cdot\Delta t}\right)\geq 75\times10^{-6}N,$$

more preferably $$S\left(\frac{n}{N\cdot\Delta t}\right)\geq 90\times10^{-6}N.$$

When the magnitude of the peaks is $$S\left(\frac{n}{N\cdot\Delta t}\right)<60\times10^{-6}N,$$

the power of the wave is so small that the movement of the coating liquid cannot be controlled and therefore streaked images are disadvantageously apt to be formed, and this range is not preferable.

The number of the peaks is plural, preferably 4 or more, more preferably 7 or more.

That there is a plurality of the peaks means that there is a plurality of waves, each having a different wavelength, and the movement of the coating liquid at the time of the drying thereof is controlled differently by each wave, causing irregular movement of the coating liquid, so that even if streaked images are formed, such images are eventually made irregular in appearance and almost cannot be recognized by the naked eye.

In contrast to this, when there is only one peak, regularity is caused in the movement of the coating liquid at the time of drying the coating liquid, which regularity may often disadvantageously lead to the formation of abnormal images. Furthermore, when there is only one peak, the power of the wave itself tends to become so weak that the effect of controlling the movement of the coating liquid is disadvantageously small.

As long as the support for the photoreceptor is prepared by machining as mentioned above, there cannot be avoided the formation of the unevenness with a wavelength of about ⅓ to 3 times the period of the writing light at the interface of the photosensitive layer of the photoreceptor on the side of the support. In order to cancel the periodicity of the unevenness and to control the formation of the streaked image, it is effective to form the unevenness with a plurality of wavelengths on the surface of the support.

More specifically, in the photoreceptor comprising at least the photosensitive layer on the support, a photoreceptor having the following features is capable of reducing the formation of streaked images extremely effectively: when a group of data which consists of N samples of the height $x(t)(\mu m)$ of the profile of the interface of the photosensitive layer on the side of the support, measured perpendicular to the horizontal direction of the support, taken at $\Delta t(\mu m)$ intervals in the horizontal direction, is subjected to discrete Fourier transformation in accordance with the following formula:

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein n and m are an integer, and $N=2^p$ in which p is an integer, a power spectrum derived from the following formula, $$S\left(\frac{n}{N\cdot\Delta t}\right)=\frac{1}{N}\cdot\left|X\left(\frac{n}{N\cdot\Delta t}\right)\right|^2,$$

has a plurality of peaks in a region in which n satisfies $$\frac{1}{25}\geq\frac{n}{N\cdot\Delta t}\geq\frac{1}{100}.$$

In this case, the peak value of the power spectrum is extremely important. It is preferable that in the region where n satisfies $$\frac{1}{25}\geq\frac{n}{N\cdot\Delta t}\geq\frac{1}{200},$$

the power spectrum have a plurality of peaks that satisfies the conditions of $$S\left(\frac{n}{N\cdot\Delta t}\right)\geq 100\times 10^{-6}N,$$

more preferably $$S\left(\frac{n}{N\cdot\Delta t}\right)\geq 150\times 10^{-6}N,$$

furthermore preferably $$S\left(\frac{n}{N\cdot\Delta t}\right)\geq 175\times 10^{-6}N.$$

When $$S\left(\frac{n}{N\cdot\Delta t}\right)< 100\times 10^{-6}N,$$

the power of the wave is so weak that the effect of controlling the regularity of the unevenness at the interface of the photosensitive layer on the side of the support is small and therefore the streaked images are apt to be formed.

In the photoreceptor comprising the photosensitive layer which is provided via an undercoat layer on the support, a photoreceptor having the following features is also capable of reducing the formation of streaked images extremely effectively: when a group of data which consists of N samples of the height x(t)(μm) of the profile of the undercoat layer at the interface of the photosensitive layer, measured perpendicular to the horizontal direction of the support, taken at Δt(μm) intervals in the horizontal direction, is subjected to discrete Fourier transformation in accordance with the following formula:

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein n and m are an integer, and $N=2^P$ in which p is an integer, the power spectrum derived from the following formula, $$S\left(\frac{n}{N\cdot\Delta t}\right)=\frac{1}{N}\cdot\left|X\left(\frac{n}{N\cdot\Delta t}\right)\right|^2,$$

has a plurality of peaks in a region in which n satisfies $$\frac{1}{25}\geq\frac{n}{N\cdot\Delta t}\geq\frac{1}{200}.$$

In this case, the peak value of the power spectrum is extremely important. It is preferable that in the region where n satisfies $$\frac{1}{25}\geq\frac{n}{N\cdot\Delta t}\geq\frac{1}{200},$$

the power spectrum have a plurality of peaks that satisfies the conditions of $$S\left(\frac{n}{N\cdot\Delta t}\right)\geq 100\times 10^{-6}N,$$

more preferably $$S\left(\frac{n}{N\cdot\Delta t}\right)\geq 150\times 10^{-6}N,$$

furthermore preferably $$S\left(\frac{n}{N\cdot\Delta t}\right)\geq 175\times 10^{-6}N.$$

When $$S\left(\frac{n}{N\cdot\Delta t}\right)< 100\times 10^{-6}N,$$

the power of the wave is so weak that the effect of controlling the regularity of the unevenness at the interface of the photosensitive layer on the side of the support is small and therefore the streaked images are apt to be formed.

Further, a photoreceptor having the following features is also capable of reducing the formation of streaked images extremely effectively: when a group of data which consists of N samples of the height x(t) (μm) of the profile of the surface of the support, measured perpendicular to the horizontal direction of the support, taken at Δt(μm) intervals in the horizontal direction, is subjected to discrete Fourier transformation in accordance with the following formula:

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein n and m are an integer, and $N=2^P$ in which p is an integer, a power spectrum derived from the following formula, $$S\left(\frac{n}{N\cdot\Delta t}\right)=\frac{1}{N}\cdot\left|X\left(\frac{n}{N\cdot\Delta t}\right)\right|^2,$$

has a plurality of peaks in a region in which n satisfies $$\frac{1}{25} \geq \frac{n}{N \cdot \Delta t} \geq \frac{1}{200}.$$

The unevenness with such a relatively large amplitude can be formed on the surface of the support relatively easily by appropriately selecting a cutting tool for use in machining, and by appropriately setting the machining conditions. The wave with a large power has surely an effect not only on the surface of the support, but also on the surface of the undercoat layer so that care must be taken with the above taken into consideration.

In this case, the peak value of the power spectrum is extremely important. It is preferable that in the region where n satisfies $$\frac{1}{25} \geq \frac{n}{N \cdot \Delta t} \geq \frac{1}{200},$$

the power spectrum have a plurality of peaks that satisfies the conditions of $$S\left(\frac{n}{N \cdot \Delta t}\right) \geq 150 \times 10^{-6} N,$$

more preferably $$S\left(\frac{n}{N \cdot \Delta t}\right) \geq 175 \times 10^{-6} N,$$

furthermore preferably $$S\left(\frac{n}{N \cdot \Delta t}\right) \geq 200 \times 10^{-6} N.$$

When $$S\left(\frac{n}{N \cdot \Delta t}\right) < 150 \times 10^{-6} N,$$

the power of the wave is so weak that the effect of controlling the regularity of the unevenness at the interface of the photosensitive layer on the side of the support is small and therefore the streaked images are apt to be formed.

It is known that the streaked image is formed when the amplitude of the profile of the interface of the photosensitive layer on the side of the support is large, and the period of the variations with high regularity is about n times the period of the writing light (where n is an integer), so that when the amplitude of the profile of the interface of the photosensitive layer on the side of the support is not made large, and the period of the variations with high regularity is not made about n times the period of the writing light, the streaked image is not formed.

However, the profile of the interface of the photosensitive layer on the side of the support is composed of a number of waves, so that it has been difficult to specify a wave with a large amplitude and high regularity in the profile of the interface of the photosensitive layer on the side of the support. For analyzing a wave composed of such a large number of waves, Fourier transformation is an extremely useful method and exhibits outstanding power in abstracting waves which may form the streaked image.

A photoreceptor having the following features is also capable of completely controlling or removing the formation of streaked images: when a group of data which consists of N samples of the height x(t)($\mu$m) of the profile of the interface of the photosensitive layer on the side of the support, measured perpendicular to the horizontal direction of the support, taken at $\Delta t$($\mu$m) intervals in the horizontal direction, is subjected to discrete Fourier transformation in accordance with the following formula:

$$X\left(\frac{n}{N \cdot \Delta t}\right) = \sum_{m=0}^{N-1} x(m \cdot \Delta t) \exp\left(-i2\pi \cdot \frac{n}{N \cdot \Delta t} \cdot m \cdot \Delta t\right)$$

wherein n and m are an integer, and $N=2^p$ in which p is an integer, in a power spectrum derived from the following formula, $$S\left(\frac{n}{N \cdot \Delta t}\right) = \frac{1}{N} \cdot \left|X\left(\frac{n}{N \cdot \Delta t}\right)\right|^2,$$

the relationship between the value of n, ($n_{max}$), at which $$S\left(\frac{n}{N \cdot \Delta t}\right)$$

is maximized in the range of 1 to N/2, and the pitch $W_l$ ($\mu$m) of the writing light which is coherent light for image formation is $$\frac{N \cdot \Delta t}{n_{max}} > 1.05\text{m} \cdot W_l$$

or $$\frac{N \cdot \Delta t}{n_{max}} < 0.95\text{m} \cdot W_l,$$

where m is an integer obtained by rounding off the decimals of $$\frac{N \cdot \Delta t}{n_{max} \cdot W_l},$$

provided that when $$\frac{N \cdot \Delta t}{n_{max} \cdot W_l} < 1, m = 1.$$

In an image formation apparatus of the present invention, there is a case where image formation is carried out with the period of the writing light being changed in accordance with the kind of image to be output. In such a case, it is necessary that the writing light satisfy the relationship of $$\frac{N \cdot \Delta t}{n_{max}} > 1.05\text{m} \cdot W_l \text{ or } \frac{N \cdot \Delta t}{n_{max}} < 0.95\text{m} \cdot W_l$$

for each period of the writing light.

In the photoreceptor in which the photosensitive layer is overlaid on the support through the undercoat layer, the profile of the undercoat layer corresponds to the profile of the interface of the photosensitive layer on the side of the support as long as the undercoat layer is not dissolved or swollen in the course of the formation of the photosensitive layer, so that a photoreceptor comprising the photosensitive layer on the support and having the following features is capable of completely controlling or reducing the formation of the streaked images: when a group of data which consists of N samples of the height x(t)($\mu$m) of the profile of the surface of the undercoat layer on the side of the photosensitive layer, measured perpendicular to the horizontal direction of the support, taken at $\Delta t$($\mu$m) intervals in the horizontal direction, is subjected to discrete Fourier transformation in accordance with the following formula;

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein n and m are an integer, and $N=2^p$ in which p is an integer, in the power spectrum derived from the following formula, $$S\left(\frac{n}{N\cdot\Delta t}\right)=\frac{1}{N}\cdot\left|X\left(\frac{n}{N\cdot\Delta t}\right)\right|^2,$$

the relationship between the value of n,($n_{max}$), at which $$S\left(\frac{n}{N\cdot\Delta t}\right)$$

is maximized in the range of 1 to N/2, and the pitch $W_l$ ($\mu$m) of the writing light which is coherent light for image formation is $$\frac{N\cdot\Delta t}{n_{max}}>1.05\text{m}\cdot W_l \text{ or } \frac{N\cdot\Delta t}{n_{max}}<0.95\text{m}\cdot W_l$$

where m is an integer obtained by rounding off the decimals of $$\frac{N\cdot\Delta t}{n_{max}\cdot W_l},$$

provided that when $$\frac{N\cdot\Delta t}{n_{max}\cdot W_l}<1,\ m=1.$$

When a wave with a strong power is present in the profile of the support, the wave intensely reflects upon the profile of the interface of the photosensitive layer on the side of the support, not only in the case where the undercoat layer is not provided, but also in the case where the undercoat layer is provided, so that a photoreceptor comprising the photosensitive layer on the support and having the following features is capable of completely controlling or reducing the formation of the streaked images: when a group of data which consists of N samples of the height x(t)($\mu$m) of the profile of the surface of the undercoat layer, measured perpendicular to the horizontal direction of the support, taken at $\Delta t$($\mu$m) intervals in the horizontal direction, is subjected to discrete Fourier transformation in accordance with the following formula:

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein n and m are an integer, and $N=2^p$ in which p is an integer, in the power spectrum derived from the following formula, $$S\left(\frac{n}{N\cdot\Delta t}\right)=\frac{1}{N}\cdot\left|X\left(\frac{n}{N\cdot\Delta t}\right)\right|^2,$$

the relationship between the value of n,($n_{max}$), at which $$S\left(\frac{n}{N\cdot\Delta t}\right)$$

is maximized in the range of 1 to N/2, and the pitch $W_l$ ($\mu$m) of the writing light which is coherent light for image formation is $$\frac{N\cdot\Delta t}{n_{max}}>1.05m\cdot W_l \text{ or } \frac{N\cdot\Delta t}{n_{max}}<0.95m\cdot W_l,$$

where m is an integer obtained by rounding off the decimals of $$\frac{N\cdot\Delta t}{n_{max}\cdot W_l},$$

provided that when $$\frac{N\cdot\Delta t}{n_{max}\cdot W_l}<1,\ m=1.$$

The photoreceptor of the present invention comprises the support and the photosensitive layer comprising a charge generation material and a charge transport material provided on the support as mentioned above. When necessary, the undercoat layer can be provided between the support and the photosensitive layer, and a protective layer on the photosensitive layer.

The photoreceptor of the present invention may be (1) a layered photoreceptor in which a charge generation layer comprising the charge generation material and a charge transport layer comprising the charge transport material are separately formed and overlaid to form the photosensitive layer, or (2) a single layer photoreceptor in which a mixture of the charge generation material and the charge transport material is contained in the photosensitive layer, since both of the photoreceptors exhibit excellent photoconductive characteristics.

However, the layered photoreceptor is preferable in view of the effects of ozone which is generated when charged in the course of image formation, and also in view of the changes in the chargeability and photosensitivity of the photoreceptor due to the abrasion of the surface of the photoreceptor in the course of image formation. In particular, preferred is a layered photoreceptor which comprises the undercoat layer, the charge generation layer, and the charge transport layer, which layers are successively overlaid in this order on the support.

It is also preferable that the protective be provided on the surface of the layered photoreceptor in order to control the changes in the chargeability and photosensitivity of the photoreceptor due to the abrasion of the surface of the photoreceptor in the course of image formation. In particular, a protective layer comprising a white pigment such as aluminum oxide or titanium oxide is preferable.

The total thickness of the undercoat layer and the charge generation layer of the layered photoreceptor of the present invention is 15 μm or less, preferably 12 μm or less, more preferably 8 μm or less.

When the total thickness of the undercoat layer and the charge generation layer of the layered photoreceptor of the present invention is more than 15 μm since the unevenness of the surface of the support is difficult to reflect on the bottom surface of the charge transport layer, the light and shade image is apt to be formed.

The thickness of the photosensitive layer of the photoreceptor of the present invention is appropriately selected in accordance with the electrostatic characteristics and resolution required by the image formation apparatus in which the photoreceptor is employed. For the attainment of high resolution effectively, the thickness of the photosensitive layer is 15 μm or less, preferably 14 μm or less.

A conventional photoreceptor with a photosensitive layer with a thickness of 15 μm or less can attain high resolution, but is extremely apt to form images with the specific information of the photoreceptor being superimposed on the written image, thereby forming abnormal images including light and shade stripes. However, the photoreceptor of the present invention practically do not produce such abnormal images.

It is extremely important to precisely determine the interface of the photosensitive layer on the side of the support, the surface of the undercoat layer, and the interface of the undercoat layer on the side of the support to control the formation of abnormal images such as the light and shade striped image and the streaked image.

Not only in the field of photoreceptors, but also in other fields, such as in the studies of the adhesion of a solid material to materials such as paint, the friction characteristics of a solid with other materials, and the optical, electrical, and electrochemical characteristics of a solid material, is it known that these characteristics largely vary in accordance with the profile of the surface of the solid material, so that precise determination of the profile of the surface of solid materials is required in many fields.

The profile of the surface of such solid materials is determined, using parameters such as Center-line Mean Roughness (Ra), Maximum Height (Rmax), Ten-point Mean Roughness (Rz), for instance, as shown in Japanese Industrial Standards JIS B 0601.

However, there is a case where materials which are almost the same in these parameters have significantly different characteristics. In such a case, the profiles of the materials are conspicuously different. It is extremely difficult to determine the profile of the surface of a solid material by use of a reference profile. This is because generally a profile is composed of a number of superimposed waves, and there are not always waves in the same shape in the horizontal direction. The regularity of the profile of the surface of a solid material subjected to surface machining tends to be broken, depending upon machining conditions, the abraded conditions of each part of surface machining apparatus, and the state of maintenance of the surface machining apparatus. This makes it more difficult to determine the profile of the surface of the solid material.

For instance, Japanese Laid-Open Patent Application 9-178470 discloses a method of determining a profile of the surface of a solid material. In the method, the surface of a solid material is evaluated based on a spectrum obtained by subjecting a profile of the surface of the solid material to be measured to Fourier transformation. In this method, the profile is decomposed into a plurality of its constituent waves, and the wavelength of each of the constituent waves can be determined, so that the determination of the profile is easier than that of conventional methods. Furthermore, this method is convenient to perform a new analysis of the profile by eliminating or adding a particular wave.

The spectrum obtained by this method, however, also indicates a number of weak waves so that the determination tends to be imprecise. Furthermore, in many cases, the characteristics of the solid surface correlate with the power of each wave, this method is apt to provide misleading determination.

Power spectrum indicates the power of each wave and is most suitable for evaluating the profile of a solid surface. In Japanese Laid-Open Patent Application 7-128037, there is disclosed a method of evaluating the surface roughness by the steps of subjecting the surface wave of a machined surface to Fourier transformation, and then performing a conversion to a frequency analysis relation between a frequency and a power spectrum. In Japanese Laid-Open Patent Application 7-128037, however, there is not disclosed a specific method of determining the power spectrum. Furthermore, the frequency is not described specifically, with the omission of the unit of the frequency, so that the wavelength of the wave with each frequency cannot be identified. In the case of a relative evaluation conducted under constant measurement conditions with respect to the profile of the solid surface, and under constant analysis conditions, the above description may be acceptable. Should there be a slight change in the measurement or analysis conditions, no evaluation and determination of the profile can be carried out by the method described in Japanese Laid-Open Patent Application 7-128037.

The inventors of the present invention have discovered a method of evaluating a solid surface, in particular, the interface of the photosensitive layer of the photoreceptor on the side of the support, the surface of the undercoat layer, and the surface of the support, which method is carried out, not by the relative evaluation as in Japanese Laid-Open Patent Application 7-128037, but by such evaluation that can be done even if the measurement conditions are changed.

More specifically, this method is carried out by the steps of subjecting a group of data which consists of N samples of the height x(t)(μm) of a profile of a solid surface, measured perpendicular to the horizontal direction of the solid surface, taken at Δt(μm) intervals in the horizontal direction of the solid surface, to discrete Fourier transformation in accordance with the following formula:

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein n and m are an integer, and $N=2^p$ in which p is an integer, and comparing a power spectrum derived from the following formula $$S\left(\frac{n}{N\cdot\Delta t}\right)=\frac{1}{N}\cdot\left|X\left(\frac{n}{N\cdot\Delta t}\right)\right|^2,$$

with a specific reference.

More specifically, according to the present invention, there is provided a method of evaluating a solid surface comprising the steps of:

measuring a group of data which consists of N samples of the height x(t)(μm) of a profile of the solid surface, perpendicular to the horizontal direction of the solid surface, taken at Δt(μm) intervals in the horizontal direction of the solid surface, subjecting the data group measured to discrete Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \quad (1)$$

wherein n and m are an integer, and $N=2^p$ in which p is, an integer, calculating a power spectrum derived from formula (2):

$$S\left(\frac{n}{N\cdot\Delta t}\right)=\frac{1}{N}\cdot\left|X\left(\frac{n}{N\cdot\Delta t}\right)\right|^2, \quad (2)$$

and comparing the power spectrum calculated with a specific reference, thereby evaluating the solid surface.

Furthermore, according to the present invention, there is provided a method of evaluating a solid surface comprising the steps of:

measuring a group of data which consists of N samples of the height x(t)(μm) of a profile of the solid surface, perpendicular to the horizontal direction of the solid surface, taken at Δt(μm) intervals in the horizontal direction of the solid surface, subjecting the data group measured to discrete Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \quad (1)$$

calculating I(S) derived from formula (2) and formula (3):

$$S\left(\frac{n}{N\cdot\Delta t}\right)=\frac{1}{N}\cdot\left|X\left(\frac{n}{N\cdot\Delta t}\right)\right|^2, \quad (2)$$

$$I(S)=\frac{1}{N}\sum_{n=0}^{N-1}S\left(\frac{n}{N\cdot\Delta t}\right), \quad (3)$$

and comparing the I(S) calculated with a specific threshold value, thereby evaluating the solid surface.

Furthermore, according to the present invention, there is provided a method of evaluating a solid surface comprising the steps of:

measuring a group of data which consists of N samples of the height x(t)(μm) of a profile of the solid surface, perpendicular to the horizontal direction of the solid surface, taken at Δt(μm) intervals in the horizontal direction of the solid surface, subjecting the data group measured to discrete Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \quad (1)$$

calculating I(S) derived from formula (2) and formula (4):

$$S\left(\frac{n}{N\cdot\Delta t}\right)=\frac{1}{N}\cdot\left|X\left(\frac{n}{N\cdot\Delta t}\right)\right|^2 \quad (2)$$

$$I'(S)=\frac{1}{N}\sum_{n=a}^{b}S\left(\frac{n}{N\cdot\Delta t}\right) \quad (4)$$

wherein a and b are an integer of N or less, and a≦b, and comparing the I'(S) calculated with a specific threshold value, thereby evaluating the solid surface.

Furthermore, according to the present invention, there is provided a method of machining a solid surface by changing the machining conditions for the solid surface based on any of the above-mentioned methods of evaluating the solid surface.

An example of the present invention will now be explained, using aluminum drums which are used as a support for a photoreceptor.

Figure 2:
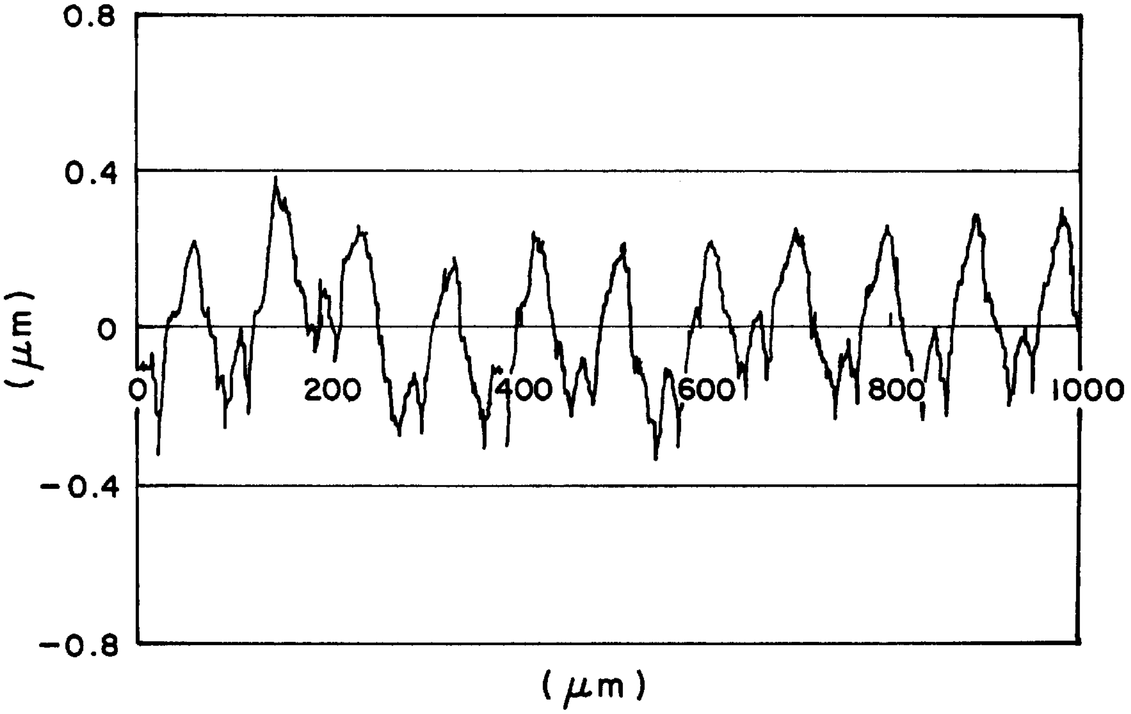
FIG. 2 shows a profile of the outer surface of an aluminum drum A which was cut with a cutting machine equipped with a brand-new diamond cutting tool.

FIG. 2 shows a profile of an aluminum drum A which was cut with a cutting machine equipped with a brand-new diamond cutting tool.

Figure 3:
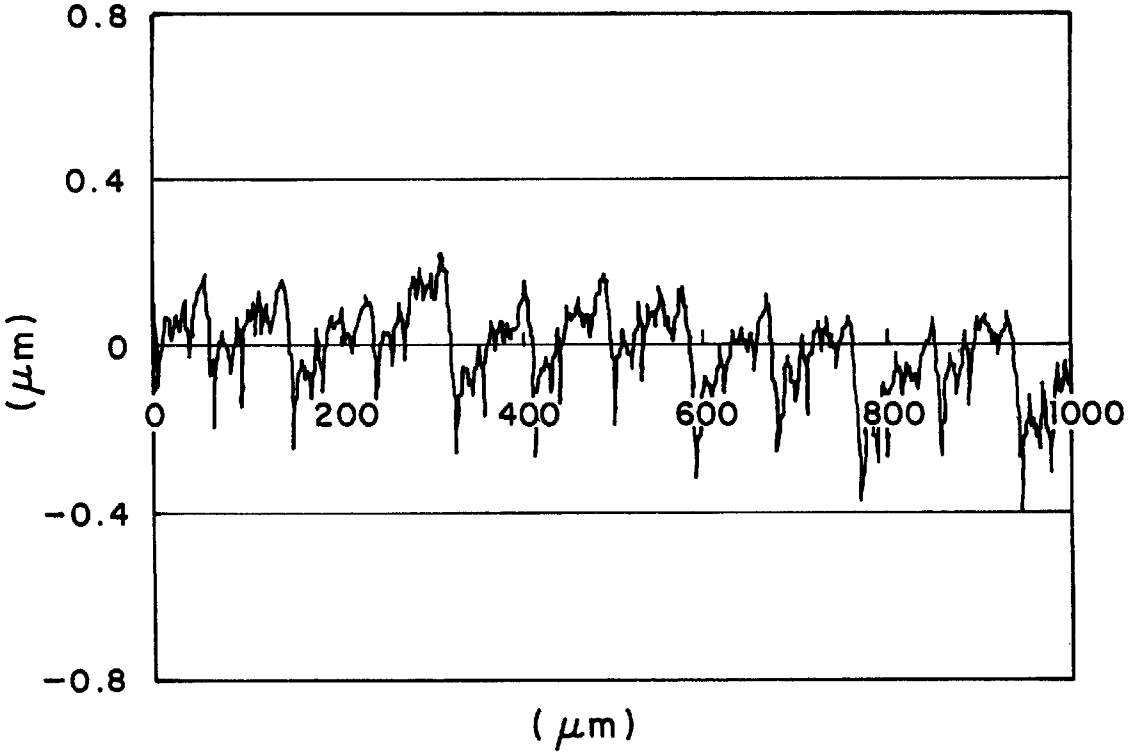
FIG. 3 shows a profile of the outer surface of an aluminum drum B which was cut with the same cutting machine as mentioned above after 500 aluminum drums were cut.
Figure 4:
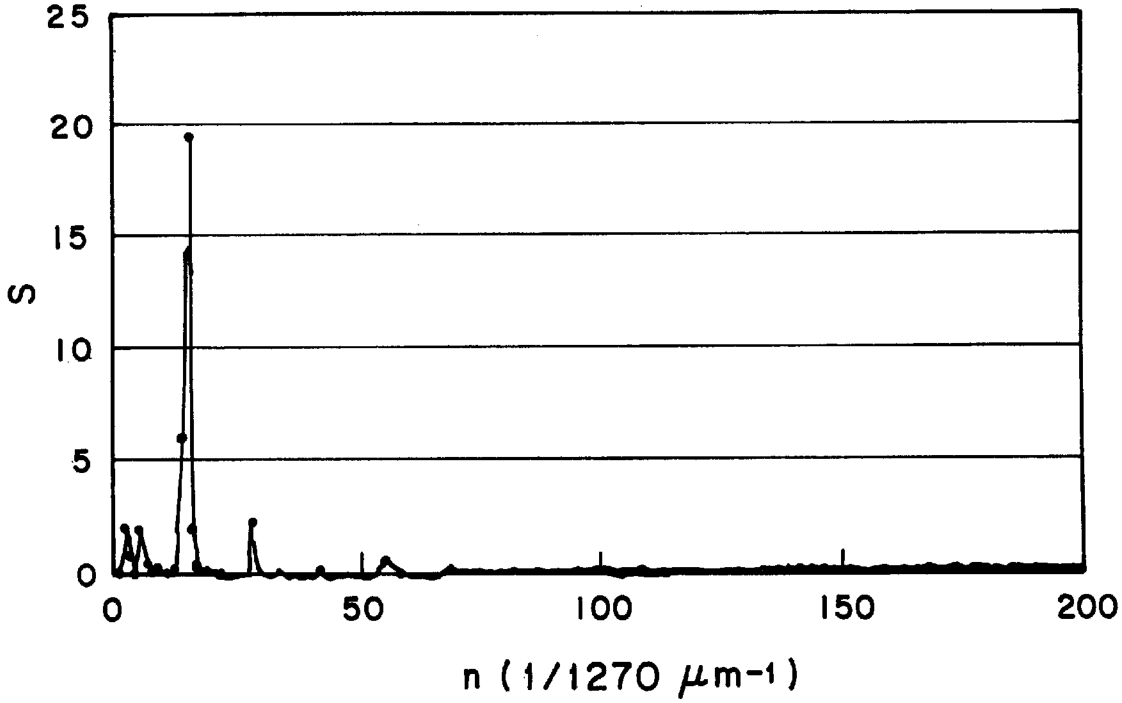
FIG. 4 shows a power spectrum of the outer surface of the aluminum drum A ($\Delta t=0.31$ $\mu m$, N=4096).
Figure 5:
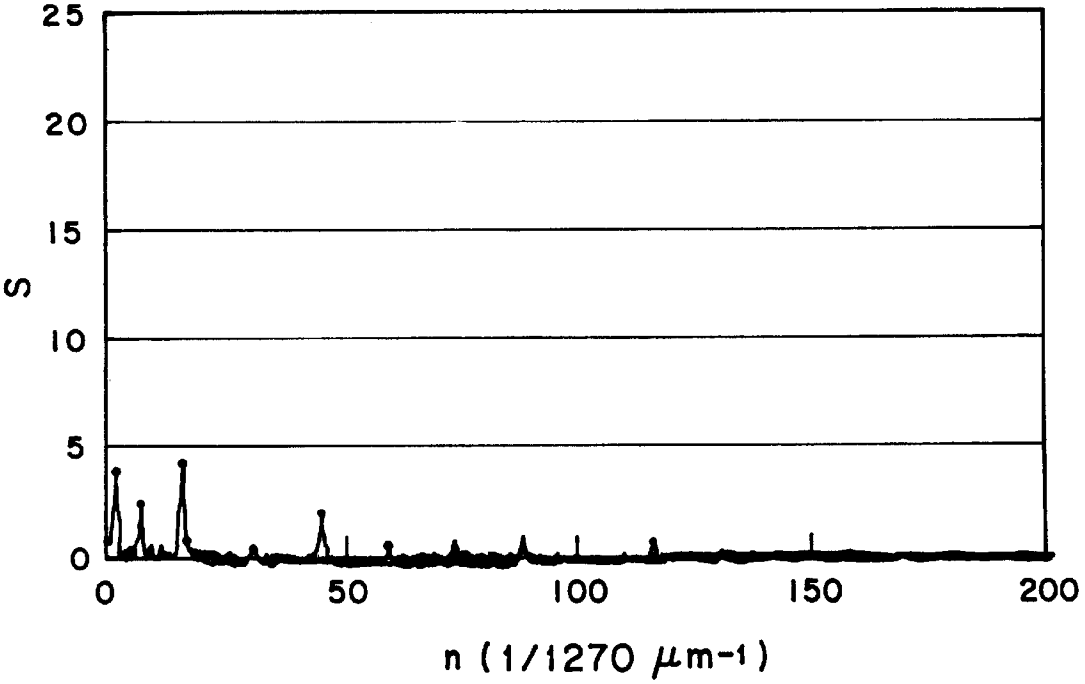
FIG. 5 shows a power spectrum of the outer surface of the aluminum drum B ($\Delta t=0.31$ $\mu m$, N=4096).

FIG. 3 shows a profile of an aluminum drum B which was cut with the same cutting machine as mentioned above after 500 aluminum drums were cut, FIG. 4 shows the power spectrum of the aluminum drum A (Δt=0.31 μm, N=4096), and FIG. 5 shows the power spectrum of the aluminum drum B (Δt=0,31 μn, N 4096).

The profile of the aluminum drum A and the profile of the aluminum drum B conspicuously differ. However, with respect to the conventionally employed parameter of surface roughness, Ten-point Mean Roughness (Rz), the two aluminum drums A and B are almost the same.

With reference to their power spectrums, the two aluminum drums A and B clearly differ.

In the aluminum drum A, most of the waves have a wavelength of 84.7 μm (15/1270 $\mu m^{-1}$) and have a strong power. In the aluminum drum B, however, in addition to the waves with a wavelength of 84.7 μm (15/1270 $\mu m^{-1}$), there are waves with a wavelength of 635 μm (2/1270 $m^{-1}$), of which power is significantly lower than the power of the waves with a wavelength of 84.7 μm.

Therefore, for instance, when a solid member for which a wave with a particular wavelength is indispensable, or from which a wave with a particular wavelength must be eliminated is prepared, the existence or non existence of such a particular wave can be easily seen or the degree of the power of the wave can be easily assessed by checking the power spectrum of the member, so that it can be extremely easily determined whether or not the solid member is suitable for a particular purpose or within the scope of a predetermined standard value.

When the solid member does not meet the requirement for the standard value, surface machining conditions (in the case of cutting, for instance, the feed rate and the speed of rotation of the cutting tool, and the replacement of the cutting tool) are immediately changed so as to produce a solid member that meets the requirement for the standard value, whereby appropriate surface machining can be carried out without producing inferior goods.

In many cases, such surface machining is often carried out at an initial stage in the course of the production process including many steps. Therefore if the evaluation of the solid surface is improper, and some defects are caused by improper surface machining, and found in the products at a final stage of the production by final checking of the products, it is likely that most of such products are inferior and cannot be used.

According to the present invention, the evaluation of the solid surface in the surface machining process can be properly carried out, and in case the evaluation indicates that the solid surface is improper, the conditions for the surface machining are immediately changed to proper conditions, without continuing the production, so that the surface machining can always be carried out effectively under appropriate conditions.

As the standard value for the power spectrum, a value is determined by modifying the shape of the power spectrum or the power spectrum itself, with the above-mentioned conditions being taken into consideration that a wave with a particular wavelength is indispensable, or a wave with a particular wavelength must be eliminated, and the wave must have a particular power.

There are many cases where the adhesion characteristics of a solid material to materials such as paint, the friction characteristics of a solid material with other materials, and the optical, electrical, and electrochemical characteristics of a solid material correlate with I(S). In particular, in the photoreceptor incorporated in the image formation apparatus which uses coherent light as the writing light, I(S) of the surface of the support for the photoreceptor conspicuously correlates the state of the formation of the abnormal light and shade striped image.

The value of I(S), which is a threshold value, is appropriately selected in accordance with an image formation process employed in the image formation apparatus and the structure of the photoreceptor incorporated in the image formation apparatus. Usually, however, when the value of I(S) represented by the following formula is $12.0\times10^{-3}$ or more, the light and shade striped image is not practically formed:

$$I(S) = \frac{1}{N}\sum_{n=0}^{N-1} S\left(\frac{n}{N\cdot\Delta t}\right)$$

It is necessary that the measurement range N·Δt in the horizontal direction of the profile be set so as to have an appropriate length for transformation of a sufficient number of waves in order to minimize the measurement error, since if the measurement range N·Δt is not long enough, the number of waves to be transformed is so small that the measurement error is increased. Furthermore, unless Δt is sufficiently smaller than the wavelength of the wave to be judged, the error with respect to the power of the wave to be judged tends to become large.

In many cases, Δt is in the range of 0.01 μm to 50.00 μm, preferably in the range of 0.05 μm to 40.00 μm, more preferably in the range of 0.10 μm to 30.00 μm.

When Δt is less than 0.01 μm, an extremely large number of samplings are required in order to sufficiently increase the measurement range N·Δt for the measurement, causing a severe burden on the calculation, so that resultantly, the measurement range T will have to be decreased, and accordingly the error tends to be increased.

On the other hand, when Δt is more than 50.00 μm, the waves with short wavelengths which are concerned with the various characteristics of the solid surface cannot be picked up, so that it becomes to difficult to make an appropriate judgement of the solid surface.

As to the number of samplings, unless the burden on the calculation is taken into consideration, the greater, the better. Practically, the number of samplings is 2048 or more, preferably 4096 or more, more preferably 8192 or more, in order to reduce the error.

The inventors of the present invention have confirmed that with respect to the profile of the support for the photoreceptor, the power spectrum thereof sufficiently converges when the number of samplings N is 4096 (N=4096), and the sampling interval Δt is 0.31 μm (Δt=0.31 μm;)

Furthermore, I(S) calculated based on the following formula (5) indicates the magnitude of variations of a solid surface and is a new and extremely useful parameter for evaluating and judging the solid surface:

$$I(S) = \frac{1}{N}\sum_{n=0}^{N-1} S\left(\frac{n}{N\cdot\Delta t}\right) \tag{5}$$

The inventors of the present invention have also confirmed that with respect to the profile of the support for the photoreceptor, the above-mentioned new parameter I(S) sufficiently converges within several percent of error, when the number of samplings N is 4096 (N=4096), and the sampling interval Δt is 0.31 μm (Δt=0.31 μm).

This can be considered from a different angle. When the sampling interval (real space) of the measurement of the surface roughness of a base pipe is Δt [μm], the sampling interval (reciprocal space) of the power spectrum is an Δn=1/(N·Δt) [$\mu m^{-1}$]. This is because the domain of definition of the height x(t) of the profile is the interval of T–N·Δt. This indicates that the original signal x(t) can be reproduced by the Fourier spectrum of the value of the sample with the intervals of Δn (=1/(N·Δt)) in the reciprocal space. The variation period of the profile that can be reproduced here is approximately 2 Δt in accordance with Shannon's sampling theorem.

With respect to the phenomenon now in consideration, a surface roughness with a variation period above the above-mentioned variation period is involved, so that the sampling interval of Δt(=0.31 [μm]) is sufficient. When the phenomenon differs, it may be necessary to consider a more minute variation period. In such a case, the sampling interval is shortened in accordance with the variation period.

The evaluation and judgement using I(S) has been conducted here with respect to the waves with all the wavelengths which constitute the profile. However, when it is known that waves with wavelengths in a particular region correlates the characteristics, the evaluation and judgement may be carried out by limiting the integration range of the power spectrum to the region of the necessary wavelengths.

More specifically, when attention is paid to the waves with a wavelength of N·Δt/b–N·Δt/a μm, in which a and b are an integer of N or less, and a≦b, I'(S) calculated based on the following formula (6) can be used as a parameter for evaluating and judging the solid surface:

$$I'(S) = \frac{1}{N}\sum_{n=a}^{b} S\left(\frac{n}{N\cdot\Delta t}\right) \tag{6}$$

As the support for the photoreceptor of the present invention, there can be employed, for example, (1) a drum or a belt made of a metal such as copper, aluminum, gold, platinum, iron, palladium, or an alloy comprising any of such metals, and (2) a belt composed of, for example, a plastic film on which any of the above-mentioned metals, or a metal oxide such as tin oxide or indium oxide, is deposited, for example, by vacuum deposition or electroless plating.

It is preferable that the surface of the support be subjected to surface processing by overlaying the undercoat layer, forming an anodic oxidation film, machining, blasting, or honing, in order to improve the bonding between the photosensitive layer and the support.

Furthermore, in order to control the formation of the abnormal images such as the light and shade striped image and the streaked image, it is preferable that the surface of the support be roughened so as to have the profile as mentioned above by controlling the composition of the support or the conditions for preparing the support, or by use of other methods such as physical and electrochemical methods.

Of these methods, the physical methods such as machining, blasting, and honing have a high roughening effect and are preferable. Machining is particularly effect and most preferable for use in the present invention.

The profile of the surface of the support in the above-mentioned state can be obtained by controlling the shape of the top edge of the cutting tool or controlling the feeding speed of the cutting tool, or by use of a plurality of cutting tools.

It is also effective to roughen the surface of the support by other method before or after machining the surface of the support.

Examples of the undercoat layer for the photoreceptor of the present invention are an undercoat layer made of a resin, an undercoat layer composed of a white pigment and a resin as the main components, and a film made of a metal oxide formed by chemically or electrochemically oxidizing an electroconductive surface of the support.

Of the above-mentioned examples, the undercoat layer composed of a white pigment and a resin as the main components is preferable since the profile of the surface of the undercoat layer can be controlled so as to be in the above-mentioned state.

As the white pigment, metal oxides such as titanium oxide, aluminum oxide, zirconium oxide, and zinc oxide can be employed. Of these metal oxides, titanium oxide is most preferable for use in the present invention since it has an excellent charge injection prevention effect by which the injection of electric charges from the electroconductive support can be most effectively prevented.

Examples of the resin for use in the undercoat layer are thermoplastic resins such as polyamide, polyvinyl alcohol, casein and methyl cellulose, hardening resins such as acrylic resin, phenolic resin, melamine resin, alkyd resin, unsaturated polyester resin and epoxy resin, a mixture of these resins.

Examples of the charge generation material for use in the photoreceptor of the present invention are organic pigments and dyes, such as monoazo pigment, bisazo pigment, trisazo pigment, tetrakisazo pigment, triarylmethane dye, thiazine dye, oxazine dye, xanthene dye, cyanine dye, styryl dye, pyrylium dye, quinacridone pigment, indigo pigment, perylene pigment, polycyclic quinone pigment, bisbenzimidazole pigment, indanthrone pigment, squarylium pigment, and phthalocyanine pigment; and inorganic materials such as selenium, selenium-arsenic, selenium-tellurium, cadmium sulfide, zinc oxide, titanium oxide and amorphous silicon.

The charge generation layer can be formed of one or more charge generation materials mentioned above in combination with a binder resin.

Examples of the charge transport material for use in the photoreceptor of the present invention are an anthracene derivative, a pyrene derivative, a carbazole derivative, a tetrazole derivative, a metallocene derivative, a phenothiazine derivative, a pyrazoline compound, a hydrazone compound, a styryl compound, a styryl hydrazone compound, an enamine compound, a butadiene compound, a distyryl compound, an oxazole compound, an oxadiazole compound, a thiazole compound, an imidazole compound, triphenylamine derivative, a phenylenediamine derivative, an aminostilbene derivative and a triphenylmethane derivative. One or more The charge transport layer can be formed of one or more charge transport materials mentioned above in combination with a binder resin.

It is required that the binder resin for use in the charge generation layer and the charge transport layer be electrically insulating.

As the binder resin, conventionally known thermoplastic resin, thermosetting resin, photo-setting resin, and photoconductive resin can be employed.

More specifically, there can be employed thermoplastic resins such as polyvinyl chloride, polyvinylidene chloride, vinyl chloride-vinyl acetate copolymer, vinyl chloride-vinyl acetate-maleic anhydride copolymer, ethylene-vinyl acetate copolymer, polyvinyl butyral, polyvinyl acetal, polyester, phenoxy resin, (meth)acrylic resin, polystyrene, polycarbonate, polyarylate, polysulfone, polyether sulfone and ABS resin; thermosetting resins such as phenolic resin, epoxy resin, urethane resin, melamine resin, isocyanate resin, alkyd resin, silicone resin and thermosetting acrylic resin: and photoconductive resins such as polyvinyl carbazole, polyvinyl anthrasene and polyvinyl pyrene.

These resins can be employed alone or in combination, although the binder resin for use in the present invention is not limited to the above-mentioned examples.

The photoreceptor of the present invention, when incorporated in image formation apparatus such as copying machines, printers, and facsimile apparatus and used for image formation, is capable of forming images with extreme high quality.

The image formation apparatus of the present invention, in which the above-mentioned photoreceptor is incorporated, is capable of forming high quality images using as the writing light either incoherent light or coherent light. However, when coherent light is used as the writing light, abnormal images such as the light and shade striped image are not formed, so that by use of coherent light, image formation with high image quality, with high resolution and high precision can be carried out.

The image formation apparatus in which the photoreceptor of the present invention is incorporated is capable of forming high quality images with any spot diameter of the writing light, and the spot diameter can be appropriately selected in accordance with the desired image resolution. The spot diameter is preferably 80 $\mu$m or less, more preferably 70 $\mu$m or less, furthermore preferably 60 $\mu$m or less.

An image formation apparatus in which a conventional photoreceptor is incorporated, with the spot diameter of the writing light set at 80 $\mu$m or less, is capable of forming images with high resolution. However, in the image formation, information peculiar to the photoreceptor is apt to be superimposed on the writing image, so that in such a conventional image formation apparatus, abnormal images such as the light and shade striped image are extremely apt to be formed. In sharp contrast to this, in the image formation apparatus of the present invention, such abnormal images are not practically formed.

There is no restriction on the wavelength of the writing light, but it is preferable that the wavelength be 700 nm or less, more preferably 675 nm or less, furthermore preferably 400 nm to 600 nm. Even when there is used the write light with such a short wavelength that makes it possible to form the writing image with high resolution, the image formation apparatus of the present invention can form high quality images with high resolution and high precision, without forming the abnormal images such as the light and shade striped image and the streaked image.

There is no particular restriction on the gradation reproduction method for forming the writing image for use in the image formation apparatus of the present invention.

When a multivalued gradation reproduction method is employed, the density of picture element is set at multiple steps, so that in the case of the image formation apparatus using a conventional photoreceptor, the light and shade striped image is apt to become conspicuous. In particular, this tendency is increased extremely high, particularly when pulse width modulation or power modulation is employed, and when pulse width modulation and power modulation are employed in combination. However, in the case of the image formation apparatus using the photoreceptor of the present invention, no light and shade image is formed even when the multivalued gradation reproduction method is employed.

There is no restriction on the resolution of the writing image for the image formation apparatus. The image formation apparatus is capable of forming high quality images at a resolution as high as 600 dpi or more, even at 1000 dip or more. In the writing image at such a high resolution, image formation is apt to be carried out with the information peculiar to the photoreceptor being superimposed on the writing image, so that in the case of the image formation apparatus in which a conventional photoreceptor is used, abnormal images including the light and shade striped image are extremely apt to formed. However, in the case of the image formation apparatus using the photoreceptor of the present invention, such abnormal images are not practically formed.

Other features of this invention will become apparent in the course of the following description of exemplary embodiments, which are given for illustration of the invention and are not intended to be limiting thereof.

EXAMPLE 1

Four aluminum drums with a diameter of 90 mm, a length of 352 m, and a wall thickness of 2 mm were prepared by machining the surface of the aluminum drums, using a diamond cutting tool.

Figure 6:
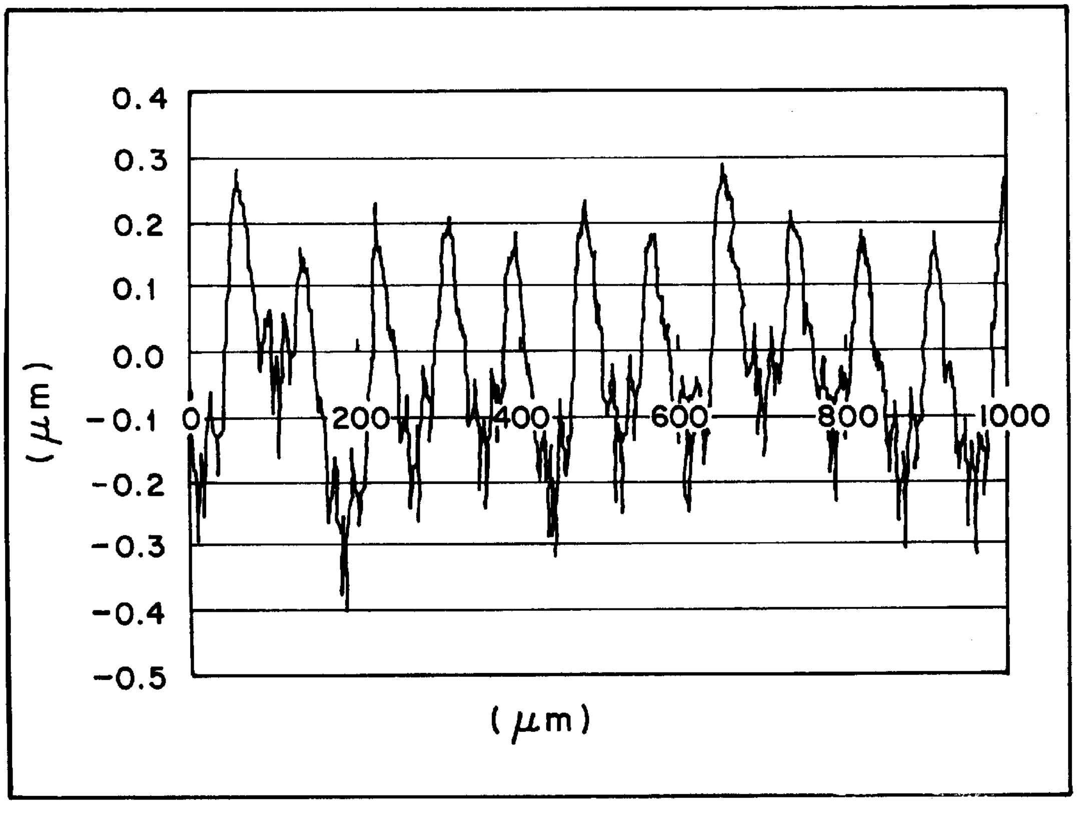
FIG. 6 shows a profile of the outer surface of the aluminum drum used in Example 1.
Figure 7:
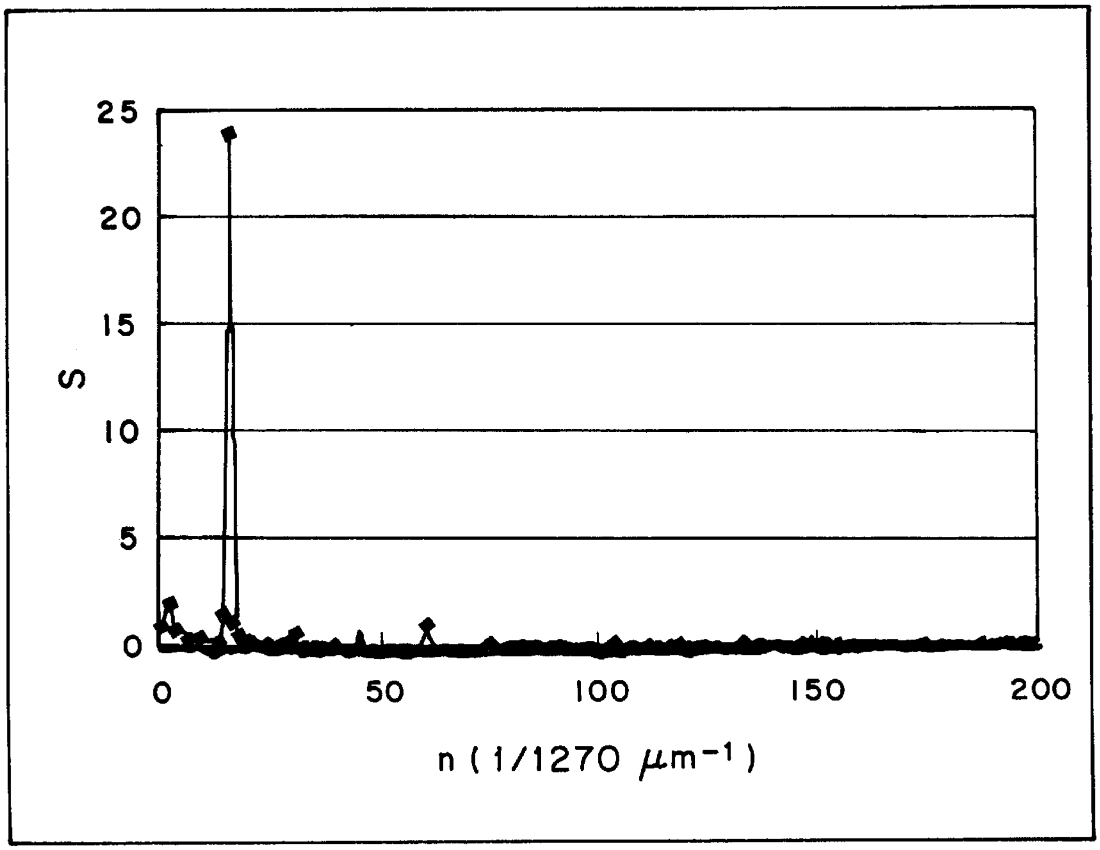
FIG. 7 is a power spectrum of the outer surface of the aluminum drum used in Example 1.

The profile of the surface of the third machined aluminum drums was measured by use of a surface roughness meter (Surfcom 1400A). As a result, a profile as shown in FIG. 6 was obtained, From this profile, sampling was conducted with $\Delta t=0.31$ $\mu m$. and N=4096, and the thus obtained samples were subjected to discrete Fourier transformation, whereby a power spectrum as shown in FIG, 7 was prepared. I(S) was then calculated. The result was that I(S) was $21.8\times10^{-3}$.

Formation of Undercoat Layer

A coating liquid for the formation of an undercoat layer was prepared as follows:

| | Parts by weight |
|---|---|
| Acrylic resin (Trademark "ACRYDIC A-460-60" made by Dainippon Ink & Chemicals, Incorporated) | 15 |
| Melamine resin (Trademark "Super Beckamine L-121-60" made by Dainippon Ink & Chemicals, Incorporated) | 10 |

The above components were dissolved in 80 parts by weight of methyl ethyl ketone. To this solution were added 90 parts by weight of titanium oxide powder (Trademark "TM-1" made by Fuji Titanium Industry Co., Ltd.). This mixture was then dispersed in a ball mill for 12 hours, whereby the coating liquid for the formation of an undercoat layer was prepared.

The surface-roughened aluminum drum was immersed in the above prepared coating liquid and then pulled up vertically at a predetermined constant speed, whereby the coating liquid was coated on the surface of the aluminum drum.

With the posture of the aluminum drum maintained, the aluminum drum was transported into a drying chamber, where the aluminum drum was dried at 140° C. for 20 minutes, whereby an undercoat layer with a thickness of 3.5 $\mu m$ was formed on the aluminum drum.

Figure 8:
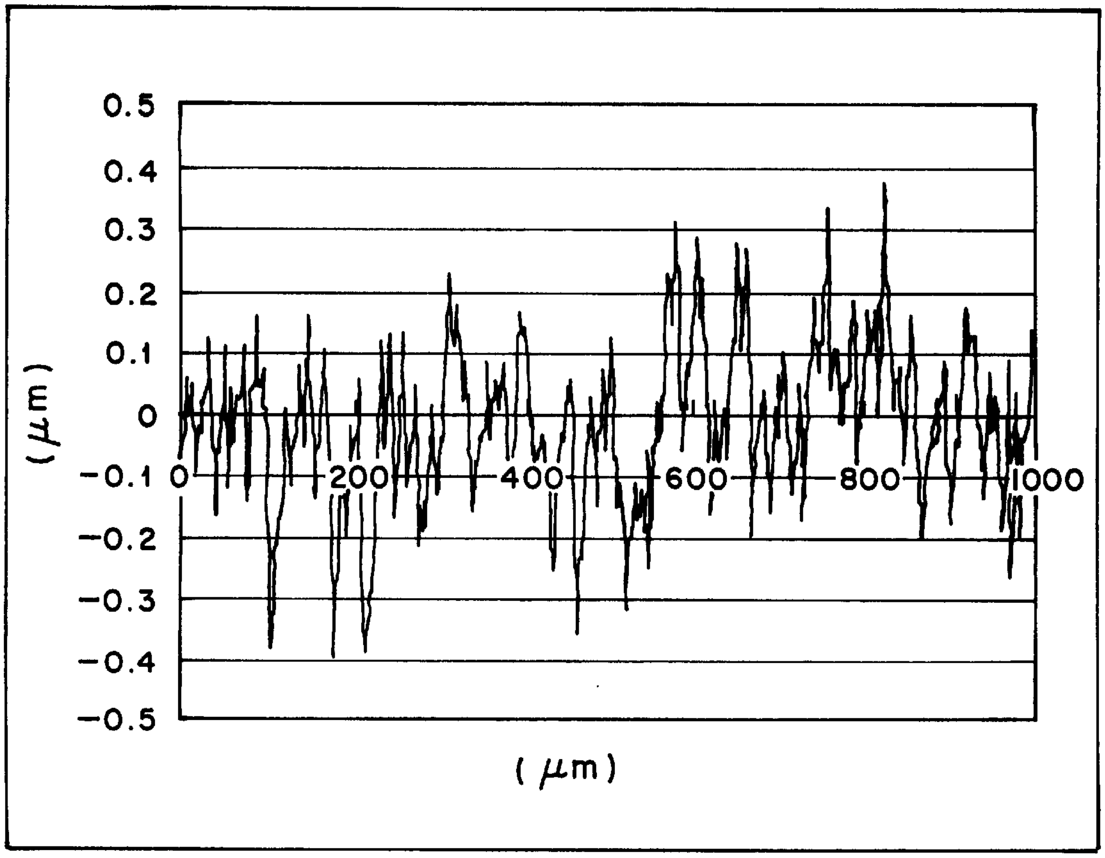
FIG. 8 is a profile of the surface of the undercoat layer of the photoreceptor in Example 1.

The surface of the undercoat layer was measured by use of the surface roughness meter (Surfcom 1400A). As a result, a profile as shown in FIG. 8 was obtained.

Figure 9:
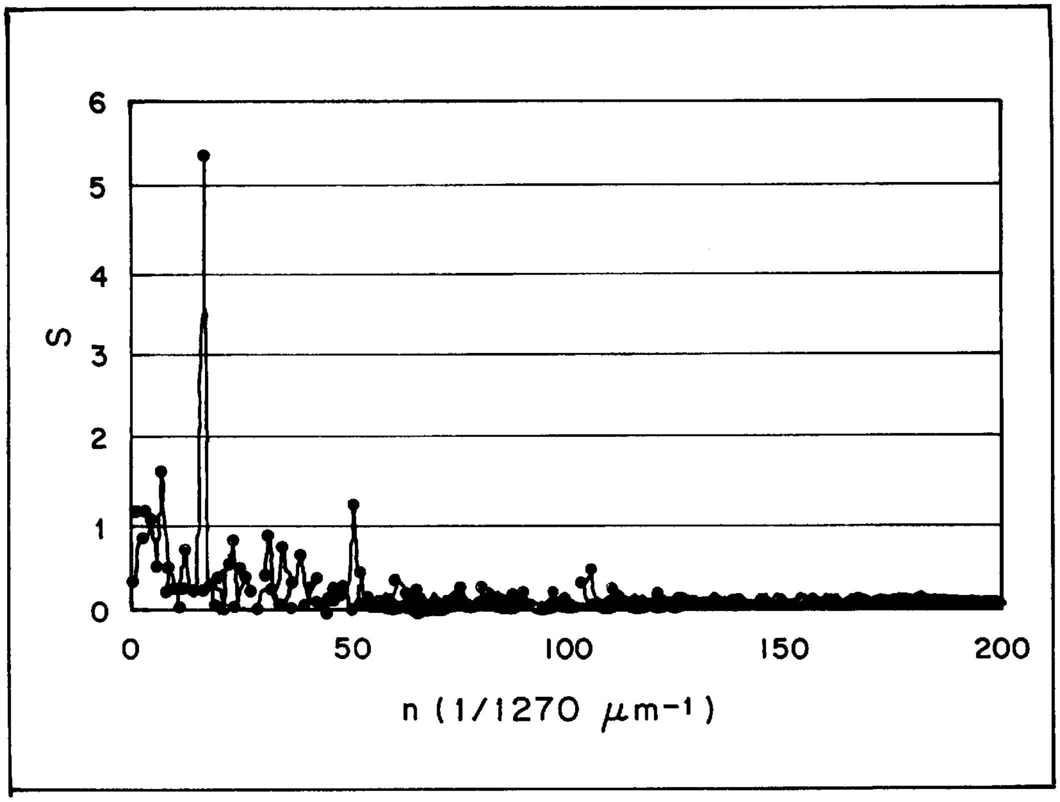
FIG. 9 is a power spectrum of the surface of the undercoat layer of the photoreceptor in Example 1.

From this profile, sampling was conducted with $\Delta t=0.31$ $\mu m$, and N=4096, and the thus obtained samples were subjected to discrete Fourier transformation, whereby a power spectrum as shown in FIG. 9 was prepared. I(S) was then calculated. The result was that I(S) was $17.4\times10^{-3}$.

Formation of Charge Generation Layer 15 parts by weight of butyral resin (Trademark "S-Lec BLS" made by Sekisui Chemical Co., Ltd.) were dissolved in 150 parts by weight of cyclohexanone. To this solution, 10 parts by weight of a trisazo pigment with the following formula were added, and the mixture was dispersed for 48 hours:

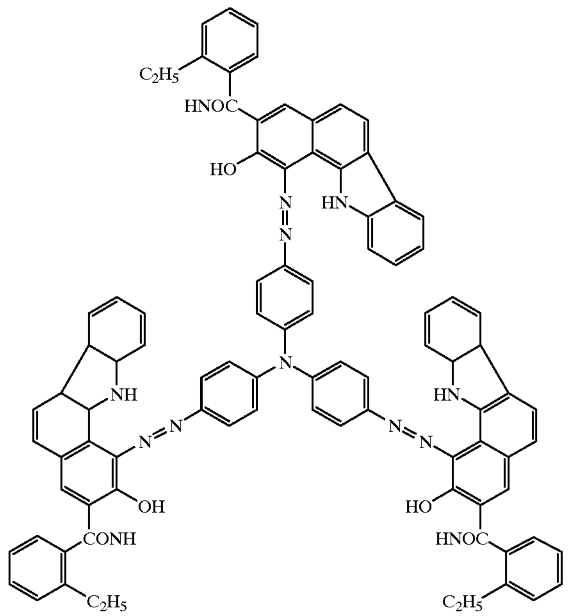

To the above dispersion, 210 parts by weight of cyclohexanone were further added, and the mixture was dispersed for 3 hours. The dispersion was then diluted with cyclohexanone, with stirring, in such a manner that the amount ratio of the solid components in the dispersion was 1.5 wt. %, whereby a coating liquid for the formation of a charge generation layer was prepared.

The aluminum drum with the undercoat layer was immersed in the above prepared coating liquid for the formation of a charge generation layer and then pulled up vertically at a predetermined constant speed, whereby the coating liquid was coated on the surface of the undercoat layer of the aluminum drum.

The coating liquid coated aluminum drum was dried in the same manner as for the undercoat layer at 120° C. for 20 minutes, whereby a charge generation layer with a thickness of about 0.2 μm was formed on the undercoat layer of the aluminum drum.

Formation of Charge Transport Layer

A coating liquid for the formation of a charge transport layer was prepared by dissolving the following components in 90 parts by weight of methylene chloride:

| | Parts by weight |
|---|---|
| Charge transport material with the following formula: 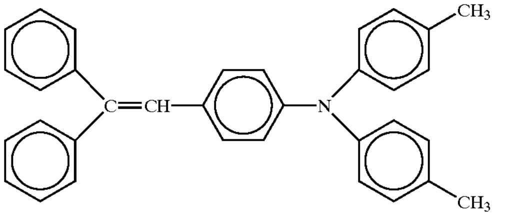 | 6 |

-continued

| | Parts by weight |
|---|---|
| Polycarbonate resin (Trademark "Panlite K-1300" made by Teijin Limited) | 10 |
| Silicone oil (Trademark "KF-50" made by Shin-Etsu Chemical Co., Ltd.) | 0.002 |

The aluminum drum with the undercoat layer and the charge generation layer was immersed in the above prepared coating liquid for the formation of a charge transport layer and then pulled up vertically at a predetermined constant speed, whereby the coating liquid was coated on the surface of the charge generation layer of the aluminum drum.

The coating liquid coated aluminum drum was dried in the same manner as for the undercoat layer at 120° C. for 20 minutes, whereby a charge transport layer with a thickness of about 23 μm was formed on the charge generation layer of the aluminum drum. Thus, a photoreceptor of the present invention was prepared.

The thus prepared photoreceptor was incorporated in a commercially available copying machine (Trademark "Imagio Color 2800" made by Ricoh Company, Ltd.) capable of writing with writing light with a wavelength of 780 nm, with writing image with a resolution of 400 dpi, and with 256 gradations in combination of pulse width modulation and power modulation.

By use of this copying machine, a monochrome halftone image which was uniform in its entirety was copied and output. As a result, a uniform image free of abnormal images such as the light and shade striped image was obtained.

Furthermore, a full-color landscape photograph was also copied by use of this copying machine. As a result, a high quality image was obtained.

EXAMPLE 2

The procedure of preparing the photoreceptor of the present invention in Example 1 was repeated in the same manner as in Example 1 except that the thickness of the undercoat layer was changed to 7.0 μm, whereby a photoreceptor of the present invention was prepared.

Figure 10:
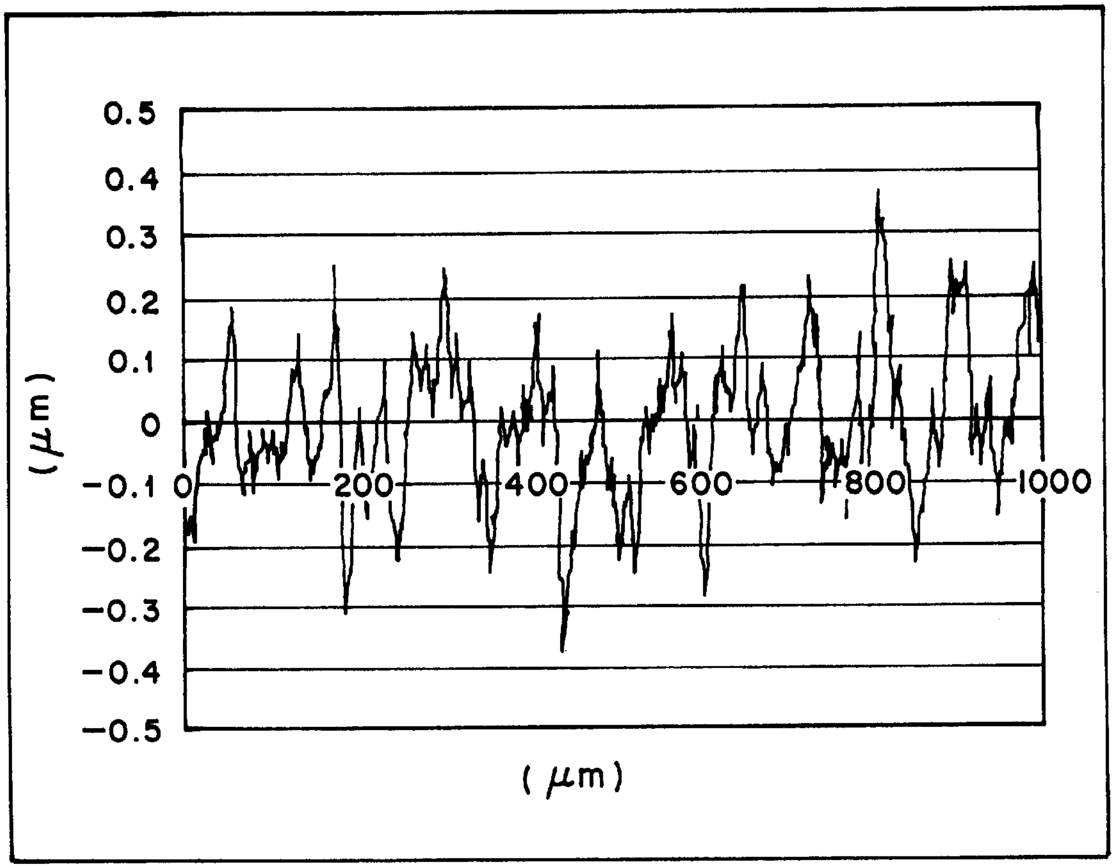
FIG. 10 is a profile of the surface of the undercoat layer of the photoreceptor in Example 2.
Figure 11:
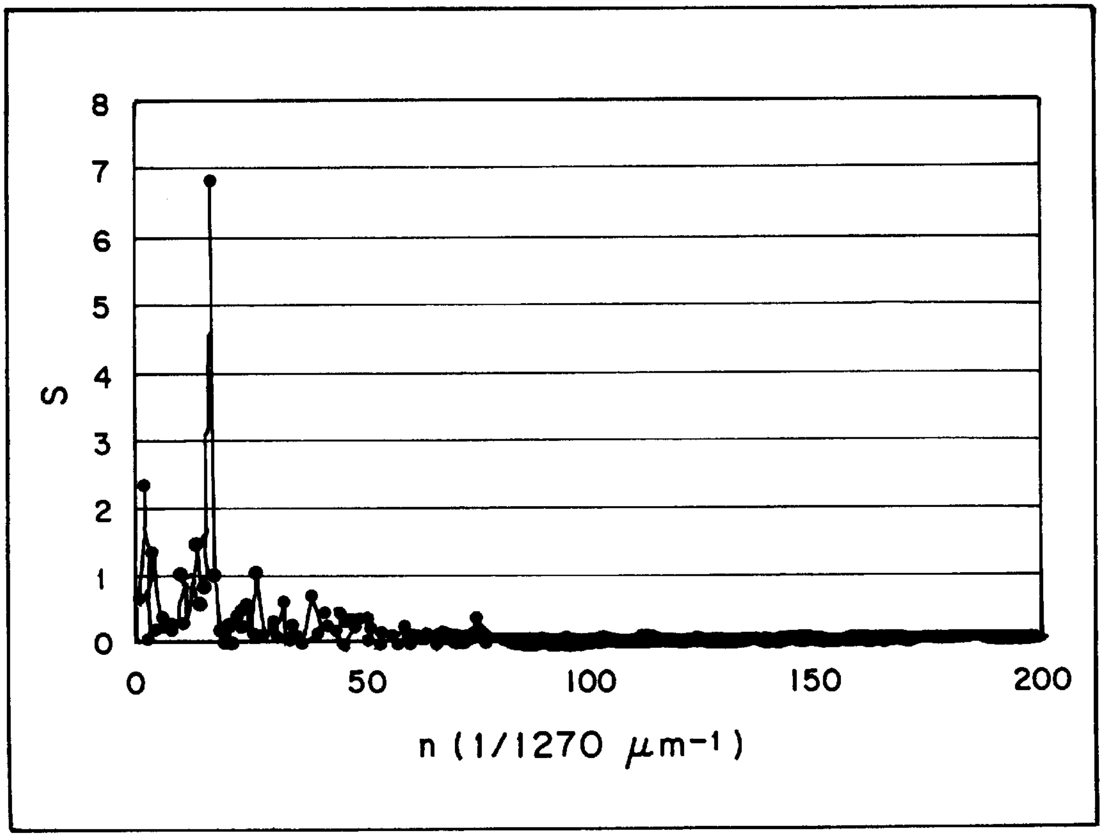
FIG. 11 is a power spectrum of the surface of the undercoat layer of the photoreceptor in Example 2.

A profile of the surface of the undercoat layer as shown in FIG. 10 was obtained in the same manner as in Example 1. From the profile, a graph of a power spectrum of the surface of the undercoat layer was prepared as shown in FIG. 11, and I(S) was calculated. The result was that I(S) was $15.4\times10^{-3}$.

By use of the copying machine, a monochrome halftone image which was uniform in its entirety was copied and output. As a result, a uniform image free of abnormal images such as the light and shade striped image was obtained.

Furthermore, a full-color landscape photograph was also copied by use of this copying machine. As a result, a high quality image was obtained.

Comparative Example 1

500 aluminum drums were machined by use of the same cutting tool as used in Example 1, and a photoreceptor was prepared by use of the 500th machined aluminum drum in the same manner as in Example 1.

Figure 12:
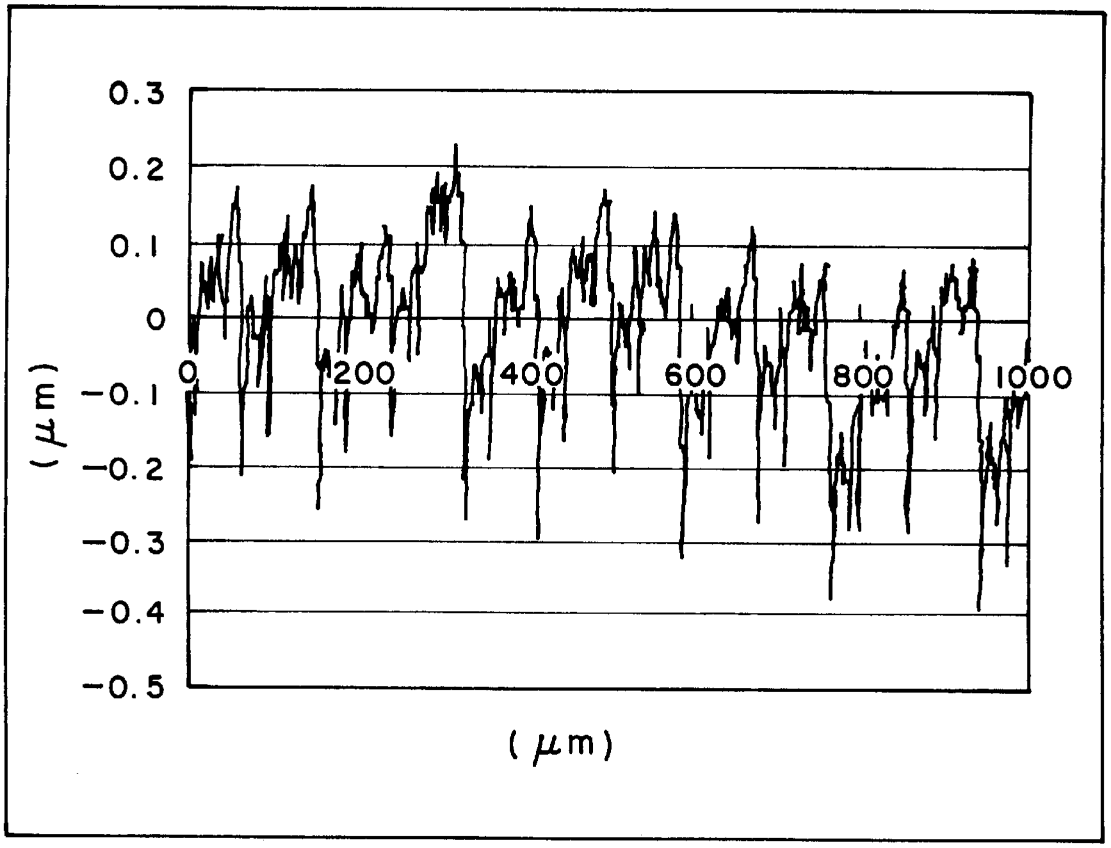
FIG. 12 is a profile of the outer surface of the aluminum drum in Comparative Example 1.
Figure 13:
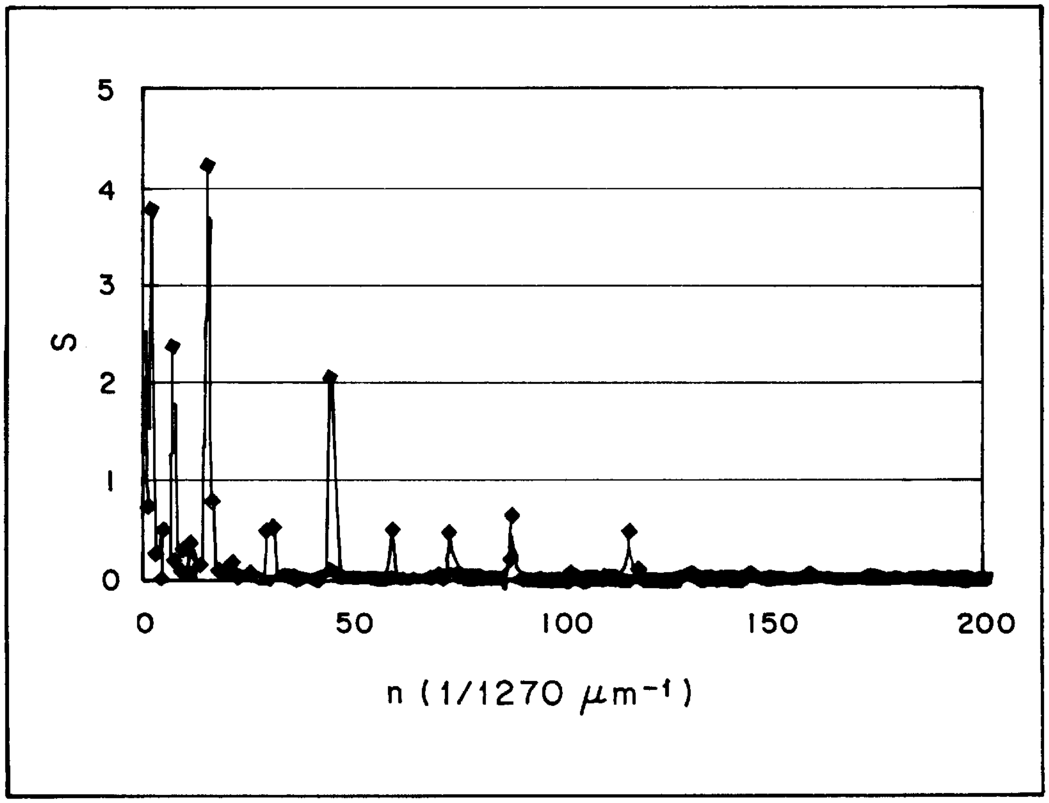
FIG. 13 is a power spectrum of the outer surface of the aluminum drum in Comparative Example 1.

A profile of the outer surface of the aluminum drum as shown in FIG. 12 was obtained in the same manner as in Example 1. From the profile, a graph of a power spectrum of the surface of the aluminum drum was prepared as shown in FIG. 13, and I(S) was calculated. The result was that I(S) was $11.1\times10^{-3}$.

A profile of the surface of the undercoat layer as was also obtained in the same manner as in Example 1. From the profile, a graph of a power spectrum of the surface of the undercoat layer was prepared, and I(S) was calculated. The result was that I(S) was $5.6\times10^{-3}$.

By use of the copying machine with the photoreceptor incorporated therein, a monochrome halftone image which was uniform in its entirety was copied and output. As a result, an image with non-uniform light and shade portions near the edge portion of the image was obtained.

Furthermore, a full-color landscape photograph was also copied by use of this copying machine. A close inspection of the obtained image indicated that the image included slightly non-uniform light and shade portions near the edge portion of the image.

EXAMPLE 3

The procedure of the image formation in Example 1 was repeated in the same manner as in Example 1 except that the copying machine employed in Example 1 was modified so as to be capable of writing with writing image with a resolution of 1200 dpi.

As a result, when a monochrome halftone image which was uniform in its entirety was copied and output by use of the modified copying machine, a uniform image free of abnormal images such as the light and shade striped image was obtained, and when a full-color landscape photograph was also copied by use of the copying machine, a high quality image was obtained.

Comparative Example 2

The procedure of the image formation in Example 3 was repeated in the same manner as in Example 3 except that the photoreceptor employed in Example 3 was replaced by the photoreceptor prepared in Comparative Example 1.

As a result, when a monochrome halftone image which was uniform in its entirety was copied and output by use of the modified copying machine using the photoreceptor, an image with 4 sets of light and shade stripes in a band shape near the edge portion of the image was obtained.

Furthermore, light and shade stripes with a period corresponding to the photoreceptor, with a light-grained pattern, were also recognized in the image. When a full-color landscape photograph was also copied by use of the copying machine, an image including band-shaped abnormal images near the edge portion of the image was obtained. In the obtained color image, the portion in a position which almost corresponded in terms of the height to the portion of the light and shade stripes recognized when the monochrome half tone image was copied partially included a slightly unnatural color tone portion.

The profile of the aluminum drum of the photoreceptor employed in both Comparative Examples 1 and 2 was in such a shape that the sub-peaks were superimposed on the main peaks. However, it was impossible to prevent the formation of the abnormal light and shade striped image by such profile of the aluminum drum.

The above results clearly indicates that in order to prevent the formation of the abnormal light and shade striped image, it is extremely important to set the value of I(S) of the profile at an appropriate value.

EXAMPLE 4

The procedure of preparing the photoreceptor of the present invention in Example 1 was repeated in the same manner as in Example 1 except that the thickness of the charge transport layer was changed to 14.5 μm, whereby a photoreceptor of the present invention was prepared.

The procedure of the image formation in Example 3 was repeated in the same manner as in Example 3 except that the photoreceptor employed in the modified copying machine was replaced by the above photoreceptor of the present invention.

As a result, when a monochrome halftone image which was uniform in its entirety was copied and output by use of the modified copying machine using the photoreceptor No. 3 of the present invention, a uniform image free of abnormal images such as the light and shade striped image was obtained, and when a full-color landscape photograph was also copied by use of the copying machine, a high quality image was obtained.

Comparative Example 3

The procedure of preparing the photoreceptor in Comparative Example 1 was repeated in the same manner as in Comparative Example 1 except that the thickness of the charge transport layer was changed to 14.5 μm, whereby a photoreceptor was prepared.

The procedure of the image formation in Comparative Example 2 was repeated in the same manner as in Comparative Example 2 except that the photoreceptor employed in Comparative Example 2 was replaced by the above prepared photoreceptor.

As a result, when a monochrome halftone image which was uniform in its entirety was copied and output by use of the modified copying machine using the photoreceptor, an image with 5 sets of light and shade stripes in a band shape near the edge portion of the image was obtained. Furthermore, light and shade stripes with a period corresponding to the photoreceptor, with a light-grained pattern were also recognized in the image. When a full-color landscape photograph was also copied by use of the copying machine, an image including band-shaped abnormal images near the edge portion of the image was obtained. In the obtained color image, the portion in a position which almost corresponded in terms of the height to the portion of the light and shade stripes recognized when the monochrome half tone image was copied partially included a slightly unnatural color tone portion.

EXAMPLES 5 to 10 and Comparative Examples 4 and 5

500 aluminum drums with the same size as that of the aluminum drums employed in Example 1 were prepared by use of a brand-new diamond cutting tool which of the same type as that of the cutting tool employed in Example 1.

Of these drums, 8 drums were subjected to random sampling, and the profile of the outer surface of each of the sampled drums was measured in the same manner as in Example 1 and the values of the respective I(S) were determined.

By use of the sampled drums, 8 photoreceptors were prepared in the same manner as in Example 1.

By incorporating each of the thus prepared photoreceptors in the modified copying machine employed in Example 3, a monochrome halftone image which was uniform in its entirety was copied and output, so that the output images were evaluated with respect to the presence of the abnormal light and shade striped image, with the following evaluation ranking scale:

4: free of the abnormal image

3: the abnormal image can be recognized only by close inspection

2: the abnormal image can be slightly recognized

1: the abnormal image can be conspicuously recognized

The results were as shown in TABLE 1:

TABLE 1

| | I(S) | Evaluated Rank |
|---|---|---|
| Example 5 | $41.0 \times 10^{-3}$ | 4 |
| Example 6 | $25.3 \times 10^{-3}$ | 4 |
| Example 7 | $23.4 \times 10^{-3}$ | 4 |
| Example 8 | $16.8 \times 10^{-3}$ | 4 |
| Example 9 | $14.6 \times 10^{-3}$ | 3 |
| Example 10 | $13.0 \times 10^{-3}$ | 3 |
| Comp. Example 4 | $10.9 \times 10^{-3}$ | 2 |
| Comp. Example 5 | $6.8 \times 10^{-3}$ | 1 |

EXAMPLE 11

An aluminum drum with a diameter of 90 mm, a length of 352 mm, and a wall thickness of 2 mm, which was not subjected to surface machining, was coated with the same coating liquid for the formation of an undercoat layer as that employed in Example 1 by spray coating, using a pray gun.

The aluminum drum was transported into a drying chamber, where the aluminum drum was dried at 140° C. for 20 minutes. Thus, an undercoat layer with a thickness of 4.0 μm was formed on the aluminum drum.

The profile of the undercoat layer was measured by use of the surface roughness meter (Surfcom 1400A).

From the profile, sampling was conducted with Δt=2500/4096 μm, and N=4096, so that I(S) and Ten-point Mean Roughness (Rz) thereof were determined. The results are shown in TABLE 2.

By use of the above aluminum drum with the undercoat layer, a photoreceptor of the present invention was prepared in the same manner as in Example 1.

By incorporating the above photoreceptor in the copying machine employed in Example 1, a monochrome halftone image which was uniform in its entirety was copied and output. The output image was uniform and free of the abnormal light and shade striped image.

EXAMPLES 12 and 13, and Comparative Examples 6 and 7

The procedure of preparing the photoreceptor in Example 11 was repeated in the same manner as in Example 11 except that the outer surface of each of 4 drums was coated with the same coating liquid for the formation of an undercoat layer as that employed in Example 11 by spray coating, using a pray gun, and that the moving speed of the spray gun and the amount of the coating liquid ejected from the spray gun were changed.

Each aluminum drum was transported into a drying chamber, where the aluminum drum was dried at 140° C. for 20 minutes. Thus, an undercoat layer with a thickness of 4.0 μm was formed on the aluminum drum.

The profile of the undercoat layer was measured by use of the surface roughness meter (Surfcom 1400A).

From the profile, sampling was conducted with Δt=2500/4096 μm, and N=4096, so that I(S) and Ten-point Mean Roughness (Rz) thereof were determined. The results are shown in TABLE 2.

By use of the above aluminum drums with the undercoat layer, four photoreceptors were prepared in the same manner as in Example 11.

By incorporating each of the above photoreceptors in the copying machine employed in Example 1, a monochrome halftone image which was uniform in its entirety was copied and output. The output images evaluated. The results are shown in TABLE 2.

TABLE 2

| | Rz | I(S) | Evaluation of Image |
|---|---|---|---|
| Example 11 | 0.42 μm | $13.6 \times 10^{-3}$ | Uniform, no abnormal images |
| Example 12 | 0.38 μm | $10.4 \times 10^{-3}$ | Uniform, no abnormal images |
| Example 13 | 0.38 μm | $7.9 \times 10^{-3}$ | Uniform, no abnormal images |
| Comparative Example 6 | 0.41 μm | $5.2 \times 10^{-3}$ | 3 sets of light and shade streaks in the end portions of images |
| Comparative Example 7 | 0.39 μm | $4.8 \times 10^{-3}$ | 3 sets of light and shade streaks in the end portions of images, and grained light and shade stripes |

The above results indicate that the Ten-point Mean Roughness (Rz) of the undercoat layer has nothing to do with the evaluation of the images, but when I(S) is $6.0\times10^{-3}$ or more, high quality image formation can be carried

EXAMPLE 14

Four aluminum drums with a diameter of 90 mm, a length of 352 mm, and a wall thickness of 2 mm were prepared by machining the surface of the aluminum drums, using a diamond cutting tool.

Figure 14:
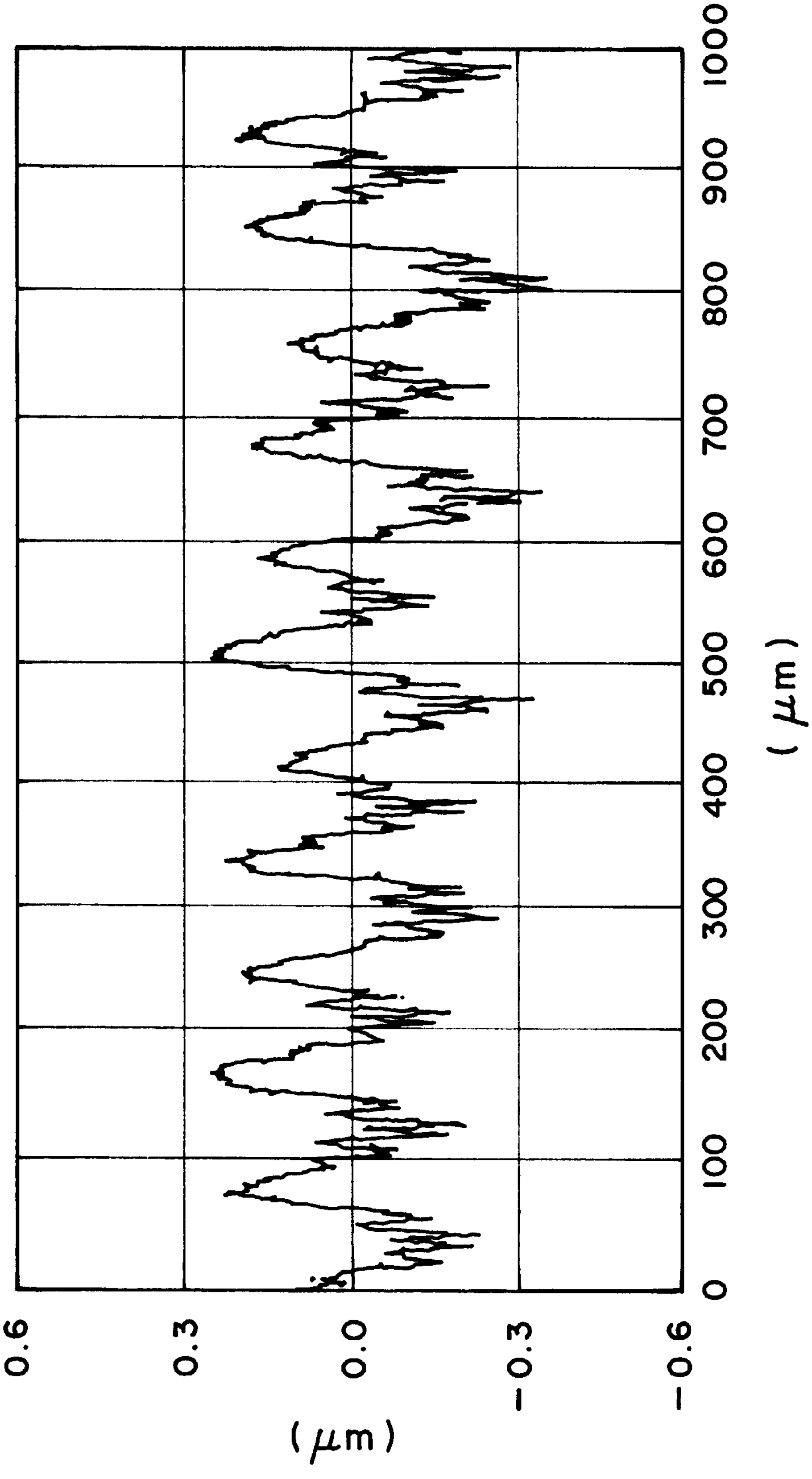
FIG. 14 is a profile of the outer surface of the aluminum drum in Example 14.

The outer surface of each of the aluminum drums was measured by use of a surface roughness meter (Surfcom 1400A). As a result, a profile as shown in FIG. 14 was obtained.

Figure 15:
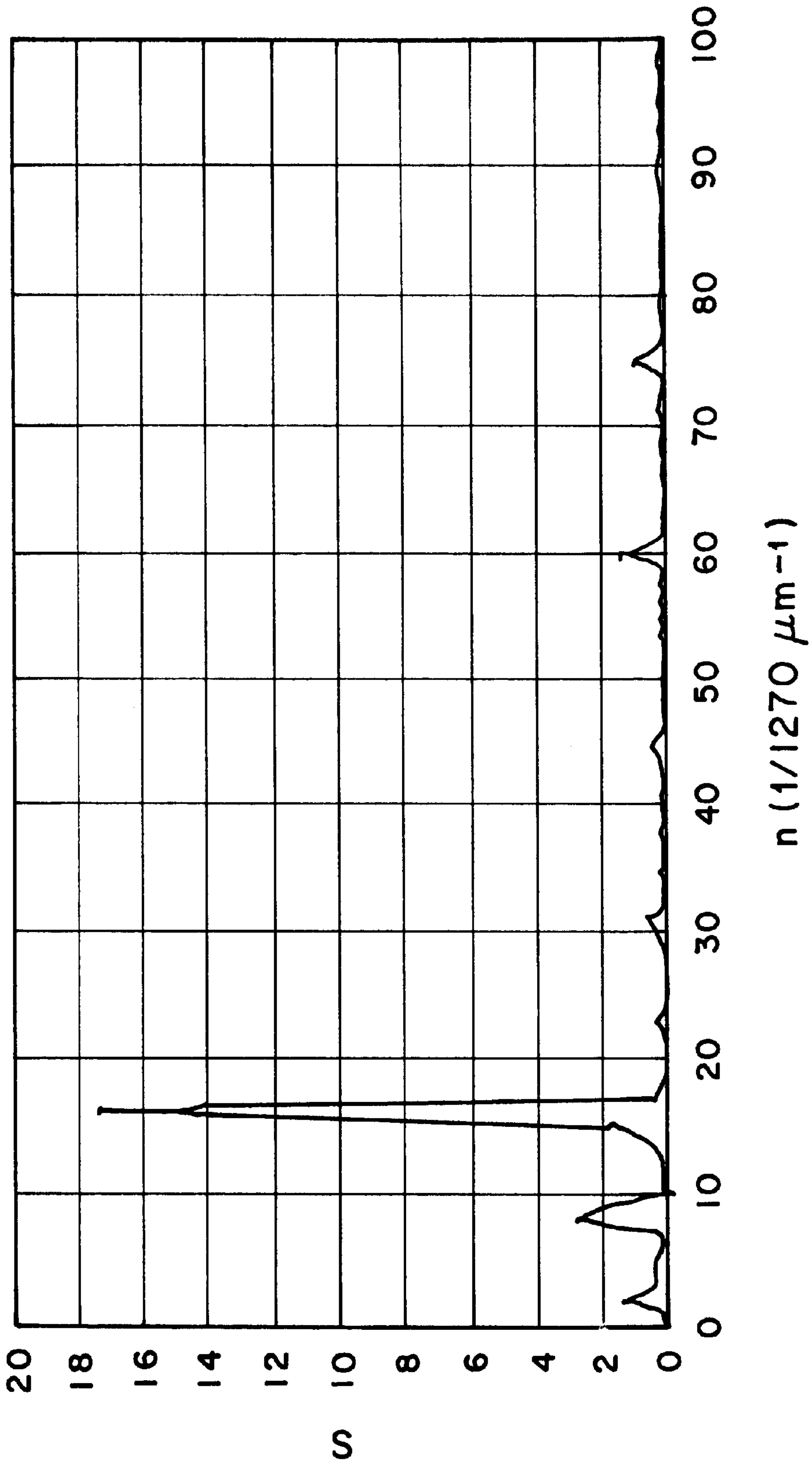
FIG. 15 is a power spectrum of the outer surface of the aluminum drum in Example 14.

From this profile, sampling was conducted with Δt=0.31 μm, and N=4096, and the thus obtained samples were subjected to discrete Fourier transformation, whereby a power spectrum as shown in FIG. 15 was prepared.

When the spot diameter of writing light was 70 μm, a maximum integer "j" that satisfies $4096\times0.31/j \geqq 70/2$ is 36, so that I'(S) was calculated. The result was that I'(S) was $7.3\times10^{-3}$.

Formation of Undercoat Layer

A coating liquid for the formation of an undercoat layer was prepared as follows:

| | Parts by weight |
|---|---|
| Acrylic resin (Trademark "ACRYDIC A-460-60" made | 15 |

-continued

| | Parts by weight |
|---|---|
| by Dainippon Ink & Chemicals, Incorporated) | |
| Melamine resin (Trademark "Super Beckamine L-121-60" made by Dainippon Ink & Chemicals, Incorporated) | 10 |

The above components were dissolved in 80 parts by weight of methyl ethyl ketone. To this solution were added 90 parts by weight of titanium oxide powder (Trademark "TM-1" made by Fuji Titanium Industry Co., Ltd.). This mixture was then dispersed in a ball mill for 12 hours, whereby the coating liquid for the formation of an undercoat layer was prepared.

The surface of the aluminum drum was roughened by machining. The surface-roughened aluminum drum was immersed in the above prepared coating liquid and then pulled up vertically at a predetermined constant speed, whereby the coating liquid was coated on the surface of the aluminum drum.

With the posture of the aluminum drum maintained, the aluminum drum was transported into a drying chamber, where the aluminum drum was dried at 140° C. for 20 minutes, whereby an undercoat layer with a thickness of 3.5 μm was formed on the aluminum drum.

Formation of Charge Generation Layer 15 parts by weight of butyral resin (Trademark "S-Lec BLS" made by Sekisui Chemical Co., Ltd.) were dissolved in 150 parts by weight of cyclohexanone. To this solution, 10 parts by weight of the same trisazo pigment as that employed in Example 1 were added, and the mixture was dispersed for 48 hours.

To the above dispersion, 210 parts by weight of cyclohexanone were further added, and the mixture was dispersed for 10 hours. The dispersion was then diluted with cyclohexanone in such a manner that the amount ratio of the solid components in the dispersion was 1.5 wt. %, whereby a coating liquid for the formation of a charge generation layer was prepared.

The aluminum drum with the undercoat layer was immersed in the above prepared coating liquid and then pulled up vertically at a predetermined constant speed, whereby the coating liquid was coated on the surface of the undercoat layer of the aluminum drum.

The aluminum drum was dried in the same manner as for the undercoat layer at 120° C. for 20 minutes, whereby a charge generation layer with a thickness of about 0.2 μm was formed on the undercoat layer of the aluminum drum.

Formation of Charge Transport Layer

A coating liquid for the formation of a charge transport layer was prepared by dissolving the following components in 10 parts by weight of tetrahydrofuran:

| | Parts by weight |
|---|---|
| Charge transport material with the following formula: | 1 |
| 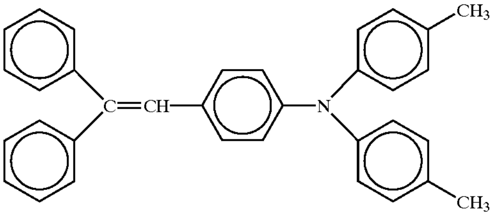 | |
| Bisphenoyl Z-type polycarbonate resin | 1 |
| Silicone oil (Trademark "KF-50" made by Shin-Etsu Chemical Co., Ltd.) | 0.02 |

The aluminum drum with the undercoat layer and the charge generation layer was immersed in the above prepared coating liquid and then pulled up vertically at a predetermined constant speed, whereby the coating liquid was coated on the surface of the charge generation layer of the aluminum drum.

The aluminum drum was dried in the same manner as for the undercoat layer at 120° C. for 20 minutes, whereby a charge transport layer with a thickness of about 23 μm was formed on the charge generation layer of the aluminum drum. Thus, a photoreceptor of the present invention was prepared.

The thus prepared photoreceptor was incorporated in a commercially available copying machine (Trademark "Imagio Color 2800" made by Ricoh Company, Ltd.) capable of writing with writing light with a wavelength of 780 nm and a spot diameter of writing light of 70 μm.

By use of this copying machine, a monochrome halftone image which was uniform in its entirety was copied and output. As a result, a uniform image free of abnormal images such as the light and shade striped image was obtained.

Furthermore, a full-color landscape photograph was also copied by use of this copying machine. As a result, a high quality image was obtained.

EXAMPLE 15

An aluminum drum was prepared in the same manner as in Example 14 except that the diamond cutting tool employed in Example 14 was replaced with a brand-new diamond cutting tool.

The profile of the aluminum drum was measured and I'(S) was calculated with J=36 in the same manner as in Example 14. The result was that I'(S) was $13.9\times10^{-3}$.

By use of this aluminum drum, a photoreceptor of the present invention was prepared in the same manner as in Example 1 except that the thickness of the undercoat layer was changed to 7.0 μm.

The thus prepared photoreceptor was incorporated in a commercially available copying machine (Trademark "Imagio Color 2800" made by Ricoh Company, Ltd.) capable of writing with writing light with a wavelength of 780 nm.

By use of this copying machine, a monochrome halftone image which was uniform in its entirety was copied and output in the same manner as in Example 14. As a result, a uniform image free of abnormal images such as the light and shade striped image was obtained.

Furthermore, the full-color landscape photograph employed in Example 1 was also copied by use of this copying machine. As a result, a high quality image was obtained.

EXAMPLE 16

A photoreceptor of the present invention was prepared in the same manner as in Example 15 except that the thickness of the undercoat layer was changed to 15.8 $\mu$m.

The profile of the aluminum drum for this photoreceptor was measured and I'(S) was calculated with J=36 in the same manner as in Example 15. The result was that I'(S) was $14.0\times10^{-3}$.

The thus prepared photoreceptor was incorporated in the same copying machine as that used in Example 14.

By use of this copying machine, a monochrome halftone image which was uniform in its entirety was copied and output in the same manner as in Example 14. As a result, an image with band-shaped, non-uniform light and shade portions in the edge portion thereof was obtained.

Furthermore, the full-color landscape photograph employed in Example 1 was also copied by use of this copying machine. As a result, a high quality image was obtained.

Comparative Example 8

400 aluminum drums were machined by use of the same cutting tool as that used in Example 14. By use of the aluminum drum, a photoreceptor of the present invention was prepared in the same manner as in Example 14.

Figure 16:
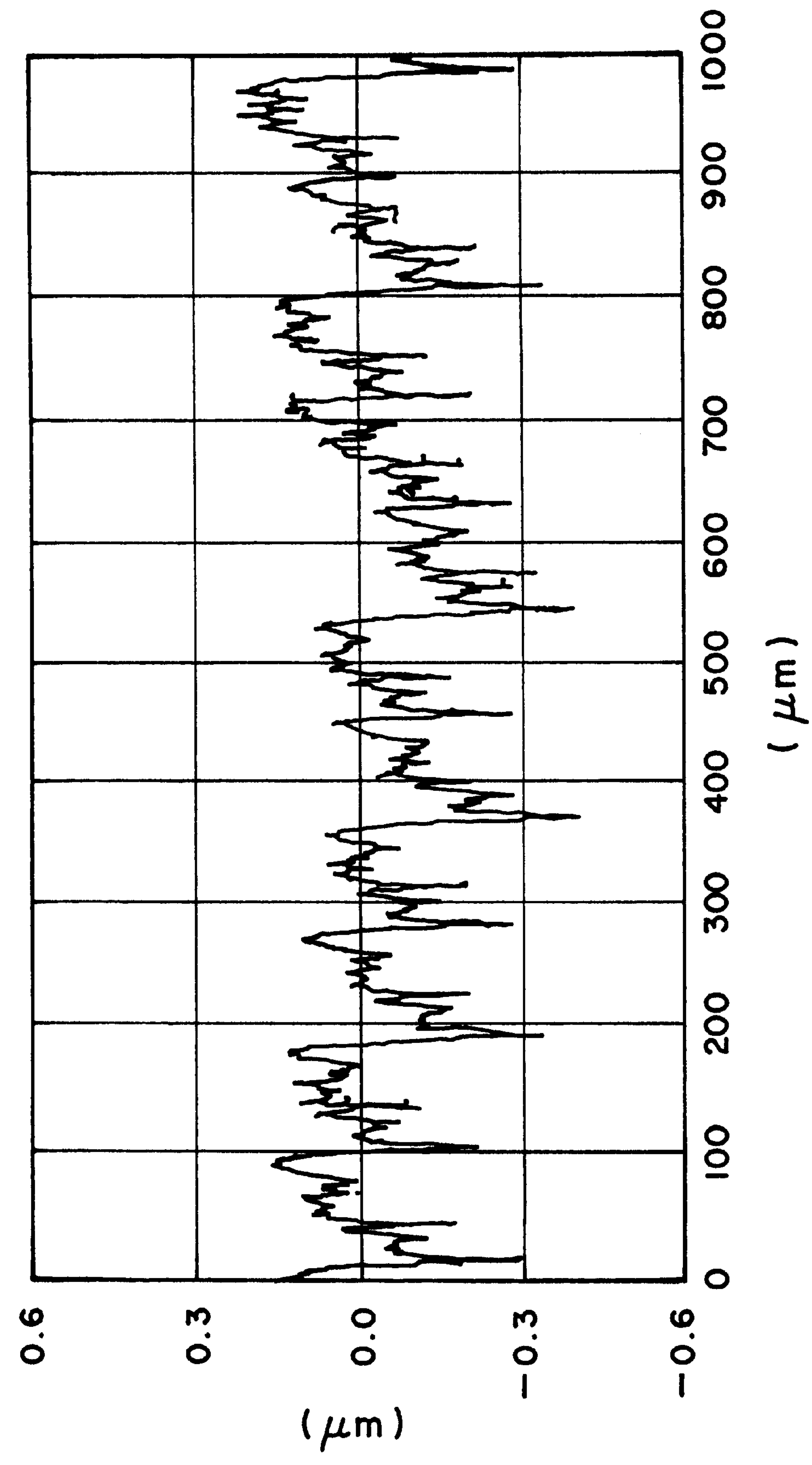
FIG. 16 is a profile of the outer surface of the aluminum drum in Comparative Example 8.

FIG. 16 shows the profile of the aluminum drum of the photoreceptor. As shown in FIG. 16, the profile was in such a shape that the sub-peaks were superimposed on the main peaks.

Figure 17:
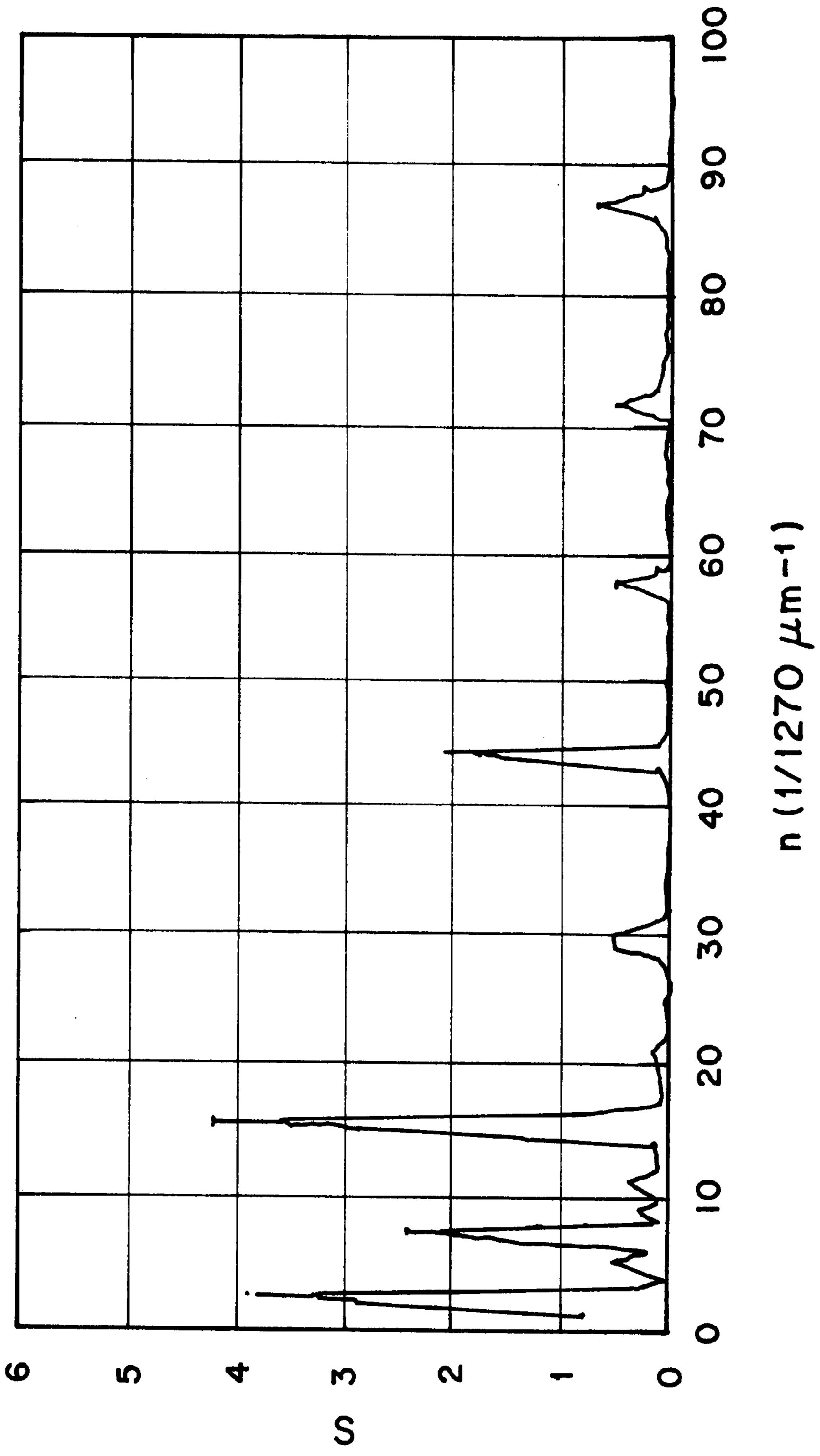
FIG. 17 is a power spectrum of the outer surface of the aluminum drum in Comparative Example 8.

A power spectrum of the profile was prepared as shown in FIG. 17, and I(S) was calculated with J=36. The result was that I(S) was $3.9\times10^{-3}$.

The thus prepared photoreceptor was incorporated in the same copying machine as that used in Example 14.

By use of this copying machine, a monochrome halftone image which was uniform in its entirety was copied and output in the same manner as in Example 14. As a result, an image with conspicuous band-shaped, non-uniform light and shade portions, together with grained light and shade stripes, in the edge portion thereof was obtained.

Furthermore, the full-color landscape photograph employed in Example 1 was also copied by use of this copying machine. As a result, the edge portion of the obtained image appeared unnatural.

EXAMPLE 17

120 aluminum drums were machined by use of the same cutting tool as that used in Example 15. By use of the aluminum drum, a photoreceptor of the present invention was prepared in the same manner as in Example 14.

When the spot diameter of writing light was set at 50 $\mu$m, J=50. I'(S) of the profile of the surface of the aluminum drum, with J=50, was calculated. The result was that I'(S) was $6.9\times10^{-3}$.

A commercially available copying machine (Trademark "Imagio Color 2800" made by Ricoh Company, Ltd.) was modified to as to be capable of writing with a spot diameter of writing light of 50 $\mu$m.

The above photoreceptor was incorporated in this copying machine.

By use of this copying machine, a monochrome halftone image which was uniform in its entirety was copied and output in the same manner as in Example 14. As a result, a uniform image free of abnormal images such as the light and shade striped image was obtained.

Furthermore, the full-color landscape photograph employed in Example 14 was also copied by use of this copying machine. As a result, a high quality image was obtained.

EXAMPLE 18

An aluminum drum was machined by use of the same cutting tool as that used in Example 17.

With the spot diameter of writing light set at 50 $\mu$m, and with J=50, I'(S) of the profile of the surface of the aluminum drum was calculated. The result was that I'(S) was 0.0229.

By use of this aluminum drum, a photoreceptor of the present invention was prepared in the same manner as in Example 14 except that the thickness of the charge transport layer was changed to 14.5 $\mu$m.

A commercially available copying machine (Trademark "Imagio Color 2800" made by Ricoh Company, Ltd.) was modified to as to be capable of writing with a spot diameter of writing light of 50 $\mu$m.

The above photoreceptor was incorporated in this copying machine.

By use of this copying machine, a monochrome halftone image which was uniform in its entirety was copied and output in the same manner as in Example 14. As a result, an image free with 5 sets of band-shaped, light and shade stripes in the end portion thereof was obtained. In addition, grained light and shade stripes were recognized at 283 mm intervals, corresponding to the circumferential length of the drum-shaped photoreceptor employed in this example.

EXAMPLE 19

An aluminum drum with a diameter of 90 mm, a length of 352 mm, and a wall thickness of 2 mm was prepared by subjecting the outer surface of the aluminum drum to honing to roughen the surface thereof.

The profile of the roughened surface of the aluminum drum was measured by use of a surface roughness meter (Surfcom 1400A). From this profile, sampling was conducted with $\Delta t$=0.31 $\mu$m, and N=4096, and the thus obtained samples were subjected to discrete Fourier transformation, whereby a power spectrum was prepared. I(S) was then calculated. The result was that I(S) was $18.1\times10^{-3}$.

Formation of Undercoat Layer

A coating liquid for the formation of an undercoat layer was prepared as follows:

| | Parts by weight |
|---|---|
| Acrylic resin (Trademark "ACRYDIC A-460-60" made by Dainippon Ink & Chemicals, Incorporated) | 15 |
| Melamine resin (Trademark "Super Beckamine L-121-60" made by Dainippon Ink & Chemicals, Incorporated) | 10 |

The above components were dissolved in 80 parts by weight of methyl ethyl ketone. To this solution were added 90 parts by weight of titanium oxide powder (Trademark "TM-1" made by Fuji Titanium Industry Co., Ltd.). This mixture was then dispersed in a ball mill for 120 hours, whereby the coating liquid for the formation of an undercoat layer was prepared.

The surface-roughened aluminum drum was immersed in the above prepared coating liquid and then pulled up vertically at a predetermined constant speed, whereby the coating liquid was coated on the surface of the aluminum drum.

The aluminum drum was then dried at 130° C. for 20 minutes, whereby an undercoat layer with a thickness of 4.8 μm was formed on the aluminum drum.

The profile of the undercoat layer was measured by use of the surface roughness meter (Surfcom 1400A) in the same manner as in the profile of the surface of the aluminum drum, and from this profile, I(S) was then calculated. The result was that I(S) was $10.9\times10^{-3}$.

Formation of Charge Generation Layer 2 parts by weight of butyral resin (Trademark "XYHL" made by Union Carbide Japan K.K.) were dissolved in 200 parts by weight of methyl ethyl ketone. To this solution, 10 parts by weight of a bisazo pigment with the following formula were added, and the mixture was dispersed for 40 hours:

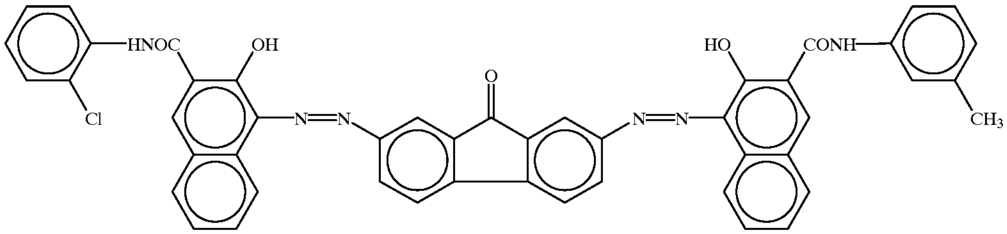

To the above dispersion, 200 parts by weight of cyclohexanone were further added, and the mixture was dispersed for 10 hours. The dispersion was then diluted with cyclohexanone with stirring in such a manner that the amount ratio of the solid components in the dispersion was 1.5 wt. %, whereby a coating liquid for the formation of a charge generation layer was prepared.

The aluminum drum with the undercoat layer was immersed in the above prepared coating liquid and then pulled up, whereby the coating liquid was coated on the surface of the undercoat layer of the aluminum drum.

The aluminum drum was dried in the same manner as for the undercoat layer at 120° C. for 20 minutes, whereby a charge generation layer with a thickness of about 0.2 μm was formed on the undercoat layer of the aluminum drum.

Formation of Charge Transport Layer

A coating liquid for the formation of a charge transport layer was prepared by dissolving the following components in 10 parts by weight of tetrahydrofuran:

| | Parts by weight |
|---|---|
| Charge transport material with the following formula: 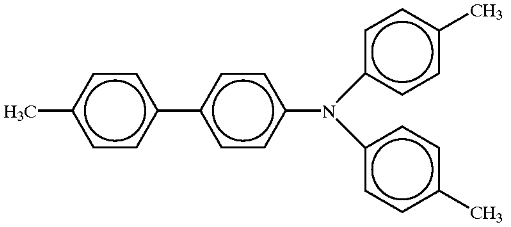 | 1 |
| Bisphenoyl Z-type polycarbonate resin | 1 |
| Silicone oil (Trademark "KF-50" made by Shin-Etsu Chemical Co., Ltd.) | 0.02 |

The aluminum drum with the undercoat layer and the charge generation layer was immersed in the above prepared coating liquid and then pulled up, whereby the coating liquid was coated on the surface of the charge generation layer of the aluminum drum.

The aluminum drum was dried in the same manner as for the undercoat layer at 120° C. for 20 minutes, whereby a charge transport layer with a thickness of about 14 μm was formed on the charge generation layer of the aluminum drum. Thus, a photoreceptor of the present invention was prepared.

The thus prepared photoreceptor was incorporated in a commercially available copying machine (Trademark "Imagio Color 2800" made by Ricoh Company, Ltd.) which was modified so as to be capable of writing with writing light with a wavelength of 655 nm and writing image with a resolution of 1200 dpi.

By use of this copying machine, a monochrome halftone image which was uniform in its entirety was copied and output. As a result, a uniform image free of abnormal images such as the light and shade striped image was obtained.

Furthermore, the same full-color landscape photograph as employed in Example 1 was also copied by use of this copying machine. As a result, a high quality image was obtained.

EXAMPLES 20 to 23 and Comparative Examples 9 and 10

Six aluminum drums with a diameter of 90 mm, a length of 352 mm, and a wall thickness of 2 mm were prepared by subjecting the outer surface of each of the aluminum drums to honing to roughen the surface thereof in the same manner as in Example 19.

The outer surface of each of the six aluminum drums was coated with the same coating liquid for the formation of an undercoat layer as that employed in Example 19 by spray coating, using a pray gun, with the moving speed of the spray gun and the amount of the coating liquid ejected from the spray gun being changed, and was then dried at 130° C. for 20 minutes. Thus, an undercoat layer with a thickness of about 4.5 $\mu$m was formed on each of the aluminum drums.

On the undercoat layer of each of the aluminum drums, the same charge generation layer and the same charge transport layer as in Example 19 were successively overlaid in the manner as in Example 19, whereby six photoreceptors of the present invention were prepared.

Each of the thus prepared photoreceptors was incorporated in a commercially available copying machine (Trademark "Imagio Color 2800" made by Ricoh Company, Ltd.) which was modified so as to be capable of writing with writing light with a wavelength of 504 nm, with writing image with a resolution of 1200 dpi.

By use of this copying machine, a monochrome halftone image which was uniform in its entirety was copied and output.

The profile of the surface of the undercoat layer of each of the photoreceptors was measured, I(S) thereof was calculated, and the image out was evaluated with respect to each of the photoreceptors. The results are shown in TABLE 3.

TABLE 3

| | I(S) | Evaluation of Image |
|---|---|---|
| Example 20 | $12.5 \times 10^{-3}$ | Uniform, no abnormal images |
| Example 21 | $11.7 \times 10^{-3}$ | Uniform, no abnormal images |
| Example 22 | $9.9 \times 10^{-3}$ | Uniform, no abnormal images |
| Example 23 | $8.5 \times 10^{-3}$ | Uniform, no abnormal images |
| Comp. Example 9 | $5.7 \times 10^{-3}$ | 3 sets of light and shade streaks in the end portions of images |
| Comp. Example 10 | $5.1 \times 10^{-3}$ | 4 sets of light and shade streaks in the end portions of images |

EXAMPLE 24

100 aluminum drums with a diameter of 90 mm, a length of 352 mm, and a wall thickness of 2 mm were prepared by machining the surface of the aluminum drums, using a cutting tool with a 2.2 R diamond point.

Figure 18:
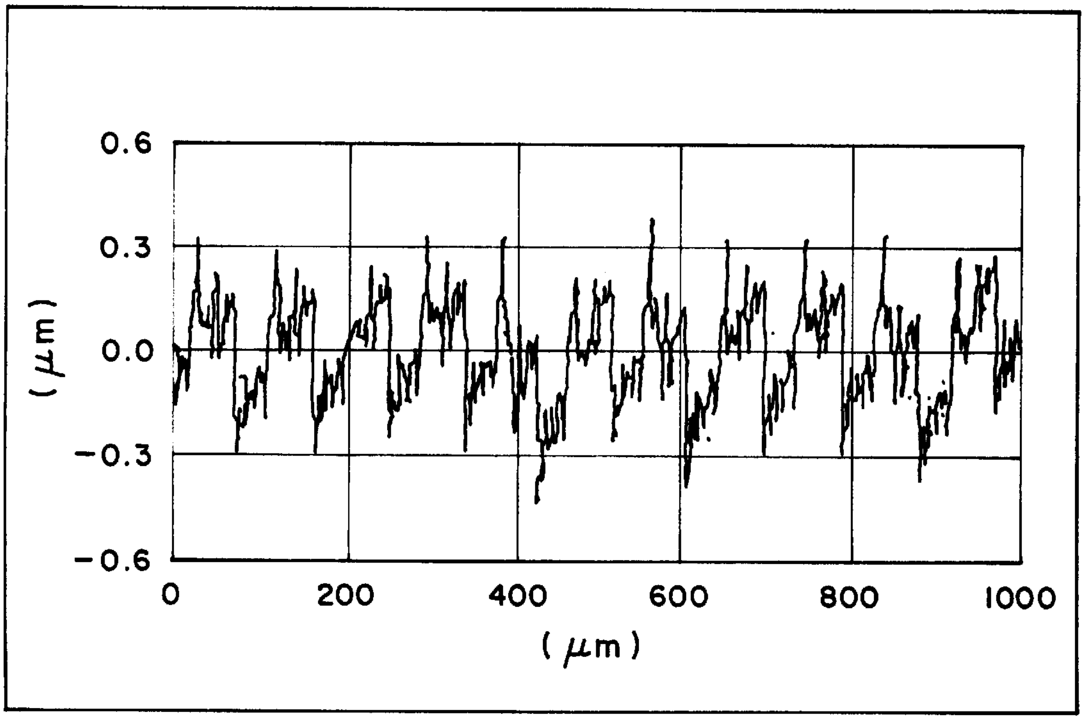
FIG. 18 is a profile of the outer surface of the aluminum drum in Example 24.

Of the thus machined aluminum drums, the profile of the outer surface of a 75th machined aluminum drum was measured by use of a surface roughness meter (Surfcom 1400A). As a result, a profile as shown in FIG. 18 was obtained.

Figure 19:
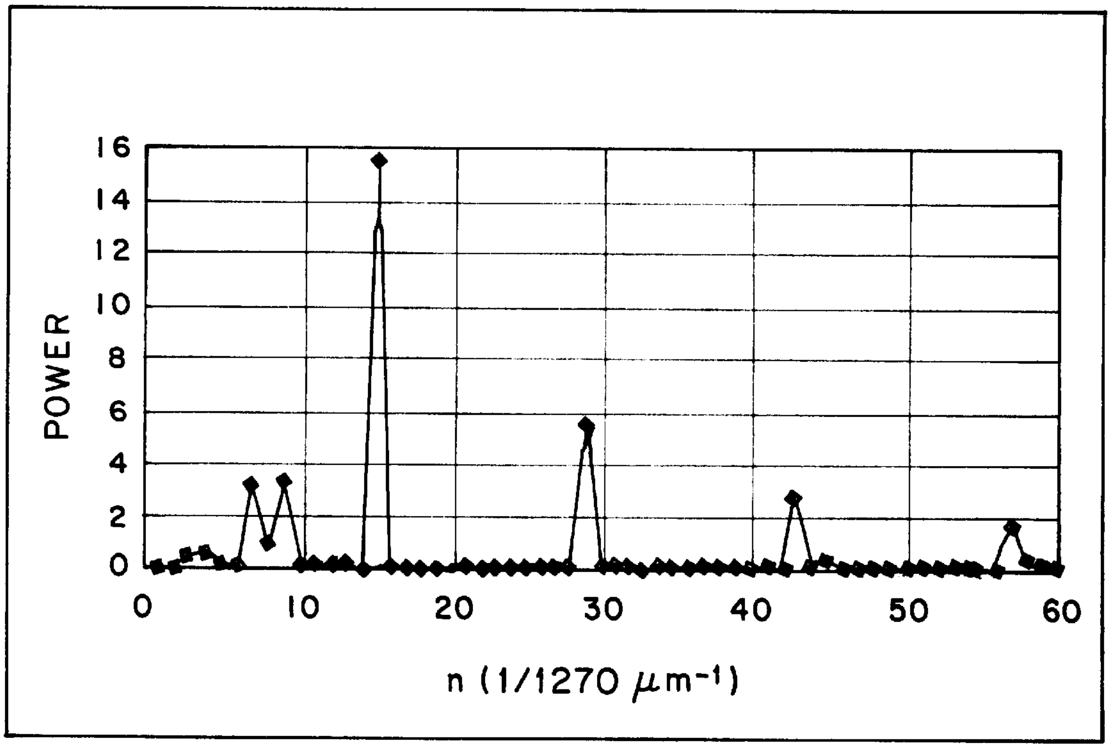
FIG. 19 is a power spectrum of the outer surface of the aluminum drum in example 24.

From this profile, sampling was conducted with $\Delta t$=0.31 $\mu$m, and N=4096, and the thus obtained samples were subjected to discrete Fourier transformation, whereby a power spectrum as shown in FIG. 19 was prepared.

In the power spectrum, there were 6 peaks which satisfied $150\times10^{-6}\times4096=0.614$ or more in a region where n satisfied $$\frac{1}{25} \geq \frac{n}{N \cdot \Delta t} \geq \frac{1}{200},$$

namely in a region of 50≧n≧7.

The integrated value of the power spectrum, I(S), was then calculated. The result was that I(S) was $24.4\times10^{-3}$.

Formation of Undercoat Layer

A coating liquid for the formation of an undercoat layer was prepared as follows:

| | Parts by weight |
|---|---|
| Acrylic resin (Trademark "ACRYDIC A-460-60" made by Dainippon Ink & Chemicals, Incorporated) | 15 |
| Melamine resin (Trademark "Super Beckamine L-121-60" made by Dainippon Ink & Chemicals, Incorporated) | 10 |

The above components were dissolved in 80 parts by weight of methyl ethyl ketone. To this solution were added 90 parts by weight of titanium oxide powder (Trademark "TM-1" made by Fuji Titanium Industry Co., Ltd.). This mixture was then dispersed in a ball mill for 12 hours, whereby the coating liquid for the formation of an undercoat layer was prepared.

The surface-roughened aluminum drum was immersed in the above prepared coating liquid and then pulled up vertically at a predetermined constant speed, whereby the coating liquid was coated on the surface of the aluminum drum.

With the posture of the aluminum drum maintained, the aluminum drum was transported into a drying chamber, where the aluminum drum was dried at 140° C. for 20 minutes, whereby an undercoat layer with a thickness of 3.5 $\mu$m was formed on the aluminum drum.

Figure 20:
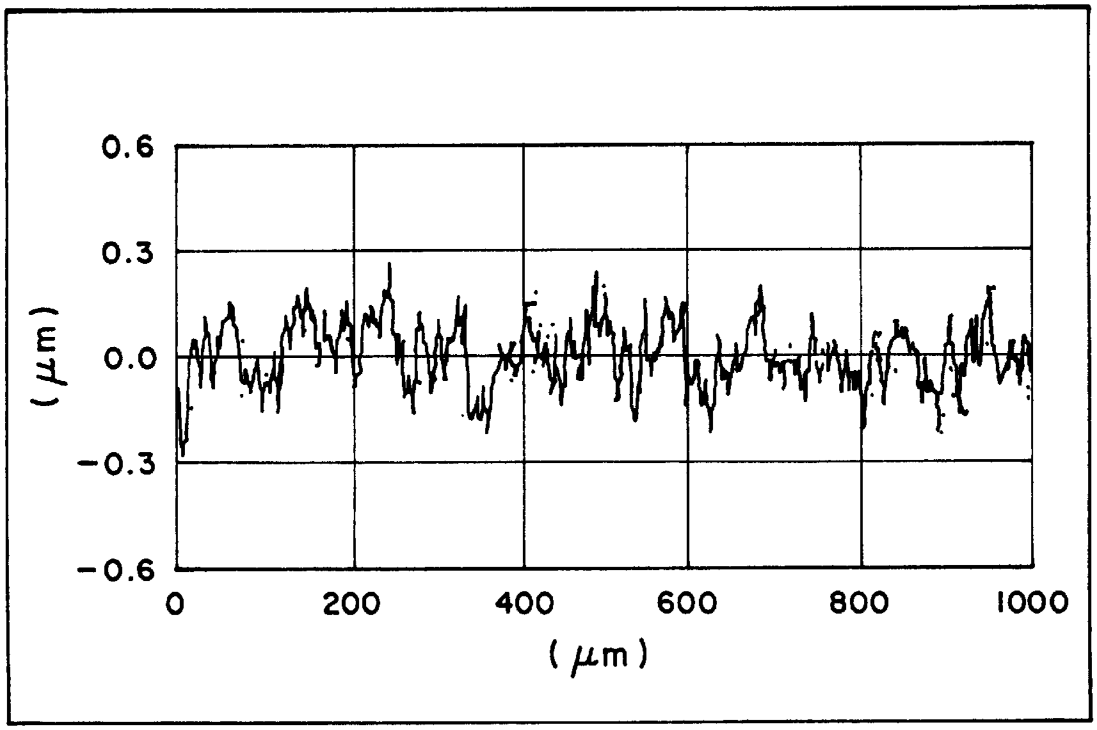
FIG. 20 is a profile of the surface of the undercoat layer of the photoreceptor in Example 24.

The surface of the undercoat layer was measured by use of the surface roughness meter (Surfcom 1400A). As a result, a profile as shown in FIG. 20 was obtained.

Figure 21:
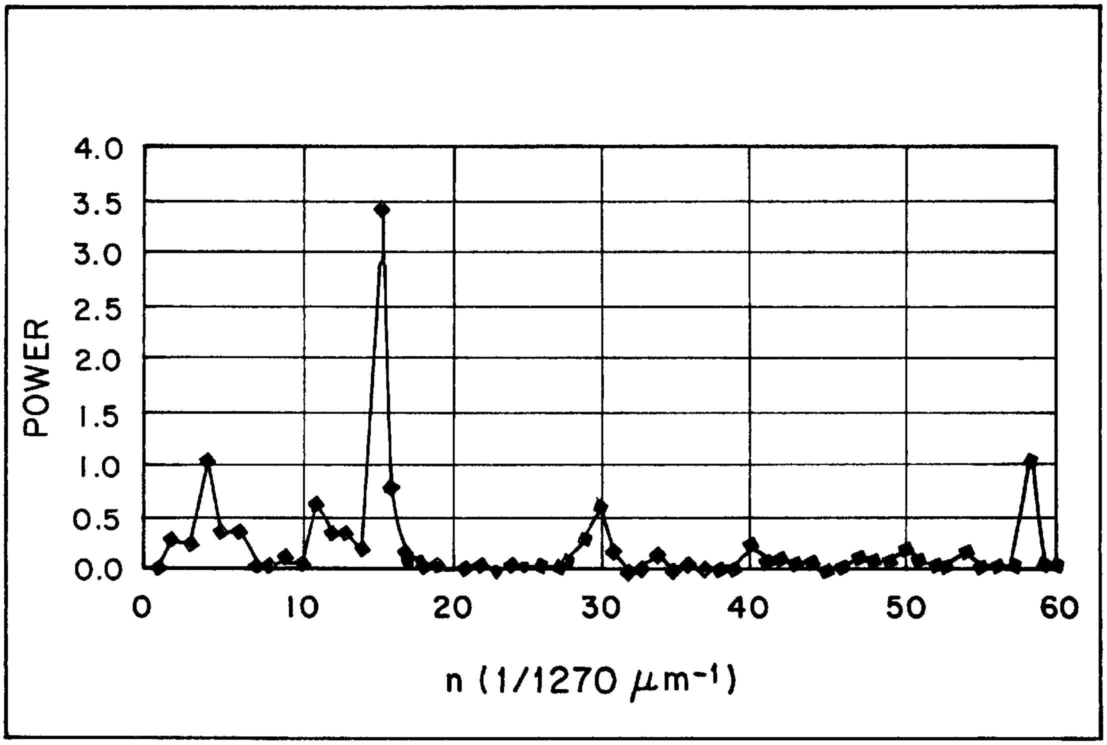
FIG. 21 is a power spectrum of the surface of the undercoat layer of the photoreceptor in Example 24.

From this profile, sampling was conducted with $\Delta t$=0.31 $\mu$m, and N=4096, and the thus obtained samples were subjected to discrete Fourier transformation, whereby a power spectrum as shown in FIG. 21 was prepared.

In the power spectrum, there were 4 peaks which satisfied $100\times10^{-6\cdot}\times4096=0.410$ or more in a region where n satisfied $$\frac{1}{25} \geq \frac{n}{N \cdot \Delta t} \geq \frac{1}{200},$$

namely in a region of 50≧n≧7.

The integrated value of the power spectrum, I(S), was then calculated. The result was that I(S) was $8.02\times10^{-3}$.

Formation of Charge Generation Layer 15 parts by weight of butyral resin (Trademark "S-Lec BLS" made by Sekisui Chemical Co., Ltd.) were dissolved in 150 parts by weight of cyclohexanone. To this solution, 10 parts by weight of a trisazo pigment with the following formula were added, and the mixture was dispersed for 48 hours:

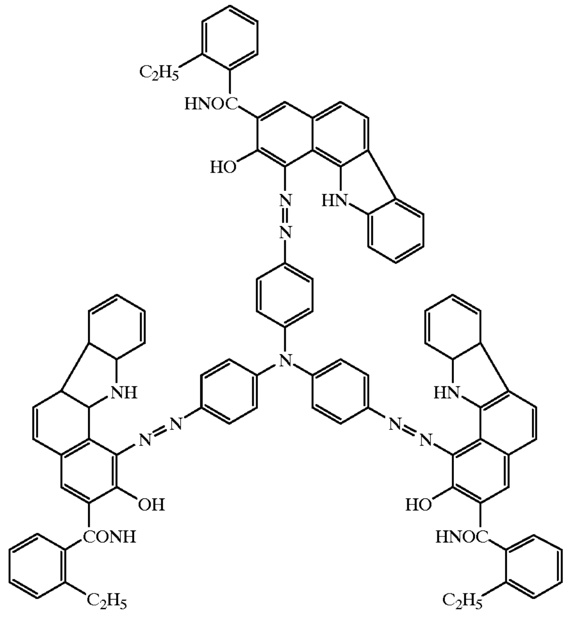

To the above dispersion, 210 parts by weight of cyclohexanone were further added, and the mixture was dispersed for 3 hours. The dispersion was then diluted with cyclohexanone, with stirring, in such a manner that the amount ratio of the solid components in the dispersion was 1.5 wt. %, whereby a coating liquid for the formation of a charge generation layer was prepared.

The aluminum drum with the undercoat layer was immersed in the above prepared coating liquid for the formation of a charge generation layer and then pulled up vertically at a predetermined constant speed, whereby the coating liquid was coated on the surface of the undercoat layer of the aluminum drum.

The coating liquid coated aluminum drum was dried in the same manner as for the undercoat layer at 120° C. for 20 minutes, whereby a charge generation layer with a thickness of about 0.2 $\mu$m was formed on the undercoat layer of the aluminum drum.

Formation of Charge Transport Layer

A coating liquid for the formation of a charge transport layer was prepared by dissolving the following components in 90 parts by weight of methylene chloride:

| | Parts by weight |
|---|---|
| Charge transport material with the following formula: 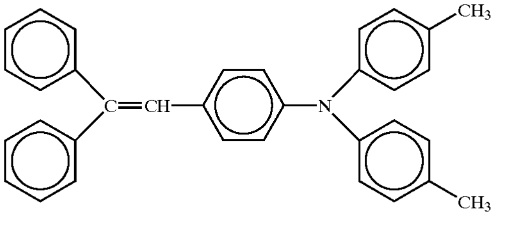 | 6 |

-continued

| | Parts by weight |
|---|---|
| Polycarbonate resin (Trademark "Panlite K-1300" made by Teijin Limited) | 10 |
| Silicone oil (Trademark "KF-50" made by Shin-Etsu Chemical Co., Ltd.) | 0.002 |

The aluminum drum with the undercoat layer and the charge generation layer was immersed in the above prepared coating liquid for the formation of a charge transport layer and then pulled up vertically at a predetermined constant speed, whereby the coating liquid for the formation of a charge transport layer was coated on the surface of the charge generation layer of the aluminum drum.

The coating liquid coated aluminum drum was dried in the same manner as for the undercoat layer at 120° C. for 20 minutes, whereby a charge transport layer with a thickness of about 24 $\mu$m was formed on the charge generation layer of the aluminum drum. Thus, a photoreceptor of the present invention was prepared.

The thus prepared photoreceptor was incorporated in a commercially available copying machine (Trademark "Imagio Color 2800" made by Ricoh Company, Ltd.) capable of writing with writing light with a wavelength of 780 nm, and with writing image with a resolution of 400 dpi.

By use of this copying machine, a monochrome halftone image which was uniform in its entirety was copied and output. As a result, a uniform image free of abnormal images such as the light and shade striped image was obtained.

Furthermore, a full-color landscape photograph was also copied by use of this copying machine. As a result, a high quality image was obtained.

EXAMPLE 25

A photoreceptor was prepared in the same manner as in Example 24 except that a 76th machined aluminum drum was employed and that the thickness of the undercoat layer was changed to 4.0 $\mu$m.

A profile of the surface of the undercoat layer was prepared in the same manner as in Example 24. From the profile, the power spectrum thereof was prepared. The result was that in the power spectrum, there were 3 peaks which satisfied $100\times10^{-6}\times4096=0.410$ or more in a region where n satisfied $$\frac{1}{25} \geq \frac{n}{N\cdot\Delta t} \geq \frac{1}{200},$$

namely in a region of $50\geqq n\geqq 7$.

The integrated value of the power spectrum, I(S), was then calculated. The result was that I(S) was $6.74\times10^{-3}$.

The thus prepared photoreceptor was incorporated in the same copying machine as that employed in Example 24.

By use of this copying machine, a monochrome halftone image which was uniform in its entirety was copied and output. As a result, a uniform image free of abnormal images such as the light and shade striped image was obtained.

Furthermore, a full-color landscape photograph was also copied by use of this copying machine. As a result, a high quality image was obtained.

Comparative Example 11

A photoreceptor was prepared in the same manner as in Example 24 except that the cutting tool employed in Example 24 was replaced by a cutting tool with a 1.6 R diamond point and that a 3rd machined aluminum drum was employed.

Figure 22:
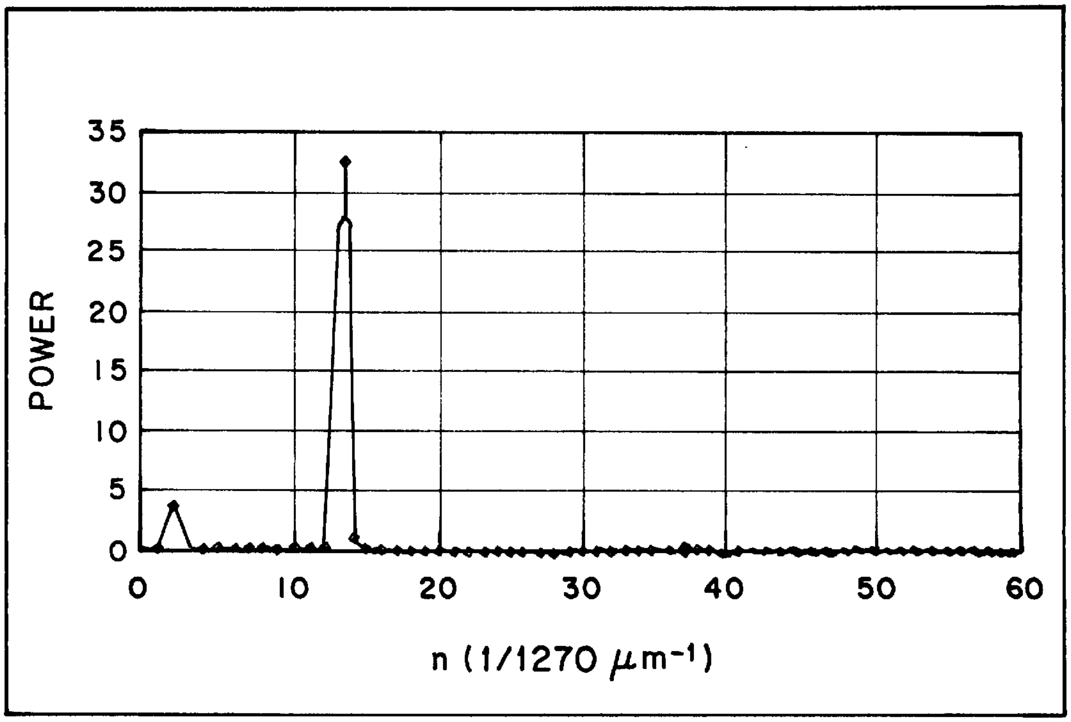
FIG. 22 is a power spectrum of the outer surface of the aluminum drum in Comparative Example 11.

A profile of the surface of the aluminum drum was prepared in the same manner as in Example 24. From the profile, a power spectrum thereof was prepared as shown in FIG. 22. The result was that in the power spectrum, there was only one peak which satisfied $150\times10^{-6}\times4096=0.614$ or more a region where n satisfied $$\frac{1}{25} \geq \frac{n}{N\cdot\Delta t} \geq \frac{1}{200},$$

namely in a region of $50\geqq n\geqq 7$.

The thus prepared photoreceptor was incorporated in the same copying machine as that employed in Example 24.

By use of this copying machine, a monochrome halftone image which was uniform in its entirety was copied and output. As a result, there was obtained an image with streaks running in the circumferential direction of the photoreceptor over an about 35% area of the entire image area thereof.

Comparative Example 12

A photoreceptor was prepared in the same manner as in Example 24 except that further 131 aluminum drums were machined and a 231st machined aluminum was employed.

A profile of the surface of the aluminum drum was prepared in the same manner as in Example 24. From the profile, a power spectrum thereof (not shown) was prepared. The result was that in the power spectrum, there were 6 peaks which satisfied $150\times10^{-6}\times4096=0.614$ or more in a region where n satisfies $$\frac{1}{25} \geq \frac{n}{N\cdot\Delta t} \geq \frac{1}{200},$$

namely in a region of $50\geqq n\geqq 7$.

The integrated value of the power spectrum, I(S), was then calculated. The result was that I(S) was $11.6\times10^{-3}$.

The thus prepared photoreceptor was incorporated in the same copying machine as that employed in Example 24.

By use of this copying machine, a monochrome halftone image which was uniform in its entirety was copied and output. As a result, there was obtained an image free of lengthwise streaks running in the circumferential direction of the photoreceptor, but light and shade streaks were slightly recognized near one end portion of the image.

EXAMPLE 26

The procedure of the image formation in Example 24 was repeated in the same manner as in Example 24 except that the commercially available copying machine (Trademark "Imagio Color 2800" made by Ricoh Company, Ltd.) employed in Example 24 was modified so as to be capable of writing image with a resolution of 1200 dpi.

The result was that an image obtained by copying a monochrome halftone image which was uniform in its entirety was uniform and free of abnormal images as obtained in Example 24.

Comparative Example 13

The procedure of the image formation in Example 26 was repeated in the same manner as in Example 26 except that the photoreceptor prepared in Comparative Example 11 was incorporated in the commercially available copying machine (Trademark "Imagio Color 2800" made by Ricoh Company, Ltd.) employed in Example 26.

The result was that an image obtained by copying a monochrome halftone image which was uniform in its entirety included streaks running in the circumferential direction of the photoreceptor over an about 50% area of the entire image area thereof.

EXAMPLE 27

A photoreceptor was prepared in the same manner as in Example 24 except that a 77th machined aluminum drum was employed and that the thickness of the charge transport layer was changed to 14.3 $\mu$m.

A profile of the surface of the aluminum drum was prepared in the same manner as in Example 24. From the profile, the power spectrum thereof was prepared. The result was that in the power spectrum, there were 6 peaks which satisfied $150\times10^{-6}\times4096=0.614$ or more in a region where n satisfied $$\frac{1}{25} \geq \frac{n}{N\cdot\Delta t} \geq \frac{1}{200},$$

namely in a region of $50\geqq n\geqq 7$.

The integrated value of the power spectrum, I(S), was then calculated. The result was that I(S) was $24.4\times10^{-3}$.

The thus prepared photoreceptor was incorporated in the same copying machine as that employed in Example 24.

By use of this copying machine, a monochrome halftone image which was uniform in its entirety was copied and output. As a result, a uniform image was obtained.

Furthermore, a full-color landscape photograph was also copied by use of this copying machine. As a result, a high quality image was obtained.

Comparative Example 14

A photoreceptor was prepared in the same manner as in Comparative Example 11 except that a 4th machined aluminum drum was employed and that the thickness of the charge transport layer was changed to 14.3 $\mu$m.

A profile of the surface of the aluminum drum was prepared in the same manner as in Example 24. From the profile, a power spectrum thereof was prepared. In the power spectrum, there was only one peak which satisfied $150\times10^{-6}\times4096=0.614$ or more in a region where n satisfied $$\frac{1}{25} \geq \frac{n}{N\cdot\Delta t} \geq \frac{1}{200},$$

namely in a region of $50\geqq n\geqq 7$.

The thus prepared photoreceptor was incorporated in the same copying machine as that employed in Example 24.

By use of this copying machine, a monochrome halftone image which was uniform in its entirety was copied and output. As a result, there was obtained an image including streaks running in the circumferential direction of the photoreceptor in an about 70% area of the entire image area thereof.

EXAMPLE 28

100 aluminum drums with a diameter of 90 mm, a length of 352 mm, and a wall thickness of 2 mm were prepared by machining the surface of the aluminum drums, using a cutting tool with a 2.1 R diamond point.

Figure 23:
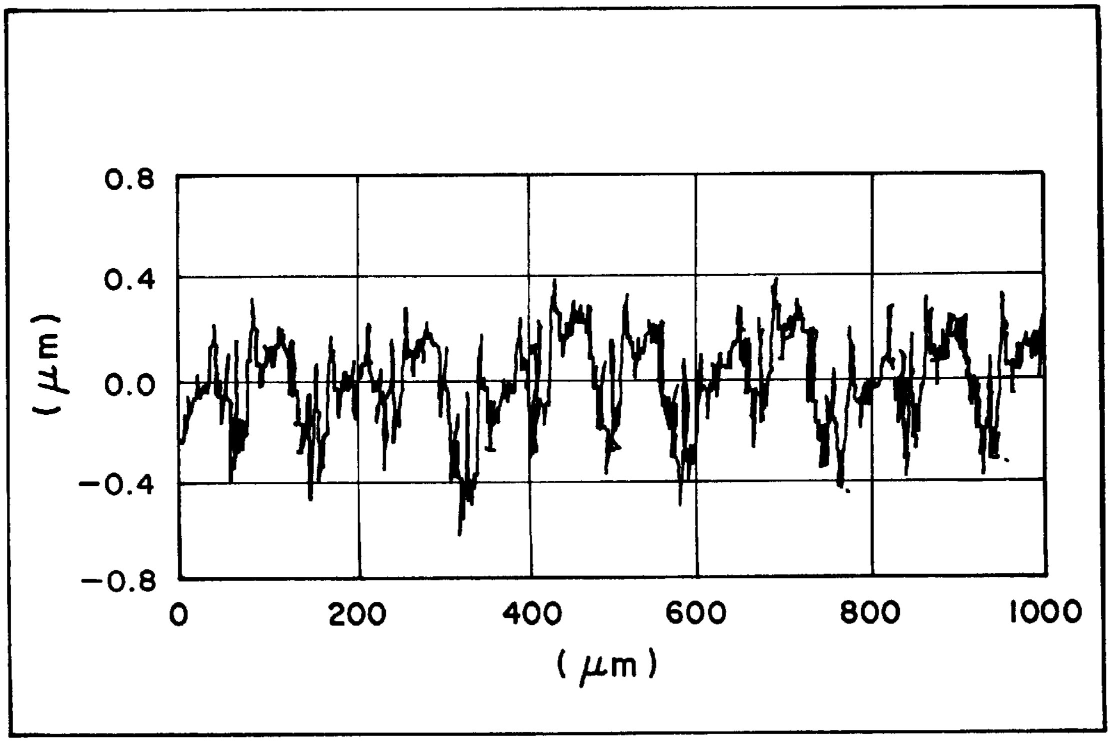
FIG. 23 is a profile of the outer surface of a 85th machined aluminum drum in Example 28.

Of the thus machined aluminum drums, the profile of the outer surface of a 85th machined aluminum drum was measured by use of a surface roughness meter (Surfcom 1400A). As a result, a profile as shown in FIG. 23 was obtained.

Figure 24:
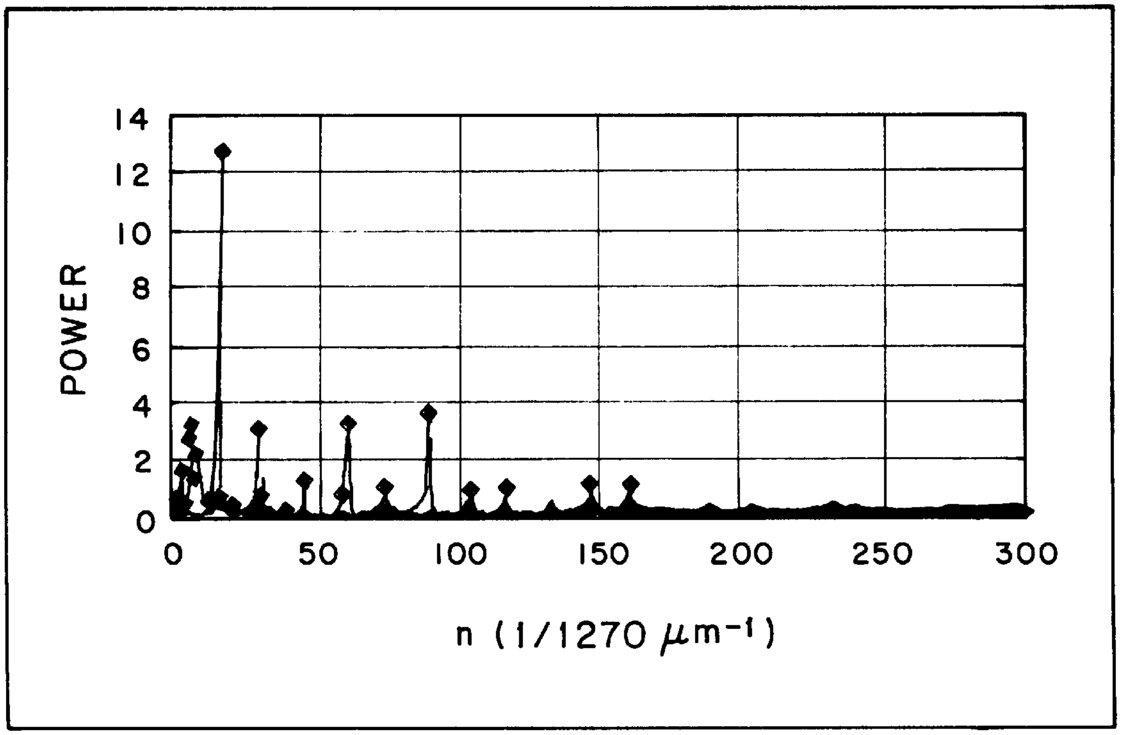
FIGS. 24 and 25 are a power spectrum of the outer surface of the aluminum drum in Example 28.
Figure 25:
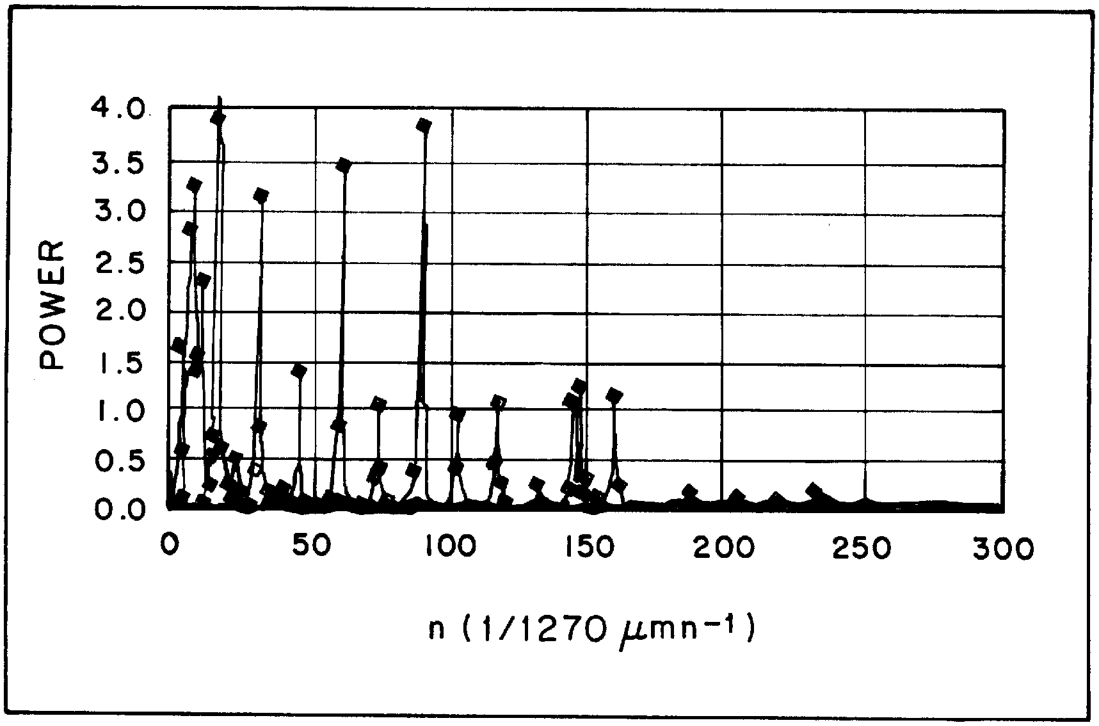

From this profile, sampling was conducted with $\Delta t=0.31$ $\mu m$, and $N=4096$, and the thus obtained samples were subjected to discrete Fourier transformation, whereby a power spectrum as shown in FIGS. 24 and 25 was prepared.

In the power spectrum, there were 9 peaks which satisfied $60\times10^{-6}\times4096=0.246$ or more in a region where n satisfied $$\frac{1}{5} \geq \frac{n}{N\cdot\Delta t} \geq \frac{1}{50},$$

namely in a region of $254\geqq n\geqq 26$.

The integrated value of the power spectrum, I(S), was then calculated. The result was that I(S) was $37.6\times10^{-3}$.

Formation of Undercoat Layer

A coating liquid for the formation of an undercoat was prepared as follows:

| | Parts by weight |
|---|---|
| Acrylic resin (Trademark "ACRYDIC A-460-60" made by Dainippon Ink & Chemicals, Incorporated) | 15 |
| Melamine resin (Trademark "Super Beckamine L-121-60" made by Dainippon Ink & Chemicals, Incorporated) | 10 |

The above components were dissolved in 80 parts by weight of methyl ethyl ketone. To this solution were added 90 parts by weight of titanium oxide powder (Trademark "TM-1" made by Fuji Titanium Industry Co., Ltd.). This mixture was then dispersed in a ball mill for 12 hours, whereby the coating liquid for the formation of an undercoat layer was prepared.

The surface-roughened aluminum drum was immersed in the above prepared coating liquid and then pulled up vertically at a predetermined constant speed, whereby the coating liquid was coated on the surface of the aluminum drum.

With the posture of the aluminum drum maintained, the aluminum drum was transported into a drying chamber, where the aluminum drum was dried at 140° C. for 20 minutes, whereby an undercoat layer with a thickness of 3.5 $\mu m$ was formed on the aluminum drum.

Figure 26:
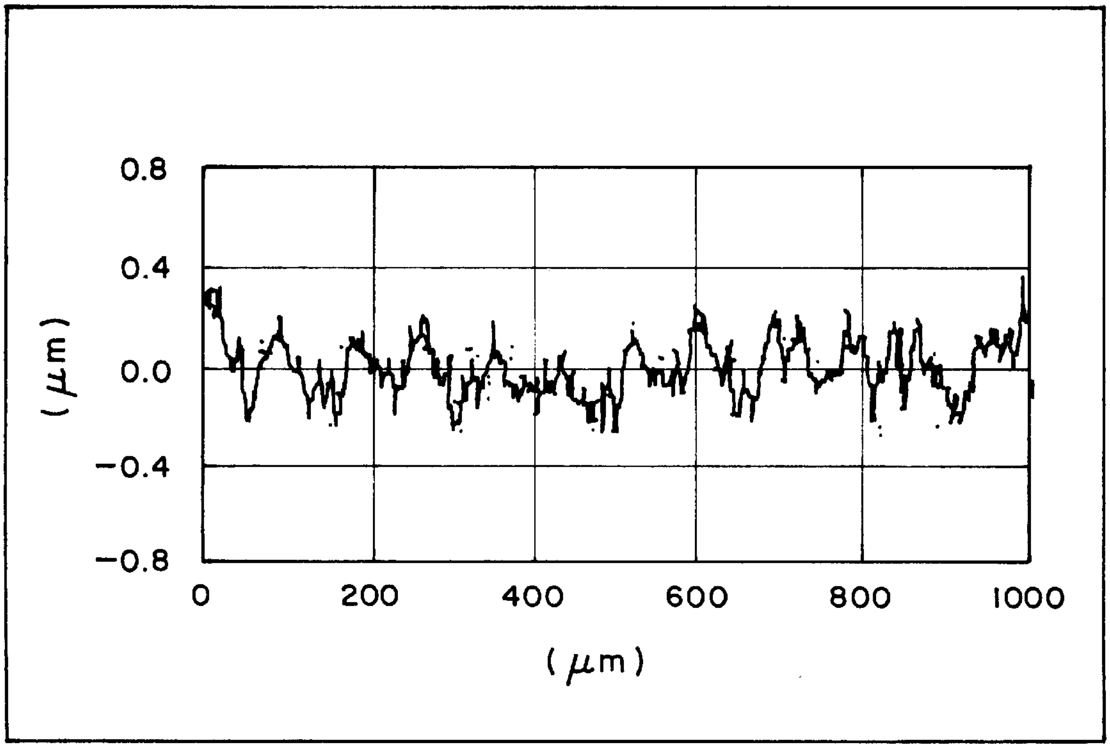
FIG. 26 is a profile of the surface of the undercoat layer of the photoreceptor in Example 28.

The surface of the undercoat layer was measured by use of the surface roughness meter (Surfcom 1400A). As a result, a profile as shown in FIG. 26 was obtained.

Figure 27:
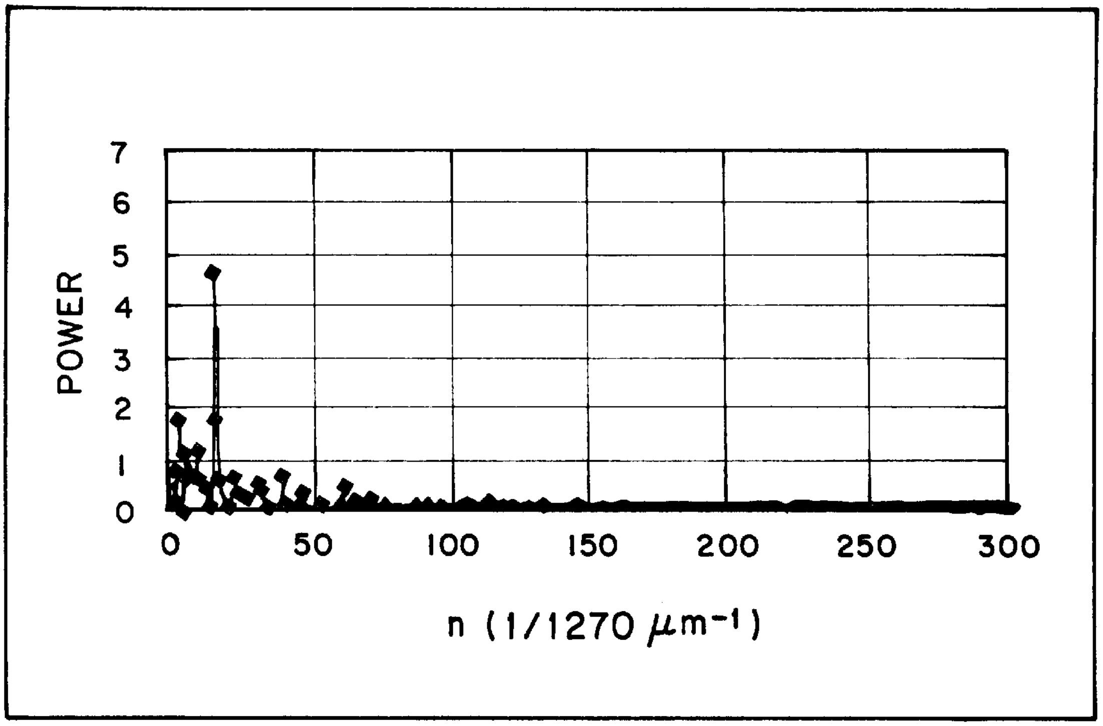
FIGS. 27 and 28 are a power spectrum of the surface of the undercoat layer of the photoreceptor in Example 28.
Figure 28:
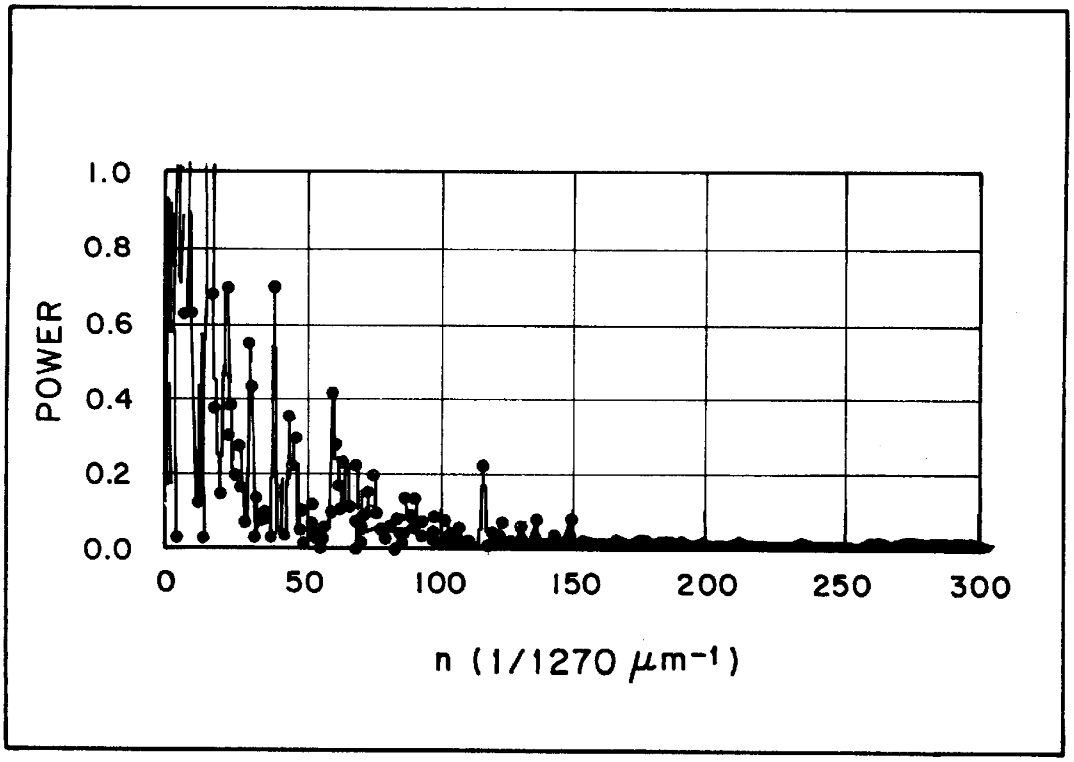

From this profile, sampling was conducted with $\Delta t=0.31$ $\mu m$, and $N=4096$, and the thus obtained samples were subjected to discrete Fourier transformation, whereby a power spectrum as shown in FIGS. 27 and 28 was prepared.

In the power spectrum, there were 7 peaks which satisfied $45\times10^{-6}\times4096=0.184$ or more in a region where n satisfied $$\frac{1}{5} \geq \frac{n}{N\cdot\Delta t} \geq \frac{1}{50},$$

namely in a region of $254\geqq n\geqq 26$.

The integrated value of the power spectrum, I(S), was then calculated. The result was that I (S) was $14.0\times10^{-3}$.

Formation of Charge Generation Layer 15 parts by weight of butyral resin (Trademark "S-Lec BLS" made by Sekisui Chemical Co., Ltd.) were dissolved in 150 parts by weight of cyclohexanone. To this solution, 10 parts by weight of a trisazo pigment with the following formula were added, and the mixture was dispersed for 48 hours:

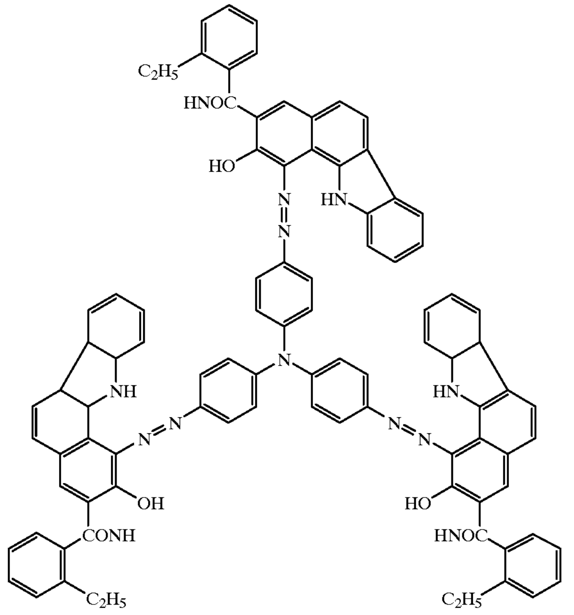

To the above dispersion, 210 parts by weight of cyclohexanone were further added, and the mixture was dispersed for 3 hours. The dispersion was then diluted with cyclohexanone, with stirring, in such a manner that the amount ratio of the solid components in the dispersion was 1.5 wt. %, whereby a coating liquid for the formation of a charge generation layer was prepared.

The aluminum drum with the undercoat layer was immersed in the above prepared coating liquid for the formation of a charge generation layer and then pulled up vertically at a predetermined constant speed, whereby the coating liquid was coated on the surface of the undercoat layer of the aluminum drum.

The coating liquid coated aluminum drum was dried in the same manner as for the undercoat layer at 120° C. for 20 minutes, whereby a charge generation layer with a thickness of about 0.2 $\mu m$ was formed on the undercoat layer of the aluminum drum.

Formation of Charge Transport Layer

A coating liquid for the formation of a charge transport layer was prepared by dissolving the following components in 90 parts by weight of methylene chloride:

| | Parts by weight |
|---|---|
| Charge transport material with the following formula: | 6 |

-continued

| | Parts by weight |
|---|---|
| 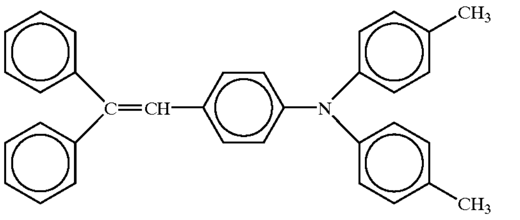 | |
| Polycarbonate resin (Trademark "Panlite K-1300" made by Teijin Limited) | 10 |
| Silicone oil (Trademark "KF-50" made by Shin-Etsu Chemical Co., Ltd.) | 0.002 |

The aluminum drum with the undercoat layer and the charge generation layer was immersed in the above prepared coating liquid for the formation of a charge transport layer and then pulled up vertically at a predetermined constant speed, whereby the coating liquid for the formation of a charge transport layer was coated on the surface of the charge generation layer of the aluminum drum.

The coating liquid coated aluminum drum was dried in the same manner as for the undercoat layer at 120° C. for 20 minutes, whereby a charge transport layer with a thickness of about 24 μm was formed on the charge generation layer of the aluminum drum. Thus, a photoreceptor of the present invention was prepared.

The thus prepared photoreceptor was incorporated in a commercially available copying machine (Trademark "Imagio Color 2800" made by Ricoh Company, Ltd.) capable of writing with writing light with a wavelength of 780 nm, and with writing image with a resolution of 400 dpi.

By use of this copying machine, a monochrome halftone image which was uniform in its entirety was copied and output. As a result, a uniform image free of abnormal images such as the light and shade striped image was obtained.

Furthermore, a full-color landscape photograph was also copied by use of this copying machine. As a result, a high quality image was obtained.

EXAMPLE 29

A photoreceptor was prepared in the same manner as in Example 28 except that a 86th machined aluminum drum was employed and that the thickness of the undercoat layer was changed to 6.0 μm.

A profile of the surface of the undercoat layer and a power spectrum thereof were prepared in the same manner as in Example 28.

In the power spectrum, there were 6 peaks which satisfied $45\times10^{-6}\times4096=0.184$ or more in a region where n satisfied $$\frac{1}{5} \geq \frac{n}{N \cdot \Delta t} \geq \frac{1}{50},$$

namely in a region of 254≧n≧26.

The integrated value of the power spectrum, I(S), was then calculated. The result was that I(S) was $12.2\times10^{31\ 3}$.

The thus prepared photoreceptor was incorporated in the same copying machine as that employed in Example 28.

By use of this copying machine, a monochrome halftone image which was uniform in its entirety was copied and output. As a result, a uniform image free of abnormal images such as the light and shade striped image was obtained, Furthermore, a full-color landscape photograph was also copied by use of this copying machine. As a result, a high quality image was obtained.

Comparative Example 15

A photoreceptor was prepared in the same manner as in Example 28 except that the cutting tool employed in EXAMPLE 28 was replaced by a cutting tool with a 1.6 R diamond point and that a 2nd machined aluminum drum was employed.

A profile of the surface of the aluminum drum and a power spectrum thereof were prepared in the same manner as in Example 28.

In the power spectrum, there were no peaks which satisfied $60\times10^{-6}\times4096=0.246$ or more in a region where n satisfied $$\frac{1}{5} \geq \frac{n}{N \cdot \Delta t} \geq \frac{1}{50},$$

namely in a region of 254≧n≧26.

The thus prepared photoreceptor was incorporated in the same copying machine as that employed in Example 28.

By use of this copying machine, a monochrome halftone image which was uniform in its entirety was copied and output. As a result, there was obtained an image with streaks running in the circumferential direction of the photoreceptor over an about 30% area of the entire image area thereof.

Comparative Example 16

A photoreceptor was prepared in the same manner as in Example 28 except that further 151 aluminum drums were machined and a 251st machined aluminum was employed.

A profile of the surface of the aluminum drum was prepared in the same manner as in Example 28. From the profile, a power spectrum thereof (not shown) was prepared. The result was that in the power spectrum, there were 12 peaks which satisfied $60\times10^{-6}\times4096=0.246$ or more in a region where n satisfies $$\frac{1}{5} \geq \frac{n}{N \cdot \Delta t} \geq \frac{1}{50},$$

namely in a region of 254≧n≧26.

The integrated value of the power spectrum, I(S), was then calculated. The result was that I($) was $11.5\times10^{-3}$.

The thus prepared photoreceptor was incorporated in the same copying machine as that employed in Example 28.

By use of this copying machine, a monochrome halftone image which was uniform in its entirety was copied and output. As a result, there was obtained an image free of streaks running in the circumferential direction of the photoreceptor, but light and shade streaks were slightly recognized near one end portion of the image.

EXAMPLE 30

The procedure of the image formation in Example 28 was repeated in the same manner as in Example 28 except that the copying machine (Trademark "Imagio Color 2800" made by Ricoh Company, Ltd.) employed in Example 28 was modified to as to be capable of writing image with a resolution of 1200 dpi.

By use of this copying machine, a monochrome halftone image which was uniform in its entirety was copied and output. As a result, a uniform image was obtained.

Comparative Example 17

The procedure of the image formation in Example 30 was repeated in the same manner as in Example 30 except that the photoreceptor employed in the copying machine in Example 30 was replaced by the photoreceptor employed in Comparative Example 15.

When a monochrome halftone image which was uniform in its entirety was copied and output by the copying machine, there was obtained an image with streaks running in the circumferential direction of the photoreceptor over an about 50% area of the entire image area thereof.

EXAMPLE 31

A photoreceptor was prepared in the same manner as in Example 28 except that a 86th machined aluminum drum was employed and the thickness of the charge transport layer was changed to 14.3 μm.

A profile of the surface of the aluminum drum was prepared in the same manner as in Example 28. From the profile, a power spectrum thereof (not shown) was prepared. The result was that in the power spectrum, there were 13 peaks which satisfied $60\times10^{-6}\times4096=0.246$ or more in a region where n satisfies $$\frac{1}{5} \geq \frac{n}{N \cdot \Delta t} \geq \frac{1}{50},$$

namely in a region of $254 \geqq n \geqq 26$.

The integrated value of the power spectrum, I(S), was then calculated. The result was that I(S) was $14.7\times10^{-3}$.

The procedure of image formation in Comparative Example 15 was repeated in the same manner as in Comparative Example 15 except that the photoreceptor employed in the copying machine in Comparative Example 15 was replaced by the above photoreceptor in the copying machine.

When a monochrome halftone image which was uniform in its entirety was copied and output by the copying machine, a uniform image free of abnormal images such as the light and shade striped image was obtained, and when a full-color landscape photograph was also copied by the copying machine, a high quality image was obtained.

Comparative Example 18

A photoreceptor was prepared in the same manner as in Comparative Example 15 except that a 3rd machined aluminum drum was employed and the thickness of the charge transport layer was changed to 14.3 μm.

The procedure of the image formation in Comparative Example 17 was repeated in the same manner as in Comparative Example 17 except that the photoreceptor employed in the copying machine in Comparative Example 17 was replaced by the above prepared photoreceptor.

When a monochrome halftone image which was uniform in its entirety was copied and output by the copying machine, there was obtained an image with streaks running in the circumferential direction of the photoreceptor over an about 75% area of the entire image area thereof.

EXAMPLE 32

Three aluminum drums with a diameter of 90 mm, a length of 352 mm, and a wall thickness of 2 mm were prepared by machining the surface of the aluminum drums, using a diamond cutting tool.

Figure 29:
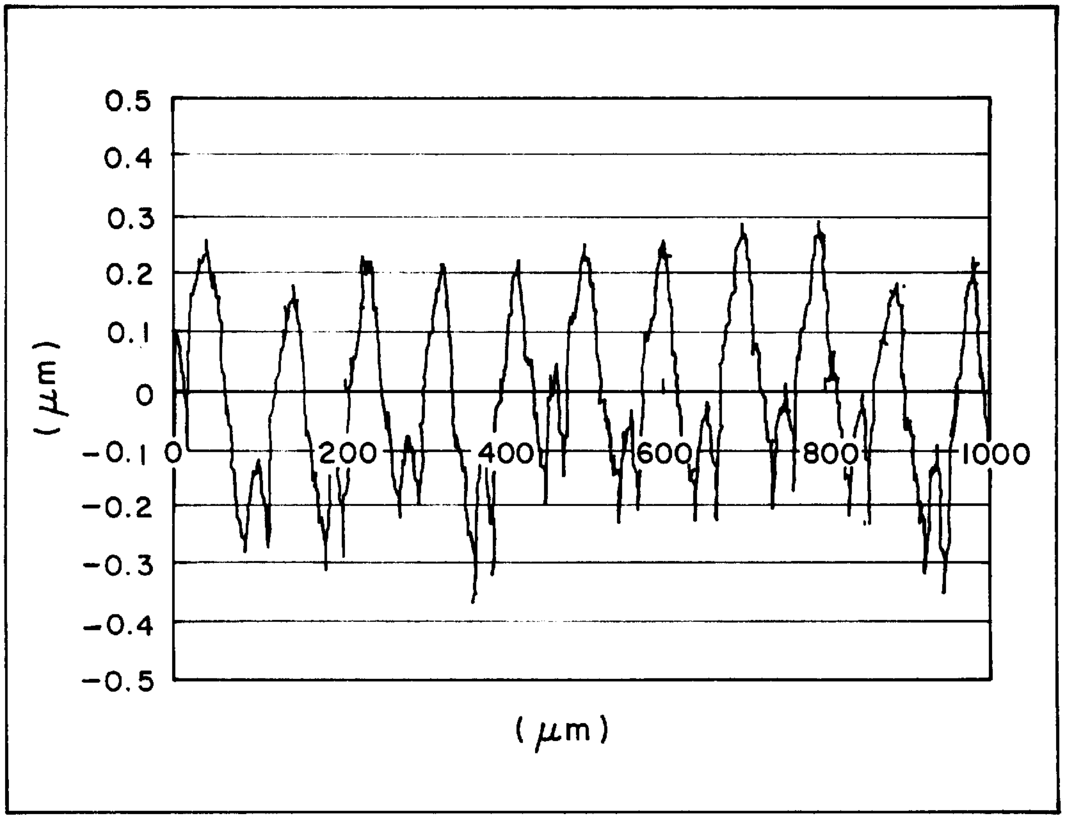
FIG. 29 a profile of the outer surface of the aluminum drum in Example 32.

The surface of the outer surface of the 2nd machined aluminum drum was measured by use of a surface roughness meter (Surfcom 1400A). As a result, a profile as shown in FIG. 29 was obtained.

The profile was mainly composed of a wave component with an amplitude of about 0.15 μm and a wave component with an amplitude of about 0.4 μm which were alternately repeated, so that it was difficult to transform the profile to a sine wave.

Figure 30:
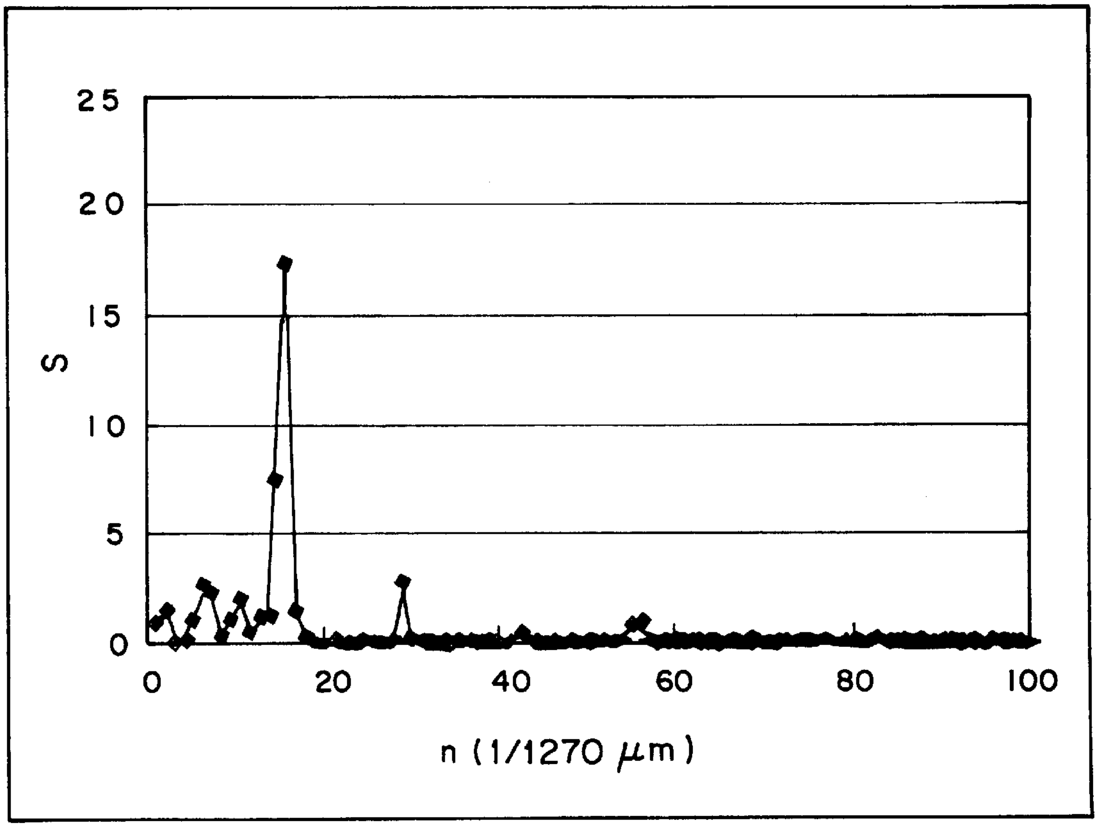
FIG. 30 is a power spectrum of the outer surface of the aluminum drum in Example 32.

From this profile, sampling was conducted with Δt=0.31 μm, and N=4096, and the thus obtained samples were subjected to discrete Fourier transformation, whereby a power spectrum as shown in FIG. 30 was prepared.

In the power spectrum, there was one strongest peak at n=15, with $(N\cdot\Delta t/n_{max})=4096\times0.31/15=84.7$ μm.

The integrated value of the power spectrum, I(S), was then calculated. The result was that I(S) was $23.3\times10^{-3}$.

Formation of Undercoat Layer

A coating liquid for the formation of an undercoat layer was prepared as follows:

| | Parts by weight |
|---|---|
| Acrylic resin (Trademark "ACRYDIC A-460-60" made by Dainippon Ink & Chemicals, Incorporated) | 15 |
| Melamine resin (Trademark "Super Beckamine L-121-60" made by Dainippon Ink & Chemicals, Incorporated) | 10 |

The above components were dissolved in 80 parts by weight of methyl ethyl ketone. To this solution were added 90 parts by weight of titanium oxide powder (Trademark "TM-1" made by Fuji Titanium Industry Co., Ltd.). This mixture was then dispersed in a ball mill for 12 hours, whereby the coating liquid for the formation of an undercoat layer was prepared.

The surface-roughened aluminum drum was immersed in the above prepared coating liquid and then pulled up vertically at a predetermined constant speed, whereby the coating liquid was coated on the surface of the aluminum drum.

With the posture of the aluminum drum maintained, the aluminum drum was transported into a drying chamber, where the aluminum drum was dried at 140° C. for 20 minutes, whereby an undercoat layer with a thickness of 3.5 μm was formed on the aluminum drum.

Formation of Charge Generation Layers 15 parts by weight of butyral resin (Trademark "S-Lec BLS" made by Sekisui Chemical Co., Ltd.) were dissolved in 150 parts by weight of cyclohexanone. To this solution, 10 parts by weight of a trisazo pigment with the following formula were added, and the mixture was dispersed for 48 hours:

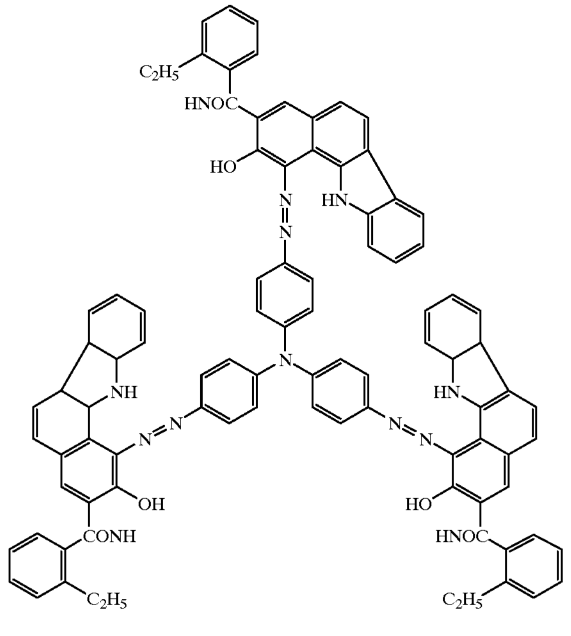

To the above dispersion, 210 parts by weight of cyclohexanone were further added, and the mixture was dispersed for 3 hours. The dispersion was then diluted with cyclohexanone, with stirring, in such a manner that the amount ratio of the solid components in the dispersion was 1.5 wt. %, whereby a coating liquid for the formation of a charge generation layer was prepared.

The aluminum drum with the undercoat layer was immersed in the above prepared coating liquid for the formation of a charge generation layer and then pulled up vertically at a predetermined constant speed, whereby the coating liquid was coated on the surface of the undercoat layer of the aluminum drum.

The coating liquid coated aluminum drum was dried in the same manner as for the undercoat layer at 120° C. for 20 minutes, whereby a charge generation layer with a thickness of about 0.2 $\mu$m was formed on the undercoat layer of the aluminum drum.

Formation of Charge Transport Layer

A coating liquid for the formation of a charge transport layer was prepared by dissolving the following components in 90 parts by weight of methylene chloride:

| | Parts by weight |
|---|---|
| Charge transport material with the following formula: 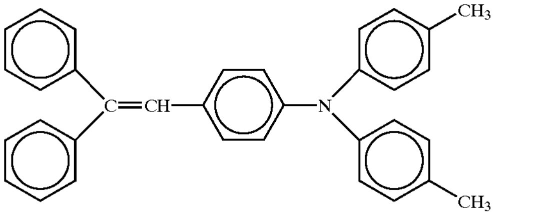 | 6 |

-continued

| | Parts by weight |
|---|---|
| Polycarbonate resin (Trademark "Panlite K-1300" made by Teijin Limited) | 10 |
| Silicone oil (Trademark "KF-50" made by Shin-Etsu Chemical Co., Ltd.) | 0.002 |

The aluminum drum with the undercoat layer and the charge generation layer was immersed in the above prepared coating liquid for the formation of a charge transport layer and then pulled up vertically at a predetermined constant speed, whereby the coating liquid for the formation of a charge transport layer was coated on the surface of the charge generation layer of the aluminum drum.

The coating liquid coated aluminum drum was dried in the same manner as for the undercoat layer at 120° C. for 20 minutes, whereby a charge transport layer with a thickness of about 23 $\mu$m was formed on the charge generation layer of the aluminum drum. Thus, a photoreceptor of the present invention was prepared.

The thus prepared photoreceptor was incorporated in a commercially available copying machine (Trademark "Imagio Color 2800" made by Ricoh Company, Ltd.) capable of writing with writing light with a wavelength of 780 nm, and with a writing pitch W1 of 63.5 $\mu$m.

$(N \cdot \Delta t/n_{max})/W_l$ =1.33. Hence, m=1 and therefore 1.05 $mW_l$ =66.7 $\mu$m. Thus, this copying machine satisfied the relationship of $(N \cdot \Delta t/n_{max}) > 1.05\ mW_l$.

By use of this copying machine, a monochrome halftone image which was uniform in its entirety was copied and output. As a result, a uniform image was obtained.

Furthermore, a full-color landscape photograph was also copied by use of this copying machine. As a result, a high quality image was obtained.

Comparative Example 19

The procedure of the image formation in Example 32 was repeated in the same manner as in Example 32 except that the copying machine employed in Example 32 was modified so as to be capable of writing with a writing pitch Wl of 42.3 $\mu$m.

$(N \cdot \Delta t/n_{max})/W_l$ =84.7/42.3=2.00. Hence, m=2. Therefore, 1.05 $mW_l$ =88.8 $\mu$m, and 0.95 $mW_l$ =80.4 $\mu$m. Thus, the copying machine did not satisfy the relationship of either $(N \cdot \Delta t/n_{max}) > 1.05\ mW_l$ or $(N \cdot \Delta t/n_{max}) < 0.95\ mW_l$.

By use of this copying machine, a monochrome halftone image which was uniform in its entirety was copied and output. As a result, there was obtained an image with fine lengthwise streaks in the entirety of the image.

Comparative Example 20

A photoreceptor was prepared in the same manner as in Example 32 except that a 300th machined aluminum drum was employed, with 300 drums being machined, using the same diamond cutting tool as that employed in Example 32.

A profile of the surface of the aluminum drum was prepared in the same manner as in Example 32. $n_{max}$ was 15 ($n_{max}$=15).

The integrated value of the power spectrum, I(S), was then calculated. The result was that I(S) was $10.8 \times 10^{-3}$.

The procedure of the image formation in Example 32 was repeated in the same manner as in Example 32 except that the photoreceptor employed in the copying machine in Example 32 was replaced by the above photoreceptor.

This copying machine satisfied the relationship of $(N \cdot \Delta t/n_{max}) > 1.05\ mW_l$.

When a monochrome halftone image which was uniform in its entirety was copied and output by the copying machine, fine streaks as produced in Comparative Example 19 were not produced in the image obtained, but the obtained image was abnormal since it included grained, light and shade streaks in the lower portion of the image.

EXAMPLE 33

A photoreceptor was prepared in the same manner as in Example 32 except that when the aluminum drum was pulled upward from the coating liquid for the formation of the charge transport layer in the course of the formation of the charge transport layer, the pulling speed was changed near the central portion of the aluminum drum in such a manner that there was formed a difference of about 0.6 μm in the thickness of the charge transport layer per about 15 mm length in the longitudinal direction of the photoreceptor.

The procedure of the image formation in Example 1 was repeated in the same manner as in Example I except that the photoreceptor in the copying machine employed in Example 1 was replaced by the above prepared photoreceptor.

By use of this copying machine, a monochrome halftone image which was uniform in its entirety was copied and output As a result, a uniform image free of abnormal images such as the light and shade striped image was obtained.

Furthermore, a full-color landscape photograph was also copied by use of this copying machine. As a result, a high quality image was obtained.

Comparative Example 21

A photoreceptor was prepared in the same manner as in Example 33 except that the thickness of the undercoat layer was changed to 15.3 μm.

The procedure of the image formation in Example 33 was repeated in the same manner as in Example 33 except that the photoreceptor in the copying machine employed in Example 33 was replaced by the above prepared photoreceptor.

By use of this copying machine, a monochrome halftone image which was uniform in its entirety was copied and output. As a result, there was obtained an image including abnormal light and shade streaks in a lower portion of the image, although the image did not include the fine lengthwise streaks as in Comparative Example 19.

Furthermore, a full-color landscape photograph was also copied by use of this copying machine. As a result, a high quality image was obtained.

EXAMPLES 34 to 36 and Comparative Example 22

The following four photoreceptors were prepared in the same manner as in Example 32 except that the scanning speed of the cutting tool was variously changed.

The procedure of the image formation in Example 32 was repeated in the same manner as in Example 32 except that the photoreceptor in the copying machine employed in Example 32 was replaced by each of the above prepared photoreceptors.

By use of this copying machine, a monochrome halftone image which was uniform in its entirety was copied and output. The results are shown in the following TABLE 4:

TABLE 4

| | Ex. 34 | Ex. 35 | Ex. 36 | Comp. Ex. 22 |
|---|---|---|---|---|
| $n_{max}$ | 17 | 16 | 13 | 10 |
| $(N \cdot \Delta t/n_{max}$ | 74.7 | 79.4 | 97.7 | 127.0 |
| I(S) | $15.8 \times 10^{-3}$ | $21.8 \times 10^{-3}$ | $26.0 \times 10^{-3}$ | $27.2 \times 10^{-3}$ |
| $(N \cdot \Delta t/n_{max} > 1.05\ mW_1$ or $(N \cdot \Delta t/n_{max} < 0.95\ mW_1$ | satisfied | satisfied | satisfied | not satisfied |
| Image Quality | Normal | Normal | Normal | fine streaks were observed in the entire image area |

EXAMPLE 37

Four aluminum drums with a diameter of 90 mm, a length of 352 mm, and a wall thickness of 2 mm were prepared by machining the surface of the aluminum drums, using a brand-new diamond cutting tool under the same conditions.

The surface of the outer surface of each of the machined aluminum drums was measured by use of a surface roughness meter (Surfcom 1400A), and a profile (not shown) was obtained with respect to each of the machined aluminum drums.

From this profile, sampling was conducted with Δt=0.31 μm, and N=4096, and the thus obtained samples were subjected to discrete Fourier transformation, whereby a power spectrum (not shown) was prepared for each machined aluminum drum.

The integrated value of the power spectrum, I(S), was then calculated. The result was that I(S) was $33.5 \times 10^{-3}$.

Since an acceptable standard I(S) for the surface of the aluminum drum was set at $12.0 \times 10^{31\ 3}$ or more, the above four aluminum drums were all found to be acceptable aluminum drums.

Formation of Undercoat Layer

A coating liquid for the formation of an undercoat layer was prepared as follows:

| | Parts by weight |
|---|---|
| Acrylic resin (Trademark "ACRYDIC A-460-60" made by Dainippon Ink & Chemicals, Incorporated) | 15 |
| Melamine resin (Trademark "Super Beckamine L-121-60" made by Dainippon Ink & Chemicals, Incorporated) | 10 |

The above components were dissolved in 80 parts by weight of methyl ethyl ketone. To this solution were added 90 parts by weight of titanium oxide powder (Trademark "TM-1" made by Fuji Titanium Industry Co., Ltd.). This mixture was then dispersed in a ball mill for 12 hours, whereby the coating liquid for the formation of an undercoat layer was prepared.

The surface-roughened aluminum drum was immersed in the above prepared coating liquid and then pulled up vertically at a predetermined constant speed, whereby the coating liquid was coated on the surface of the aluminum drum.

With the posture of the aluminum drum maintained, the aluminum drum was transported into a drying chamber, where the aluminum drum was dried at 140° C. for 20 minutes, whereby an undercoat layer with a thickness of 3.5 μm was formed on the aluminum drum.

The surface of the surface of the undercoat layer was measured by use of a surface roughness meter (Surfcom 1400A), and a profile thereof (not shown) was obtained.

From this profile, sampling was conducted with $\Delta t=0.31$ μm, and N=4096, and the thus obtained samples were subjected to discrete Fourier transformation, whereby a power spectrum (not shown) was prepared.

The integrated value of the power spectrum, I(S), was then calculated. The result was that I(S) was $22.7\times10^{-3}$.

Since an acceptable standard I(S) for the surface of the undercoat layer was set at $6.0\times10^{-3}$ or more, the above undercoat layer was found acceptable.

Formation of Charge Generation Layer 15 parts by weight of butyral resin (Trademark "S-Lec BLS" made by Sekisui Chemical Co., Ltd.) were dissolved in 150 parts by weight of cyclohexanone. To this solution, 10 parts by weight of a trisazo pigment with the following formula were added, and the mixture was dispersed for 48 hours:

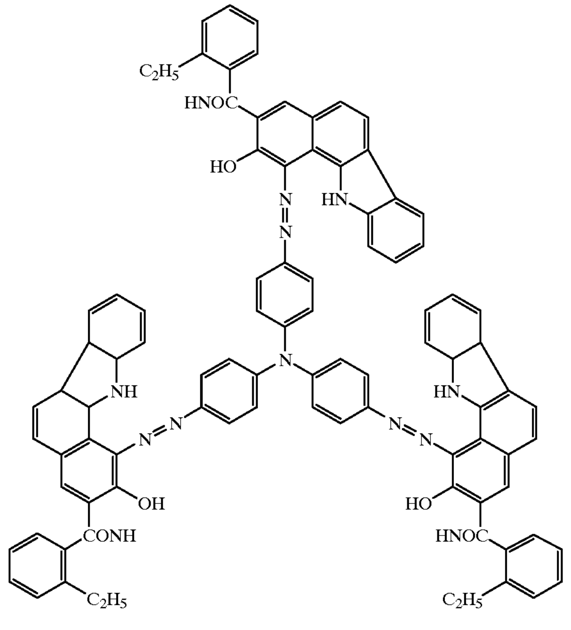

To the above dispersion, 210 parts by weight of cyclohexanone were further added, and the mixture was dispersed for 3 hours. The dispersion was then diluted with cyclohexanone, with stirring, in such a manner that the amount ratio of the solid components in the dispersion was 1.5 wt. %, whereby a coating liquid for the formation of a charge generation layer was prepared, The aluminum drum with the undercoat layer was immersed in the above prepared coating liquid for the formation of a charge generation layer and then pulled up vertically at a predetermined constant speed, whereby the coating liquid was coated on the surface of the undercoat layer of the aluminum drum. A The coating liquid coated aluminum drum was dried in the same manner as for the undercoat layer at 120° C. for 20 minutes, whereby a charge generation layer with a thickness of about 0.2 μm was formed on the undercoat layer of the aluminum drum.

Formation of Charge Transport Layer

A coating liquid for the formation of a charge transport layer was prepared by dissolving the following components in 90 parts by weight of methylene chloride;

| | Parts by weight |
|---|---|
| Charge transport material with the following formula: 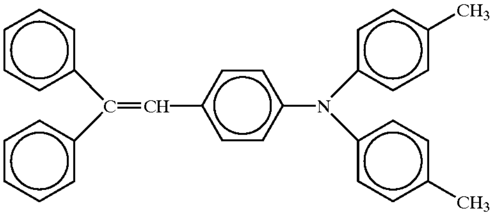 | 6 |
| Polycarbonate resin (Trademark "Panlite K-1300" made by Teijin Limited) | 10 |
| Silicone oil (Trademark "KF-50" made by Shin-Etsu Chemical Co., Ltd.) | 0.002 |

The aluminum drum with the undercoat layer and the charge generation layer was immersed in the above prepared coating liquid for the formation of a charge transport layer and then pulled up vertically at a predetermined constant speed, whereby the coating liquid for the formation of a charge transport layer was coated on the surface of the charge generation layer of the aluminum drum.

The coating liquid coated aluminum drum was dried in the same manner as for the undercoat layer at 120° C. for 20 minutes, whereby a charge transport layer with a thickness of about 23 μm was formed on the charge generation layer of the aluminum drum. Thus, a photoreceptor of the present invention was prepared.

The thus prepared photoreceptor was incorporated in a commercially available copying machine (Trademark "Imagio Color 2800" made by Ricoh Company, Ltd.) capable of writing with writing light with a wavelength of 780 nm, and with a resolution of 400 dpi.

By use of this copying machine, a monochrome halftone image which was uniform in its entirety was copied and output. As a result, a uniform image was obtained.

Furthermore, a full-color landscape photograph was also copied by use of this copying machine. As a result, a high quality image was obtained.

Comparative Example 23

A photoreceptor was prepared in the same manner as in Example 1 except that 501 drums were machined by use of the diamond cutting tool used in Example 37, and a 501st machined aluminum drum was used.

The surface of the outer surface of the 501st machined aluminum drum was measured by use of a surface roughness meter (Surfcom 1400A), and a profile thereof (not shown) was obtained.

From the profile, a power spectrum (not shown) was prepared. The integrated value of the power spectrum, I(S), was then calculated. The result was that I(S) was $10.8\times10^{-3}$.

Since an acceptable standard I(S) for the surface of the aluminum drum was set at $12.0\times10^{-3}$ or more as in Example 37, the above aluminum drums was found to be unacceptable. However, by use of this aluminum drum, the photoreceptor was prepared in the same manner as in Example 1 as mentioned above.

With respect to the undercoat layer, a profile thereof (not shown) was also obtained in the same manner as in Example 37, and a power spectrum (not shown) was prepared from the profile.

The integrated value of the power spectrum, I(S), was then calculated. The result was that I(S) was $5.3\times10^{-3}$.

Since an acceptable standard I(S) for the surface of the undercoat layer was set at $6.0\times10^{-3}$ or more, the above undercoat layer was found unacceptable. However, this undercoat layer was used in the preparation of the photoreceptor.

The procedure of the image formation in Example 37 was repeated in the same manner as in Example 37 except that the photoreceptor employed in Example 37 was replaced by the above prepared photoreceptor.

As a result, when a monochrome halftone image which was uniform in its entirety was copied and output by use of the copying machine using the photoreceptor, there was obtained such an image that appeared to include slight uneven light and shade stripes near the edge portion of the image. When a full-color landscape photograph was also copied by use of the copying machine, there was obtained such an image that was found to include slight uneven light and shade portions near the edge portion of the image by close observation.

EXAMPLE 38

The procedure of the image formation in Example 37 was repeated in the same manner as in Example 37 except that the copying machine (Trademark "Imagio Color 2800" made by Ricoh Company, Ltd.) employed in Example 37 was modified so as to be capable of writing with a resolution of 1000 dpi.

As a result, when a monochrome halftone image which was uniform in its entirety was copied and output by use of the modified copying machine, a uniform image free of abnormal images such as the light and shade striped image was obtained, and when a full-color landscape photograph was also copied by use of the copying machine, a high quality image was obtained.

Comparative Example 24

The procedure of the image formation in Example 2 was repeated in the same manner as in Example 2 except that the photoreceptor employed in the copying machine in Example 2 was replaced by the photoreceptor prepared in Comparative Example 23.

As a result, when a monochrome halftone image which was uniform in its entirety was copied and output by use of the copying machine using the photoreceptor, an image with 4 sets of light and shade stripes in a band shape near the edge portion of the image was obtained. Furthermore, light and shade stripes with a light-grained pattern, were also recognized in the image.

When the same full-color landscape photograph as used in Example 37 was also copied by use of the copying machine, an image including band-shaped abnormal images near the edge portion of the image was obtained. In the obtained color image, the portion in a position which almost corresponded in terms of the height to the portion of the grained light and shade stripes recognized, when the monochrome half tone image was copied, partially included a slightly unnatural color tone portion.

EXAMPLE 39

1000 aluminum drums with the same size as that of the aluminum drum employed in Example 38 were machined, using a brand-new diamond cutting tool of the same type as that of the diamond cutting tool employed in Example 38.

A profile of the surface of each of the machined aluminum drums was measured and I(S) of each aluminum drum was measured in the same manner as in Example 37.

An acceptable standard I(S) of the aluminum drum was set at $12.0\times10^{-3}$ or more, so that when the I(S) of any ::of the machined aluminum drums was found not to meet the standard I(S), the machining was stopped and the diamond cutting tool was replaced with a brand-new diamond cutting tool. Specifically, the I(S) of a 387th aluminum drum and a 819th aluminum drum were found to be less than $12.0\times10^{-3}$ in the course of the machining process, the diamond cutting tool was replaced with a brand-new diamond tool two times.

By use of the above prepared 1000 machined aluminum drums, 1000 photoreceptors were continuously produced in the same manner as in Example 38. Each of the photoreceptors included the undercoat layer, the charge generation layer and the charge transport layer as in the photoreceptor prepared in Example 38.

The thus produced 1000 photoreceptors were grouped into 20 lots, each lot consisting of 50 photoreceptors. One photoreceptor was picked up at random from each lot, and each of the picked up photoreceptors was incorporated in the copying machine used in Example 3.

By use of the copying machine, a monochrome halftone image which was uniform in its entirety was copied and output to check whether or not any abnormal images such as the light and shade striped image were formed. The result was that no abnormal images such as the light and shade striped image were formed by any photoreceptor in the 20 lots.

Comparative Example 25

20 aluminum drums with the same size as that of the aluminum drum employed in Example 39 were machined, by use of the diamond cutting tool which was used first in Example 39, that is, the diamond cutting tool which was used before it was replaced when the 387th aluminum drum was machined.

I(S) of all of the machined aluminum drums was measured in the same manner as in Example 39.

Only a second machined aluminum drum had an I(S) of $12.7\times10^{-3}$, while the I(S) of the other 19 aluminum drums was less than $12.0\times10^{-3}$.

By use of the above prepared 20 machined aluminum drums, 20 photoreceptors were produced in the same manner as in Example 39. Each of the photoreceptors included the undercoat layer, the charge generation layer and the charge transport layer as in the photoreceptor prepared in Example 39.

Each of the photoreceptors was incorporated in the copying machine used in Example 39.

By use of the copying machine, a monochrome halftone image which was uniform in its entirety was copied and output to check whether or not any abnormal images such as the light and shade striped image were formed. The result was that 19 copying machines produced abnormal images including the light and shade stripes. In particular, all of the copying machines, in which the aluminum drums machined at the 7th and after machining were incorporated, conspicuously produced abnormal light and shade striped images. Japanese Patent Application No. 2000-004008 filed Jan. 12, 2000, and Japanese Patent Application No. 2000-006769 filed Jan. 14, 2000 are hereby incorporated by reference.

What is claimed is:

1. A photoreceptor comprising a support and a photosensitive layer formed thereon, wherein a power of a wave interface of the photosensitive layer represented by I(S), wherein I(S) determines a surface roughness of said photosensitive layer, is set to be $6.0\times10^{-3}$ or greater to control formation of abnormal images when a group of data of N samples of the height x(t) ($\mu$m) of a profile at the interface of said photosensitive layer on the side of said support, measured perpendicular to a horizontal direction of said support, taken at $\Delta$t ($\mu$m) intervals in said horizontal direction, is subjected to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}m\cdot\Delta t\right) \quad (1)$$

wherein n and m are each an integer, $N=2^p$ in which p is an integer, in a power spectrum represented by formula (2):

$$S\left(\frac{n}{N\cdot\Delta t}\right)=\frac{1}{N}\cdot\left|X\left(\frac{n}{N\cdot\Delta t}\right)\right|^2 \quad (2)$$

I(S) represented by formula (3):

$$I(S)=\left(\frac{1}{N}\right)\sum_{n=0}^{N-1}\left\{S\left(\frac{n}{N\cdot\Delta t}\right)\right\}. \quad (3)$$

2. The photoreceptor as claimed in claim 1, wherein said power spectrum represented by formula (2) has a plurality of peaks in a region where n satisfies $$\frac{1}{5}\geq\frac{n}{N\cdot\Delta t}\geq\frac{1}{50}.$$

3. The photoreceptor as claimed in claim 1, wherein said power spectrum represented by formula (2) has a plurality of peaks which satisfies $$S\left(\frac{n}{N\cdot\Delta t}\right)\geq45\times10^{-6}N$$

in a region where n satisfies $$\frac{1}{5}\geq\frac{n}{N\cdot\Delta t}\geq\frac{1}{50}.$$

4. The photoreceptor as claimed in claim 1, where said power spectrum represented by formula (2) has four or more peaks which satisfy $$S\left(\frac{n}{N\cdot\Delta t}\right)\geq45\times10^{-6}N$$

in a region where n satisfies $$\frac{1}{5}\geq\frac{n}{N\cdot\Delta t}\geq\frac{1}{50}.$$

5. The photoreceptor as claimed in claim 1, wherein said power spectrum represented by formula (2) has a plurality of peaks in a region where n satisfies $$\frac{1}{25}\geq\frac{n}{N\cdot\Delta t}\geq\frac{1}{200}.$$

6. The photoreceptor as claimed in claim 2, wherein said power spectrum represented by formula (2) further has a plurality of peaks in a region where n satisfies $$\frac{1}{25}\geq\frac{n}{N\cdot\Delta t}\geq\frac{1}{200}.$$

7. The photoreceptor as claimed in claim 3, wherein said power spectrum represented by formula (2) further has a plurality of peaks in a region where n satisfies $$\frac{1}{25}\geq\frac{n}{N\cdot\Delta t}\geq\frac{1}{200}.$$

8. The photoreceptor as claimed in claim 4, wherein said power spectrum represented by formula (2) further has a plurality of peaks in a region where n satisfies $$\frac{1}{25}\geq\frac{n}{N\cdot\Delta t}\geq\frac{1}{200}.$$

9. The photoreceptor as claimed in claim 1, wherein said power spectrum represented by formula (2) has a plurality of peaks which satisfies $$S\left(\frac{n}{N\cdot\Delta t}\right)\geq100\times10^{-6}N$$

in a region where n satisfies $$\frac{1}{25}\geq\frac{n}{N\cdot\Delta t}\geq\frac{1}{200}.$$

10. The photoreceptor as claimed in claim 2, wherein said power spectrum represented by formula (2) further has a plurality of peaks which satisfies $$S\left(\frac{n}{N\cdot\Delta t}\right)\geq100\times10^{-6}N$$

in a region where n satisfies $$\frac{1}{25}\geq\frac{n}{N\cdot\Delta t}\geq\frac{1}{200}.$$

11. The photoreceptor as claimed in claim 3, wherein said power spectrum represented by formula (2) further has a plurality of peaks which satisfies $$S\left(\frac{n}{N\cdot\Delta t}\right)\geq 100\times 10^{-6}N$$

in a region where n satisfies $$\frac{1}{25}\geq\frac{n}{N\cdot\Delta t}\geq\frac{1}{200}.$$

12. The photoreceptor as claimed in claim 4, wherein said power spectrum represented by formula (2) further has a plurality of peaks which satisfies $$S\left(\frac{n}{N\cdot\Delta t}\right)\geq 100\times 10^{-6}N$$

in a region where n satisfies $$\frac{1}{25}\geq\frac{n}{N\cdot\Delta t}\geq\frac{1}{200}.$$

13. A photoreceptor comprising a support and a photosensitive layer formed thereon, wherein a power of a wave interface of the photosensitive layer controls the formation of abnormal images when a group of data of N samples of the height x(t) ($\mu$m) of a profile at the interface of said photosensitive layer on the side of said support, measured perpendicular to a horizontal direction of said support, taken at Δt ($\mu$m) intervals in said horizontal direction, is subjected to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)\quad(1)$$

wherein n and m are each an integer, $N=2^p$ in which p is an integer, in a power spectrum represented by formula (2), $$S\left(\frac{n}{N\cdot\Delta t}\right)=\frac{1}{N}\cdot\left|X\left(\frac{n}{N\cdot\Delta t}\right)\right|^2$$

(2), the relationship between the value of $n_{max}$, at which $$S\left(\frac{n}{N\cdot\Delta t}\right)$$

is maximized in the range of n from 1 to N/2, and the pitch $W_l$($\mu$m) or writing light which is coherent light for image formation is $$\frac{N\cdot\Delta t}{n_{\max}}>1.05m\cdot W_l\text{ or }\frac{N\cdot\Delta t}{n_{\max}}<0.95m\cdot W_l,$$

where m is an integer obtained by rounding off the decimals of $$\frac{N\cdot\Delta t}{n_{\max}\cdot W_l},$$

provided that when $$\frac{N\cdot\Delta t}{n_{\max}\cdot W_l}<1,\quad m=1,$$

wherein said Fourier transformation determines a surface roughness of said photosensitive layer.

14. The photoreceptor as claimed in claim 13, wherein said power spectrum represented by formula (2) has a plurality of peaks in a region where n satisfies $$\frac{1}{5}\geq\frac{n}{N\cdot\Delta t}\geq\frac{1}{50}.$$

15. The photoreceptor as claimed in claim 13, wherein said power spectrum represented by formula (2) has a plurality of peaks in a region where n satisfies $$\frac{1}{25}\geq\frac{n}{N\cdot\Delta t}\geq\frac{1}{200}.$$

16. A photoreceptor comprising a support, an undercoat layer formed on said support, and a photosensitive layer formed on said undercoat layer, wherein a power of a wave interface of the photosensitive layer represented by I(S), wherein I(S) determines a surface roughness of said photosensitive layer, is set to be $6\times10^{-3}$ or greater to reduce formation of abnormal images when a group of data of N samples of the height x(t) ($\mu$m) of a profile of the surface of said undercoat layer on the side of said photosensitive layer, measured perpendicular to a horizontal direction of said support, taken at Δt ($\mu$m) intervals in said horizontal direction, is subjected to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)\quad(1)$$

wherein n and m are each an integer, $N=2^p$ in which p is an integer, in a power spectrum represented by formula (2):

$$S\left(\frac{n}{N\cdot\Delta t}\right)=\frac{1}{N}\cdot\left|X\left(\frac{n}{N\cdot\Delta t}\right)\right|^2\quad(2)$$

I(S) is calculated from formula (4):

$$I(S)=\left(\frac{1}{N}\right)\sum_{n=0}^{N-1}\left\{S\left(\frac{n}{N\cdot\Delta t}\right)\right\}.\quad(4)$$

17. The photoreceptor as claimed in claim 16, wherein said power spectrum represented by formula (2) has a plurality of peaks in a region where n satisfies $$\frac{1}{5}\geq\frac{n}{N\cdot\Delta t}\geq\frac{1}{50}.$$

18. The photoreceptor as claimed in claim 16, wherein said power spectrum represented by formula (2) has a plurality of peaks which satisfies $$S\left(\frac{n}{N\cdot\Delta t}\right)\geq 45\times 10^{-6}N$$

in a region where n satisfies $$\frac{1}{5}\geq\frac{n}{N\cdot\Delta t}\geq\frac{1}{50}.$$

19. The photoreceptor as claimed in claim 16, wherein said power spectrum represented by formula (2) has four or more peaks which satisfy $$S\left(\frac{n}{N\cdot\Delta t}\right)\geq 45\times 10^{-6}N$$

in a region where n satisfies $$\frac{1}{5}\geq\frac{n}{N\cdot\Delta t}\geq\frac{1}{50}.$$

20. The photoreceptor as claimed in claim 16, wherein said power spectrum represented by formula (2) has a plurality of peaks in a region where n satisfies $$\frac{1}{25}\geq\frac{n}{N\cdot\Delta t}\geq\frac{1}{200}.$$

21. The photoreceptor as claimed in claim 17, wherein said power spectrum represented by formula (2) further has a plurality of peaks in a region where n satisfies $$\frac{1}{25}\geq\frac{n}{N\cdot\Delta t}\geq\frac{1}{200}.$$

22. The photoreceptor as claimed in claim 18, wherein said power spectrum represented by formula (2) further has a plurality of peaks in a region where n satisfies $$\frac{1}{25}\geq\frac{n}{N\cdot\Delta t}\geq\frac{1}{200}.$$

23. The photoreceptor as claimed in claim 19, wherein said power spectrum represented by formula (2) further has a plurality of peaks in a region where n satisfies $$\frac{1}{25}\geq\frac{n}{N\cdot\Delta t}\geq\frac{1}{200}.$$

24. The photoreceptor as claimed in claim 16, wherein said power spectrum represented by formula (2) has a plurality of peaks which satisfies $$S\left(\frac{n}{N\cdot\Delta t}\right)\geq 100\times 10^{-6}N$$

in a region where n satisfies $$\frac{1}{25}\geq\frac{n}{N\cdot\Delta t}\geq\frac{1}{200}.$$

25. The photoreceptor as claimed in claim 17, wherein said power spectrum represented by formula (2) further has a plurality of peaks which satisfies $$S\left(\frac{n}{N\cdot\Delta t}\right)\geq 100\times 10^{-6}N$$

in a region where n satisfies $$\frac{1}{25}\geq\frac{n}{N\cdot\Delta t}\geq\frac{1}{200}.$$

26. The photoreceptor as claimed in claim 18, wherein said power spectrum represented by formula (2) further has a plurality of peaks which satisfies $$S\left(\frac{n}{N\cdot\Delta t}\right)\geq 100\times 10^{-6}N$$

in a region where n satisfies $$\frac{1}{25}\geq\frac{n}{N\cdot\Delta t}\geq\frac{1}{200}.$$

27. The photoreceptor as claimed in claim 19, wherein said power spectrum represented by formula (2) further has a plurality of peaks which satisfies $$S\left(\frac{n}{N\cdot\Delta t}\right)\geq 100\times 10^{-6}N$$

in a region where n satisfies $$\frac{1}{25}\geq\frac{n}{N\cdot\Delta t}\geq\frac{1}{200}.$$

28. A photoreceptor comprising a support, an undercoat layer formed on said support, and a photosensitive layer formed on said undercoat layer, wherein a power of a wave interface of the photosensitive layer controls formation of abnormal images when a group of data of N samples of the height x(t) ($\mu$m) of a profile at the surface of said undercoat layer on the side of said photosensitive layer, measured perpendicular to a horizontal direction of said support, taken at $\Delta$t ($\mu$m) intervals in said horizontal direction, is subjected to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)\tag{1}$$

wherein n and m are each an integer, N=$2^p$ in which p is an integer, in a power spectrum represented by formula (2), $$S\left(\frac{n}{N\cdot\Delta t}\right)=\frac{1}{N}\cdot\left|X\left(\frac{n}{N\cdot\Delta t}\right)\right|^2,\tag{2}$$

the relationship between the value of $n_{max}$, at which $$S\left(\frac{n}{N\cdot\Delta t}\right)$$

is maximized in the range of n from 1 to N/2, and the pitch $W_l$($\mu$m) or writing light which is coherent light for image formation is $$\frac{N\cdot\Delta t}{n_{max}} > 1.05m\cdot W_l \text{ or } \frac{N\cdot\Delta t}{n_{max}} < 0.95m\cdot W_l,$$

where m is an integer obtained by rounding off the decimals of $$\frac{N\cdot\Delta t}{n_{max}\cdot W_l},$$

provided that when $$\frac{N\cdot\Delta t}{n_{max}\cdot W_l} < 1, \quad m = 1,$$

wherein said Fourier transformation determines a surface roughness of said photosensitive layer.

29. The photoreceptor as claimed in claim 28, wherein in said power spectrum represented by formula (2), I(S) is calculated from formula (4):

$$I(S) = \left(\frac{1}{N}\right)\sum_{n=0}^{N-1}\left\{S\left(\frac{n}{N\cdot\Delta t}\right)\right\} \tag{4}$$

as being $6.0\times10^{-3}$ or more.

30. The photoreceptor as claimed in claim 28, wherein said power spectrum represented by formula (2) has a plurality of peaks in a region where n satisfies $$\frac{1}{5} \geq \frac{n}{N\cdot\Delta t} \geq \frac{1}{50}.$$

31. The photoreceptor as claimed in claim 28, wherein said power spectrum represented by formula (2) has a plurality of peaks in a region where n satisfies $$\frac{1}{25} \geq \frac{n}{N\cdot\Delta t} \geq \frac{1}{200}.$$

32. A photoreceptor comprising a support and a photosensitive layer formed thereon, wherein a power of a wave interface of the photosensitive layer represented by I(S), wherein I(S) determines a surface roughness of said photosensitive layer, is set to be $12.0\times10^{-3}$ or greater to reduce formation of abnormal images when a group of data of N samples of the height x(t) ($\mu$m) of a profile of the surface of said support on the side of said photosensitive layer, measured perpendicular to a horizontal direction of said support, taken at $\Delta t$ ($\mu$m) intervals in said horizontal direction, is subjected to Fourier transformation in accordance with formula (1):

$$X\left(\frac{n}{N\cdot\Delta t}\right) = \sum_{m=0}^{N-1} x(m\cdot\Delta t)\exp\left(-i2\pi\cdot\frac{n}{N\cdot\Delta t}\cdot m\cdot\Delta t\right) \tag{1}$$

wherein n and m are each an integer, N $2^p$ in which p is an integer, in a power spectrum represented by formula (2):

$$S\left(\frac{n}{N\cdot\Delta t}\right) = \frac{1}{N}\cdot\left|X\left(\frac{n}{N\cdot\Delta t}\right)\right|^2 \tag{2}$$

I(S) is calculated from formula (4):

$$X\left(\frac{n}{N\cdot\Delta t}\right) = \sum_{m=0}^{N-1} x(m\cdot\Delta t)\exp\left(-i2\pi\cdot\frac{n}{N\cdot\Delta t}\cdot m\cdot\Delta t\right). \tag{4}$$

33. The photoreceptor as claimed in claim 32, wherein in said power spectrum represented by formula (2):

$$S\left(\frac{n}{N\cdot\Delta t}\right) = \frac{1}{N}\cdot\left|X\left(\frac{n}{N\cdot\Delta t}\right)\right|^2, \tag{2}$$

I'(S) is further calculated from formula (5);

$$I'(S) = \left(\frac{1}{N}\right)\sum_{n=0}^{j}\left\{S\left(\frac{n}{N\cdot\Delta t}\right)\right\} \tag{5}$$

wherein j is a maximum integer which satisfies $N\cdot\Delta t/j \geqq \phi/2$, and $\phi$ is the spot diameter ($\mu$m) for image formation, as being $6.0\times10^{-3}$ or more.

34. The photoreceptor as claimed in claim 32, wherein said power spectrum represented by formula (2) has a plurality of peaks in a region where n satisfies $$\frac{1}{5} \geq \frac{n}{N\cdot\Delta t} \geq \frac{1}{50}.$$

35. The photoreceptor as claimed in claim 33, wherein said power spectrum represented by formula (2) has a plurality of peaks in a region where n satisfies $$\frac{1}{5} \geq \frac{n}{N\cdot\Delta t} \geq \frac{1}{50}.$$

36. The photoreceptor as claimed in claim 32, wherein said power spectrum represented by formula (2) has a plurality of peaks which satisfies $$S\left(\frac{n}{N\cdot\Delta t}\right) \geq 60\times10^{-6}N$$

in a region where n satisfies $$\frac{1}{5} \geq \frac{n}{N\cdot\Delta t} \geq \frac{1}{50}.$$

37. The photoreceptor as claimed in claim 33, wherein said power spectrum represented by formula (2) has a plurality of peaks which satisfies $$S\left(\frac{n}{N\cdot\Delta t}\right) \geq 60\times10^{-6}N$$

in a region where n satisfies $$\frac{1}{5} \geq \frac{n}{N \cdot \Delta t} \geq \frac{1}{50}.$$

38. The photoreceptor as claimed in claim 32, wherein said power spectrum represented by formula (2) has four or more peaks which satisfy $$S\left(\frac{n}{N \cdot \Delta t}\right) \geq 60 \times 10^{-6} N$$

in a region where n satisfies $$\frac{1}{5} \geq \frac{n}{N \cdot \Delta t} \geq \frac{1}{50}.$$

39. The photoreceptor as claimed in claim 33, wherein said power spectrum represented by formula (2) has four or more peaks which satisfy $$S\left(\frac{n}{N \cdot \Delta t}\right) < 45 \times 10^{-6} N$$

in a region where n satisfies $$\frac{1}{5} \geq \frac{n}{N \cdot \Delta t} \geq \frac{1}{50}.$$

40. The photoreceptor as claimed in claim 32, wherein said power spectrum represented by formula (2) has a plurality of peaks in a region where n satisfies $$\frac{1}{25} \geq \frac{n}{N \cdot \Delta t} \geq \frac{1}{200}.$$

41. The photoreceptor as claimed in claim 33, wherein said power spectrum represented by formula (2) has a plurality of peaks in a region where n satisfies $$\frac{1}{25} \geq \frac{n}{N \cdot \Delta t} \geq \frac{1}{200}.$$

42. The photoreceptor as claimed in claim 34, wherein said power spectrum represented by formula (2) further has a plurality of peaks in a region where n satisfies $$\frac{1}{25} \geq \frac{n}{N \cdot \Delta t} \geq \frac{1}{200}.$$

43. The photoreceptor as claimed in claim 35, wherein said power spectrum represented by formula (2) further has a plurality of peaks in a region where n satisfies $$\frac{1}{25} \geq \frac{n}{N \cdot \Delta t} \geq \frac{1}{200}.$$

44. The photoreceptor as claimed in claim 36, wherein said power spectrum represented by formula (2) further has a plurality of peaks in a region where n satisfies $$\frac{1}{25} \geq \frac{n}{N \cdot \Delta t} \geq \frac{1}{200}.$$

45. The photoreceptor as claimed in claim 37, wherein said power spectrum represented by formula (2) further has a plurality of peaks in a region where n satisfies $$\frac{1}{25} \geq \frac{n}{N \cdot \Delta t} \geq \frac{1}{200}.$$

46. The photoreceptor as claimed in claim 38, wherein said power spectrum represented by formula (2) further has a plurality of peaks in a region where n satisfies $$\frac{1}{25} \geq \frac{n}{N \cdot \Delta t} \geq \frac{1}{200}.$$

47. The photoreceptor as claimed in claim 39, wherein said power spectrum represented by formula (2) further has a plurality of peaks in a region where n satisfies $$\frac{1}{25} \geq \frac{n}{N \cdot \Delta t} \geq \frac{1}{200}.$$

48. The photoreceptor as claimed in claim 32, wherein said power spectrum represented by formula (2) has a plurality of peaks which satisfies $$S\left(\frac{n}{N \cdot \Delta t}\right) \geq 150 \times 10^{-6} N$$

$\geqq 150 \times 10^{-6}$N in a region where n satisfies $$\frac{1}{25} \geq \frac{n}{N \cdot \Delta t} \geq \frac{1}{200}.$$

49. The photoreceptor as claimed in claim 33, wherein said power spectrum represented by formula (2) has a plurality of peaks which satisfies $$S\left(\frac{n}{N \cdot \Delta t}\right) \geq 150 \times 10^{-6} N$$

in a region where n satisfies $$\frac{1}{25} \geq \frac{n}{N \cdot \Delta t} \geq \frac{1}{200}.$$

50. The photoreceptor as claimed in claim 34, wherein said power spectrum represented by formula (2) further has a plurality of peaks which satisfies $$S\left(\frac{n}{N \cdot \Delta t}\right) \geq 150 \times 10^{-6} N$$

in a region where n satisfies $$\frac{1}{25} \geq \frac{n}{N \cdot \Delta t} \geq \frac{1}{200}.$$

51. The photoreceptor as claimed in claim 35, wherein said power spectrum represented by formula (2) further has a plurality of peaks which satisfies $$S\left(\frac{n}{N\cdot\Delta t}\right)\geq 150\times 10^{-6}N$$

in a region where n satisfies $$\frac{1}{25}\geq\frac{n}{N\cdot\Delta t}\geq\frac{1}{200}.$$

52. The photoreceptor as claimed in claim 36, wherein said power spectrum represented by formula (2) further has a plurality of peaks which satisfies $$S\left(\frac{n}{N\cdot\Delta t}\right)\geq 150\times 10^{-6}N$$

in a region where n satisfies $$\frac{1}{25}\geq\frac{n}{N\cdot\Delta t}\geq\frac{1}{200}.$$

53. The photoreceptor as claimed in claim 37, wherein said power spectrum represented by formula (2) further has a plurality of peaks which satisfies $$S\left(\frac{n}{N\cdot\Delta t}\right)\geq 150\times 10^{-6}N$$

in a region where n satisfies $$\frac{1}{25}\geq\frac{n}{N\cdot\Delta t}\geq\frac{1}{200}.$$

54. The photoreceptor as claimed in claim 38, wherein said power spectrum represented by formula (2) further has a plurality of peaks which satisfies $$S\left(\frac{n}{N\cdot\Delta t}\right)\geq 150\times 10^{-6}N$$

in a region where n satisfies $$\frac{1}{25}\geq\frac{n}{N\cdot\Delta t}\geq\frac{1}{200}.$$

55. The photoreceptor as claimed in claim 39, wherein said power spectrum represented by formula (2) further has a plurality of peaks which satisfies $$S\left(\frac{n}{N\cdot\Delta t}\right)\geq 150\times 10^{-6}N$$

in a region where n satisfies $$\frac{1}{25}\geq\frac{n}{N\cdot\Delta t}\geq\frac{1}{200}.$$

56. A photoreceptor comprising a support and a photosensitive layer formed on said support, wherein a power of a wave interface of the photosensitive layer controls formation of abnormal images when a group of data of N samples of the height x(t) ($\mu$m) of a profile of the surface of said support on the side of said photosensitive layer, measured perpendicular to a horizontal direction of said support, taken at Δt ($\mu$m) intervals in said horizontal direction, is subjected to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)\quad(1)$$

wherein n and m are each an integer, $N=2^p$ in which p is an integer, in a power spectrum represented by formula (2), $$S\left(\frac{n}{N\cdot\Delta t}\right)=\frac{1}{N}\cdot\left|X\left(\frac{n}{N\cdot\Delta t}\right)\right|^2,\quad(2)$$

the relationship between the value of $n_{max}$, at which $$S\left(\frac{n}{N\cdot\Delta t}\right)$$

is maximized in the range of n from 1 to N/2, and the pitch $W_l$($\mu$m) or writing light which is coherent light for image formation is $$\frac{N\cdot\Delta t}{n_{max}}>1.05m\cdot W_l\text{ or }\frac{N\cdot\Delta t}{n_{max}}<0.95m\cdot W_l,$$

where m is an integer obtained by rounding off the decimals of $$\frac{N\cdot\Delta t}{n_{max}\cdot W_l},$$

provided that when $$\frac{N\cdot\Delta t}{n_{max}\cdot W_l}<1,\quad m=1,$$

wherein said Fourier transformation determines a surface roughness of said photosensitive layer.

57. The photoreceptor as claimed in claim 56, wherein in said power spectrum represented by formula (2), I(S) is calculated from formula (4):

$$I(S)=\left(\frac{1}{N}\right)\sum_{n=0}^{N-1}\left\{S\left(\frac{n}{N\cdot\Delta t}\right)\right\}\quad(4)$$

as being $12.0\times10^{-3}$ or more.

58. The photoreceptor as claimed in claim 57, wherein in said power spectrum represented by formula (2), I'(S) is further calculated from formula (5):

$$I'(S)=\left(\frac{1}{N}\right)\sum_{n=0}^{j}\left\{S\left(\frac{n}{N\cdot\Delta t}\right)\right\}\quad(5)$$

wherein j is a maximum integer which satisfies N·Δt/j≧φ/2, andφ is the spot diameter ($\mu$m) for image formation, as being $6.0\times10^{-3}$ or more.

59. The photoreceptor as claimed in claim 56, wherein said power spectrum represented by formula (2) has a plurality of peaks in a region where n satisfies $$\frac{1}{5} \geq \frac{n}{N \cdot \Delta t} \geq \frac{1}{50}.$$

60. The photoreceptor as claimed in claim 57, wherein said power spectrum represented by formula (2) has a plurality of peaks in a region where n satisfies $$\frac{1}{5} \geq \frac{n}{N \cdot \Delta t} \geq \frac{1}{50}.$$

61. The photoreceptor as claimed in claim 56, wherein said power spectrum represented by formula (2) has a plurality of peaks in a region where n satisfies $$\frac{1}{25} \geq \frac{n}{N \cdot \Delta t} \geq \frac{1}{200}.$$

62. The photoreceptor as claimed in claim 57, wherein said power spectrum represented by formula (2) has a plurality of peaks in a region where n satisfies $$\frac{1}{25} \geq \frac{n}{N \cdot \Delta t} \geq \frac{1}{200}.$$

63. The photoreceptor as claimed in claim 16, wherein said photosensitive layer comprises a charge generation layer and a charge transport layer which are overlaid in this order on said undercoat layer, and the total thickness of said undercoat layer and said charge generation layer is 15 $\mu$m or less.

64. The photoreceptor as claimed in claim 1, wherein said photosensitive layer has a thickness of 15 $\mu$m or less.

65. The photoreceptor as claimed in claim 16, wherein said photosensitive layer has a thickness of 15 $\mu$m or less.

66. The photoreceptor as claimed in claim 32, wherein said photosensitive layer has a thickness of 15 $\mu$m or less.

67. A method of evaluating a photoreceptor comprising a support and a photosensitive layer formed thereon, comprising the steps of:

subjecting a group of data of N samples of the height x(t) ($\mu$m) of a profile at the interface of said photosensitive layer on the side of said support, and/or of a profile at the surface of said support on the side of said photoreceptor, measured perpendicular to a horizontal direction of said support, taken at $\Delta$t ($\mu$m) intervals in said horizontal direction, to Fourier transformation in accordance with formula (1):

$$X\left(\frac{n}{N \cdot \Delta t}\right) = \sum_{m=0}^{N-1} x(m \cdot \Delta t)\exp\left(-i2\pi \cdot \frac{n}{N \cdot \Delta t} \cdot m \cdot \Delta t\right) \quad (1)$$

wherein n and m are each an integer, $N=2^p$ in which p is an integer, calculating a power spectrum in accordance with formula (2):

$$S\left(\frac{n}{N \cdot \Delta t}\right) = \frac{1}{N} \cdot \left|X\left(\frac{n}{N \cdot \Delta t}\right)\right|^2, \quad (2)$$

and comparing a calculated power spectrum with a specific reference, thereby evaluating said photoreceptor.

68. A method of evaluating a photoreceptor comprising a support, an undercoat layer formed on said support, and a photosensitive layer formed thereon, comprising the steps of:

subjecting a group of data of N samples of the height x(t) ($\mu$m) of a profile at the interface of said photosensitive layer on the side of said support, and/or of a profile at the surface of said support on the side of said photoreceptor, measured perpendicular to a horizontal direction of said support, taken at $\Delta$t ($\mu$m) intervals in said horizontal direction, to Fourier transformation in accordance with formula (1):

$$X\left(\frac{n}{N \cdot \Delta t}\right) = \sum_{m=0}^{N-1} x(m \cdot \Delta t)\exp\left(-i2\pi \cdot \frac{n}{N \cdot \Delta t} \cdot m \cdot \Delta t\right) \quad (1)$$

wherein n and m are each an integer, $N=2^p$ in which p is an integer, calculating a power spectrum in accordance with formula (2):

$$S\left(\frac{n}{N \cdot \Delta t}\right) = \frac{1}{N} \cdot \left|X\left(\frac{n}{N \cdot \Delta t}\right)\right|^2 \quad (2)$$

and comparing a calculated power spectrum with a specific reference, thereby evaluating said photoreceptor.

69. The method as claimed in claim 67, wherein $\Delta$t ($\mu$m) is 0.01 $\mu$m to 50.00 $\mu$m, and N is 2048 or more.

70. The method as claimed in claim 68, wherein $\Delta$t ($\mu$m) is 0.01 $\mu$m to 50.00 $\mu$m, and N is 2048 or more.

71. A method of evaluating a photoreceptor comprising a support and a photosensitive layer formed thereon, comprising the steps of:

subjecting a group of data of N samples of the height x(t) ($\mu$m) of a profile at the interface of said photosensitive layer on the side of said support, and/or of a profile at the surface of said support on the side of said photoreceptor, measured perpendicular to the horizontal direction of said support, taken at $\Delta$t ($\mu$m) intervals in said horizontal direction, to Fourier transformation in accordance with formula (1):

$$X\left(\frac{n}{N \cdot \Delta t}\right) = \sum_{m=0}^{N-1} x(m \cdot \Delta t)\exp\left(-i2\pi \cdot \frac{n}{N \cdot \Delta t} \cdot m \cdot \Delta t\right) \quad (1)$$

wherein n and m are each an integer, $N=2^p$ in which p is an integer, calculating a power spectrum in accordance with formula (2):

$$S\left(\frac{n}{N \cdot \Delta t}\right) = \frac{1}{N} \cdot \left|X\left(\frac{n}{N \cdot \Delta t}\right)\right|^2, \quad (2)$$

calculating I(S) represented by formula (4) from said calculated power spectrum, $$I(S) = \left(\frac{1}{N}\right)\sum_{n=0}^{N-1}\left\{S\left(\frac{n}{N \cdot \Delta t}\right)\right\}, \quad (4)$$

and comparing said calculated I(S) with a specific reference, thereby evaluating said photoreceptor.

72. A method of evaluating a photoreceptor comprising a support, an undercoat layer formed on said support, and a photosensitive layer formed thereon, comprising the steps of:

subjecting a group of data of N samples of the height x(t) (μm) of a profile at the interface of said photosensitive layer on the side of said support, and/or of a profile at the surface of said undercoat layer on the side of said photoreceptor, and/or of a profile at the surface of said support on the side of said photoreceptor, measured perpendicular to the horizontal direction of said support, taken at Δt (μm) intervals in said horizontal direction, to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \tag{1}$$

wherein n and m are each an integer, $N=2^p$ in which p is an integer, calculating a power spectrum in accordance with formula (2):

$$S\left(\frac{n}{N\cdot\Delta t}\right)=\frac{1}{N}\cdot\left|X\left(\frac{n}{N\cdot\Delta t}\right)\right|^2, \tag{2}$$

calculating I(S) represented by formula (4) from said calculated power spectrum, $$I(S)=\left(\frac{1}{N}\right)\sum_{n=0}^{N-1}\left\{S\left(\frac{n}{N\cdot\Delta t}\right)\right\}, \tag{4}$$

and comparing said calculated I(S) with a specific reference, thereby evaluating said photoreceptor.

73. The method as claimed in claim 71, wherein Δt (μm) is 0.01 μm to 50.00 μm, and N is 2048 or more.

74. The method as claimed in claim 72, wherein Δt (μm) is 0.01 μm to 50.00 μm, and N is 2048 or more.

75. A method of evaluating a photoreceptor comprising a support and a photosensitive layer formed thereon, comprising the steps of:

subjecting a group of data of N samples of the height x(t) (μm) of a profile at the interface of said photosensitive layer on the side of said support, and/or of a profile at the surface of said support on the side of said photoreceptor, measured perpendicular to the horizontal direction of said support, taken at Δt (μm) intervals in said horizontal direction, to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \tag{1}$$

wherein n and m are each an integer, $N=2^p$ in which p is an integer, calculating a power spectrum in accordance with formula (2):

$$S\left(\frac{n}{N\cdot\Delta t}\right)=\frac{1}{N}\cdot\left|X\left(\frac{n}{N\cdot\Delta t}\right)\right|^2, \tag{2}$$

calculating I'(S) represented by formula (5) from said calculated power spectrum, $$I'(S)=\frac{1}{N}\sum_{n=a}^{b}S\left(\frac{n}{N\cdot\Delta t}\right), \tag{5}$$

in which a and b are each an integer of N or less, and a ≦b, and comparing said calculated I'(S) with a specific reference, thereby evaluating said photoreceptor.

76. A method of evaluating a photoreceptor comprising a support, an undercoat layer formed on said support, and a photosensitive layer formed thereon, comprising the steps of:

subjecting a group of data of N samples of the height x(t) (μm) of a profile at the interface of said photosensitive layer on the side of said support, and/or of a profile at the surface of said undercoat layer on the side of said photoreceptor, and/or of a profile at the surface of said support on the side of said photoreceptor, measured perpendicular to the horizontal direction of said support, taken at Δt (μm) intervals in said horizontal direction, to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \tag{1}$$

wherein n and m are each an integer, $N=2^p$ in which p is an integer, calculating a power spectrum in accordance with formula (2):

$$S\left(\frac{n}{N\cdot\Delta t}\right)=\frac{1}{N}\cdot\left|X\left(\frac{n}{N\cdot\Delta t}\right)\right|^2, \tag{2}$$

calculating I'(S) represented by formula (5) from said calculated power spectrum, $$I'(S)=\frac{1}{N}\sum_{n=a}^{b}S\left(\frac{n}{N\cdot\Delta t}\right), \tag{5}$$

in which a and b are each an integer of N or less, and a ≦b, and comparing said calculated I'(S) with a specific reference, thereby evaluating said photoreceptor.

77. The method as claimed in claim 75, wherein Δt (μm) is 0.01 μm to 50.00 μm, and N is 2048 or more.

78. The method as claimed in claim 76, wherein Δt (μm) is 0.01 μm to 50.00 μm, and N is 2048 or more.

79. A method of producing a photoreceptor comprising a support and a photosensitive layer formed thereon, wherein a power of a wave interface of the photosensitive layer controls the formation of abnormal images, by determining the conditions for machining the surface of said photosensitive layer on the side of said support, and/or the surface of said support on the side of said photosensitive layer in accordance with a method of evaluating said photoreceptor, comprising the steps of:

subjecting a group of data of N samples of the height x(t) ($\mu$m) of a profile at the interface of said photosensitive layer on the side of said support, and/or of a profile at the surface of said undercoat layer on the side of said photoreceptor, and/or of a profile at the surface of said support on the side of said photoreceptor, measured perpendicular to a horizontal direction of said support, take at $\Delta t$ ($\mu$m) intervals in said horizontal direction, to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \quad (1)$$

wherein n and m are each an integer, $N=2^p$ in which p is an integer, $$S\left(\frac{n}{N\cdot\Delta t}\right)=\frac{1}{N}\cdot\left|X\left(\frac{n}{N\cdot\Delta t}\right)\right|^2, \quad (2)$$

and comparing a calculated power spectrum with a specific reference, thereby evaluating said photoreceptor and further controlling a surface roughness of said photosensitive layer based on the determined conditions.

80. A method of producing a photoreceptor comprising a support, an undercoat layer formed on said support, and a photosensitive layer formed on said undercoat layer, wherein a power of a wave interface of the photosensitive layer controls the formation of abnormal images, by determining the conditions for machining the surface of said photosensitive layer on the side of said support, and/or the surface of said undercoat layer on the side of said photosensitive layer, and/or the surface of said support on the side of said photosensitive layer in accordance with a method of evaluating said photoreceptor, comprising the steps of:

subjecting a group of data of N samples of the height x(t) ($\mu$m) of a profile at the interface of said photosensitive layer on the side of said support, and/or of a profile at the surface of said undercoat layer on the side of said photoreceptor, and/or of a profile at the surface of said support on the side of said photoreceptor, measured perpendicular to a horizontal direction of said support, take at $\Delta t$ ($\mu$m) intervals in said horizontal direction, to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \quad (1)$$

wherein n and m are each an integer, $N2^p$ in which p is an integer, $$S\left(\frac{n}{N\cdot\Delta t}\right)=\frac{1}{N}\cdot\left|X\left(\frac{n}{N\cdot\Delta t}\right)\right|^2, \quad (2)$$

and comparing a calculated power spectrum with a specific reference, thereby evaluating said photoreceptor and further controlling a surface roughness of said photosensitive layer based on the determined conditions.

81. The method as claimed in claim 79, wherein $\Delta t$ ($\mu$m) is 0.01 $\mu$m to 50.00 $\mu$m, and N is 2048 or more.

82. The method as claimed in claim 80, wherein $\Delta t$ ($\mu$m) is 0.01 $\mu$m to 50.00 $\mu$m, and N is 2048 or more.

83. A method of producing a photoreceptor comprising a support and a photosensitive layer formed thereon, wherein a power of a wave interface of the photosensitive layer controls the formation of abnormal images, by determining the conditions for machining the surface of said photosensitive layer on the side of said support, and/or the surface of said support on the side of said photosensitive layer in accordance with a method of evaluating said photoreceptor, comprising the steps of:

subjecting a group of data of N samples of the height x(t) ($\mu$m) of a profile at the interface of said photosensitive layer on the side of said support, and/or of a profile at the surface of said undercoat layer on the side of said photoreceptor, and/or of a profile at the surface of said support on the side of said photoreceptor, measured perpendicular to a horizontal direction of said support, take at $\Delta t$ ($\mu$m) intervals in said horizontal direction, to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \quad (1)$$

wherein n and m are each an integer, $N=2^p$ in which p is an integer, calculating a power spectrum in accordance with formula (2):

$$S\left(\frac{n}{N\cdot\Delta t}\right)=\frac{1}{N}\cdot\left|X\left(\frac{n}{N\cdot\Delta t}\right)\right|^2, \quad (2)$$

calculating I(S) represented by formula (4) from said calculated power spectrum, $$I(S)=\left(\frac{1}{N}\right)\sum_{n=0}^{N-1}\left\{S\left(\frac{n}{N\cdot\Delta t}\right)\right\}, \quad (4)$$

and comparing said calculated I(S) with a specific reference, thereby evaluating said photoreceptor and further controlling a surface roughness of said photosensitive layer based on the determined conditions.

84. A method of producing a photoreceptor comprising a support, an undercoat layer formed on said support, and a photosensitive layer formed on said undercoat layer, wherein a power of a wave interface of the photosensitive layer controls the formation of abnormal images, by determining the conditions for machining the surface of said photosensitive layer on the side of said support, and/or the surface of said undercoat layer on the side of said photosensitive layer, and/or the surface of said support on the side of said photosensitive layer in accordance with a method of evaluating said photoreceptor, comprising the steps of:

subjecting a group of data of N samples of the height x(t) ($\mu$m) of a profile at the interface of said photosensitive layer on the side of said support, and/or of a profile at the surface of said undercoat layer on the side of said photoreceptor, and/or of a profile at the surface of said support on the side of said photoreceptor, measured perpendicular to a horizontal direction of said support, take at $\Delta t$ ($\mu$m) intervals in said horizontal direction, to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \tag{1}$$

wherein n and m are each an integer, $N=2^p$ in which p is an integer, calculating a power spectrum in accordance with formula (2):

$$S\left(\frac{n}{N\cdot\Delta t}\right)=\frac{1}{N}\cdot\left|X\left(\frac{n}{N\cdot\Delta t}\right)\right|^2, \tag{2}$$

calculating I(S) represented by formula (4) from said calculated power spectrum, $$I(S)=\left(\frac{1}{N}\right)\sum_{n=0}^{N-1}\left\{S\left(\frac{n}{N\cdot\Delta t}\right)\right\}, \tag{4}$$

and comparing said calculated I(S) with a specific reference, thereby evaluating said photoreceptor and further controlling a surface roughness of said photosensitive layer based on the determined conditions.

85. The method as claimed in claim 83, wherein Δt (μm) is 0.01 μm to 50.00 μm, and N is 2048 or more.

86. The method as claimed in claim 84, wherein Δt (μm) is 0.01 μm to 50.00 μm, and N is 2048 or more.

87. A method of producing a photoreceptor comprising a support and a photosensitive layer formed thereon, wherein a power of a wave interface of the photosensitive layer controls the formation of abnormal images, by determining the conditions for machining the surface of said photosensitive layer on the side of said support, and/or the surface of said support on the side of said photosensitive layer in accordance with a method of evaluating said photoreceptor, comprising the steps of:

subjecting a group of data of N samples of the height x(t) (μm) of a profile at the interface of said photosensitive layer on the side of said support, and/or of a profile at the surface of said undercoat layer on the side of said photoreceptor, and/or of a profile at the surface of said support on the side of said photoreceptor, measured perpendicular to a horizontal direction of said support, take at Δt (μm) intervals in said horizontal direction, to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \tag{1}$$

wherein n and m are each an integer, $N=2^p$ in which p is an integer, calculating a power spectrum in accordance with formula (2):

$$S\left(\frac{n}{N\cdot\Delta t}\right)=\frac{1}{N}\cdot\left|X\left(\frac{n}{N\cdot\Delta t}\right)\right|^2, \tag{2}$$

calculating I'(S) represented by formula (5) from said calculated power spectrum, $$I'(S)=\frac{1}{N}\sum_{n=a}^{b}S\left(\frac{n}{N\cdot\Delta t}\right) \tag{5}$$

in which a and b are each an integer of N or less, and a ≦b, and comparing said calculated I'(S) with a specific reference, thereby evaluating said photoreceptor and further controlling a surface roughness of said photosensitive layer based on the determined conditions.

88. A method of producing a photoreceptor comprising a support, an undercoat layer formed on said support, and a photosensitive layer formed on said undercoat layer, wherein a power of a wave interface of the photosensitive layer controls the formation of abnormal images, by determining the conditions for machining the surface of said photosensitive layer on the side of said support, and/or the surface of said undercoat layer on the side of said photosensitive layer, and/or the surface of said support on the side of said photosensitive layer in accordance with a method of evaluating said photoreceptor, comprising the steps of:

subjecting a group of data of N samples of the height x(t) (μm) of a profile at the interface of said photosensitive layer on the side of said support, and/or of a profile at the surface of said undercoat layer on the side of said photoreceptor, and/or of a profile at the surface of said support on the side of said photoreceptor, measured perpendicular to a horizontal direction of said support, take at Δt (μm) intervals in said horizontal direction, to Fourier transformation in accordance with formula (1):

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right) \tag{1}$$

wherein n and m are each an integer, $N=2^p$ in which p is an integer, calculating a power spectrum in accordance with formula (2):

$$S\left(\frac{n}{N\cdot\Delta t}\right)=\frac{1}{N}\cdot\left|X\left(\frac{n}{N\cdot\Delta t}\right)\right|^2, \tag{2}$$

calculating I'(S) represented by formula (5) from said calculated power spectrum, $$I'(S)=\frac{1}{N}\sum_{n=a}^{b}S\left(\frac{n}{N\cdot\Delta t}\right), \tag{5}$$

in which a and b are each an integer of N or less, and a ≦b, and comparing said calculated I'(S) with a specific reference, thereby evaluating said photoreceptor and further controlling a surface roughness of said photosensitive layer based on the determined conditions.

89. The method as claimed in claim 87, wherein Δt (μm) is 0.01 μm to 50.00 μm, and N is 2048 or more.

90. The method as claimed in claim 88, wherein Δt (μm) is 0.01 μm to 50.00 μm, and N is 2048 or more.

* * * * *

UNITED STATES PATENT AND TRADEMARK OFFICE

CERTIFICATE OF CORRECTION

PATENT NO. : 6,534,227 B2
DATED : March 18, 2003
INVENTOR(S) : Toshiyuki Kabata et al.

It is certified that error appears in the above-identified patent and that said Letters Patent is hereby corrected as shown below:

Column 1,
Line 24, change "streaks," to -- streaks. --.

Column 4,
Line 37, change "$\Delta t(\mu)$" to -- $\Delta t(\mu m)$ --.

Column 6,
Line 9, change "I'" to -- I --.

Column 7,
Line 6, change "Wherein" to -- wherein --.

Column 9,
Line 13, change "Wherein" to -- wherein --.

Column 11,
Line 46, change "$(\mu)$" to -- $(\mu m)$ --.
Line 57, change "and n" to -- and m --.

Column 13,
Line 53, change ";" to -- : --.

Column 15,
Line 1, change "support an" to -- undercoat layer on --.

Column 16,
Line 11, change "example" to -- Example --.

Column 18,
Line 8, change "formula;" to -- formula: --

Column 21,
Line 60, change "$\sum_{n=o}^{n-1}$" to -- $\sum_{n=0}^{J}$ --.

Column 22,
Line 32, change "is" to -- is used. --.

UNITED STATES PATENT AND TRADEMARK OFFICE

CERTIFICATE OF CORRECTION

PATENT NO. : 6,534,227 B2
DATED : March 18, 2003
INVENTOR(S) : Toshiyuki Kabata et al.

It is certified that error appears in the above-identified patent and that said Letters Patent is hereby corrected as shown below:

Column 24,
Line 34, change "affect" to -- effect --.

Column 25,
Line 15, change "Wherein" to -- wherein --.

Column 27,
Line 42, change "liquor" to -- liquid --.

Column 29,
Line 7 , change " $\frac{1}{100}$ " to -- $\frac{1}{200}$ --.

Column 33,
Line 10, change "formula;" to -- formula: --.

Column 35,
Line 11, change "15 $\mu$m since" to -- 15 $\mu$m, since --.

Column 38,
Line 33, change "0,31 $\mu$n," to -- 0.31 $\mu$m, --.
Line 45, change "$m^{-1}$" to -- $\mu m^{-1}$ --.

Column 43,
Line 48, change "352 m," to -- 352 mm, --.
Line 55, change "obtained," to -- obtained. --.
Line 57, change "$\mu$m." to -- $\mu$m, --.
Lines 57-61, should be flush with left margin.
Line 59, change "FIG," to -- FIG. --.

Column 50,
Line 36, change "carried" to -- carried out. --.

Column 62,
Line 45, change "$150 \times 10^{-6}$" to fit on same line.

Column 63,
Line 20, change "undercoat was" to -- undercoat layer was --.

Column 65,
Line 63, change "$12.2 \times 10^{313}$." to -- $12.2 \times 10^{-3}$. --.

UNITED STATES PATENT AND TRADEMARK OFFICE

CERTIFICATE OF CORRECTION

PATENT NO. : 6,534,227 B2
DATED : March 18, 2003

INVENTOR(S) : Toshiyuki Kabata et al.

It is certified that error appears in the above-identified patent and that said Letters Patent is hereby corrected as shown below:

Column 66,
Line 48, change "I ($)" to -- I (S) --.

Column 68,
Line 60, change "Layers" to -- Layer --.

Column 71,
Line 30, change "output As" to -- output. As --.

Column 72,
Line 10, change "$(N \cdot \Delta t/n_{max}$" to -- $(N \cdot \Delta t/n_{max})$ --.
Lines 11-14, change "$(N \cdot \Delta t/n_{max} > 1.05\ mW_{1\ell}$ or $(N \cdot \Delta t/n_{max} < 0.95\ mW_1$" to -- $(N \cdot \Delta t/n_{max}) > 1.05\ mW_{1\ell}$ or $(N \cdot \Delta t/n_{max}) < 0.95\ mW_1$ --.
Line 41, change "$10^{313}$" to -- $10^{-3}$ --.

Column 73,
Line 62, change "prepared," to -- prepared. --.
Line 62, begin new paragraph starting with "The aluminum drum".
Line 67, change "drum. A" to -- drum. --.

Column 76,
Line 16, change "::of" to -- of --.

Column 84,
Line 9, should read --$I(S) = (\frac{1}{N}) \sum_{n=0}^{N-1} \{S(\frac{n}{N \bullet \Delta t})\}$ --

Line 27, add space between "and Φ".

Column 86,
Line 35, remove "$\geqq 150 \times 10^{-6}N$" from line.

UNITED STATES PATENT AND TRADEMARK OFFICE

CERTIFICATE OF CORRECTION

PATENT NO. : 6,534,227 B2 
DATED : March 18, 2003
INVENTOR(S) : Toshiyuki Kabata et al.

It is certified that error appears in the above-identified patent and that said Letters Patent is hereby corrected as shown below:

Column 88,
Line 63, add space between "and φ".

Column 93,
Line 54, change "$N2^P$" to -- $N=2^P$ --.

Signed and Sealed this

Ninth Day of December, 2003

JAMES E. ROGAN
*Director of the United States Patent and Trademark Office*